US012666708B2

(12) United States Patent
Song et al.

(10) Patent No.: US 12,666,708 B2
(45) Date of Patent: Jun. 23, 2026

(54) INTEGRATED CIRCUIT DEVICE

(71) Applicant: Samsung Electronics Co., Ltd.,
Suwon-si (KR)

(72) Inventors: Hanyoung Song, Suwon-si (KR);
Jiwon Park, Suwon-si (KR); **Minseok
Jo**, Suwon-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 465 days.

(21) Appl. No.: 18/472,777

(22) Filed: Sep. 22, 2023

(65) Prior Publication Data

US 2024/0304623 A1      Sep. 12, 2024

(30) Foreign Application Priority Data

Mar. 9, 2023      (KR) ......................... 10-2023-0031366

(51) Int. Cl.
H01L 27/088          (2006.01)
H10D 30/01           (2025.01)
           (Continued)
(52) U.S. Cl.
CPC ........... H10D 84/85 (2025.01); H10D 30/014
(2025.01); H10D 30/43 (2025.01);
           (Continued)
(58) Field of Classification Search
CPC .. H10D 84/85; H10D 30/014; H10D 30/6757;
H10D 62/121; H10D 64/017; H10D
30/43; H10D 84/038; H10D 62/124;
H10D 62/115; H10D 84/0188; H10D
64/117; H10D 62/106; H10D 62/127;

H10D 64/513; H10D 12/01; H10D
12/411; H10D 12/461; H10D 12/481;
H10D 62/105; H10D 62/133; H10D
62/137; H10D 62/393; H10D 64/516;
H10D 30/665; H10D 30/668; H10D
64/519; H10D 12/441; H10D 30/63;
H10D 30/66; H10D 62/10; H10D 62/104;
H10D 62/112; H10D 64/112; H10D
64/20; H10D 64/514; H10D 30/0295;
H10D 30/0297;

(Continued)

(56) References Cited

U.S. PATENT DOCUMENTS 9,899,387 B2      2/2018  Ching et al.
9,941,377 B2      4/2018  Yang et al.
           (Continued)

*Primary Examiner* — Niki H Nguyen
(74) *Attorney, Agent, or Firm* — Harness, Dickey &
Pierce, P.L.C.

(57)              ABSTRACT

An integrated circuit device includes a first fin-type active
region and a second fin-type active region extending in a first
lateral direction on a substrate, a first gate line extending in
a second lateral direction intersecting the first lateral direc-
tion on the first fin-type active region, a second gate line
apart from the first gate line in the second lateral direction
on the second fin-type active region and extending along an
extension line of the first gate line in the second lateral
direction, and a gate cut insulating pattern between the first
gate line and the second gate line, wherein, for at least one
of the first gate line and the second gate line, a width of a
terminal gate portion, which is adjacent to the gate cut
insulating pattern, in the first lateral direction is less than a
width of another portion in the first lateral direction.

20 Claims, 44 Drawing Sheets

(51) Int. Cl.

| | |
|---|---|
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ..... *H10D 30/6735* (2025.01); *H10D 30/6757* (2025.01); *H10D 62/115* (2025.01); *H10D 62/121* (2025.01); *H10D 62/124* (2025.01); *H10D 62/151* (2025.01); *H10D 64/017* (2025.01); *H10D 84/017* (2025.01); *H10D 84/0172* (2025.01); *H10D 84/0188* (2025.01); *H10D 84/038* (2025.01)

(58) Field of Classification Search
CPC .. H10D 30/60; H10D 30/6219; H10D 62/116; H10D 62/126; H10D 64/2527; H10D 64/256; H10D 64/258; H10D 84/0149; H10D 84/0158

See application file for complete search history.

(56) References Cited

U.S. PATENT DOCUMENTS

| | | | | |
|---|---|---|---|---|
| 10,417,369 | B2 * | 9/2019 | Chen | G06F 30/392 |
| 10,423,078 | B1 * | 9/2019 | Shen | G03F 7/70633 |
| 10,930,749 | B2 | 2/2021 | Jeon et al. | |
| 11,081,356 | B2 * | 8/2021 | Wang | H10D 64/01326 |
| 2017/0186848 | A1 * | 6/2017 | Yang | H10D 64/667 |
| 2018/0341736 | A1 * | 11/2018 | Chen | G06F 30/392 |
| 2020/0303194 | A1 * | 9/2020 | Yu | H10D 30/0243 |
| 2022/0052046 | A1 * | 2/2022 | Choi | H10D 30/6757 |
| 2022/0344463 | A1 | 10/2022 | Jung et al. | |
| 2023/0187519 | A1 * | 6/2023 | Son | H10D 30/6735 |

* cited by examiner

FIG. 2

D114(NDR)

144

118

142

112

102M

102

CTA

X3 – X3'

Z

Y ⊗ → X

D114(WDR)

INTEGRATED CIRCUIT DEVICE

CROSS-REFERENCE TO RELATED APPLICATION

This application is based on and claims priority under 35 U.S.C. § 119 to Korean Patent Application No. 10-2023-0031366, filed on Mar. 9, 2023, in the Korean Intellectual Property Office, the disclosure of which is incorporated by reference herein in its entirety.

BACKGROUND

The inventive concepts relate to integrated circuit (IC) devices, and more particularly, to an IC devices including a field-effect transistor (FET).

As the size of IC devices is reduced, there is a need to increase the integration density of FETs on a substrate. Accordingly, a horizontal nanosheet FET (hNSFET) including a plurality of horizontal nanosheets stacked on the same layout area has been developed. As the integration density of IC devices increases and the size of the IC devices decreases, it is necessary to develop a new structure capable of improving the performance and reliability of nanosheet FETs (NSFETs).

SUMMARY

Some example embodiments of the inventive concepts provide integrated circuit (IC) devices, which may eliminate the likelihood of process effects during a process of manufacturing the IC device and may provide stable performance and improved reliability in a nanosheet field-effect transistor (NSFET).

According to an example embodiment of the inventive concepts, an IC device includes a first fin-type active region and a second fin-type active region extending parallel to each other in a first lateral direction on a substrate, the first fin-type active region and the second fin-type active region being apart from each other in a second lateral direction, the second lateral direction intersecting the first lateral direction, a first gate line on the first fin-type active region, the first gate line extending in the second lateral direction, a second gate line on the second fin-type active region, the second gate line being apart from the first gate line in the second lateral direction and extending along an extension line of the first gate line in the second lateral direction, and a gate cut insulating pattern between the first gate line and the second gate line, wherein, for at least one of the first gate line and the second gate line, a width of a terminal gate portion, which is adjacent to the gate cut insulating pattern, in the first lateral direction is less than a width of another portion in the first lateral direction.

According to an example embodiment of the inventive concepts, an IC device includes a plurality of fin-type active regions protruding from a substrate in a vertical direction and extending parallel to each other in a first lateral direction, the plurality of fin-type active regions being apart from each other in a second lateral direction, the second lateral direction intersecting the first lateral direction, a device isolation film covering both sidewalls of each of the plurality of fin-type active regions, a plurality of first gate lines extending in the second lateral direction on the plurality of fin-type active regions, a plurality of second gate lines apart from the plurality of first gate lines in the second lateral direction, the plurality of second gate lines extending along extension lines of the plurality of first gate lines in the second lateral direction, and a gate cut insulating pattern extending in the first lateral direction and between the plurality of first gate lines and the plurality of second gate lines, wherein, for at least one gate line selected from the plurality of first gate lines and the plurality of second gate lines, a width of a terminal gate portion, which is adjacent to the gate cut insulating pattern, in the first lateral direction is less than a width of another portion of the at least one gate line in the first lateral direction.

According to an example embodiment of the inventive concepts, an IC device includes a first fin-type active region and a second fin-type active region protruding from a substrate in a vertical direction, the first fin-type active region and the second fin-type active region being adjacent to each other and extending in a first lateral direction, a device isolation film covering both sidewalls of each of the first fin-type active region and the second fin-type active region, a plurality of nanosheet stacks on each of the first fin-type active region and the second fin-type active region, each nanosheet stack including at least one nanosheet, a first gate line surrounding a first nanosheet stack on the first fin-type active region, from among the plurality of nanosheet stacks, the first gate line extending in a second lateral direction intersecting the first lateral direction, a second gate line surrounding a second nanosheet stack on the second fin-type active region, from among the plurality of nanosheet stacks, the second gate line extending in the second lateral direction, a gate cut insulating pattern between the first gate line and the second gate line, the gate cut insulating pattern passing through at least a portion of the device isolation film in the vertical direction, a first gate dielectric film between the first nanosheet stack and the first gate line, and a second gate dielectric film between the second nanosheet stack and the second gate line, wherein, for at least one of the first gate line and the second gate line, a width of a terminal gate portion, which is adjacent to the gate cut insulating pattern, in the first lateral direction is less than a width of another portion of the at least one gate line in the first lateral direction.

BRIEF DESCRIPTION OF THE DRAWINGS

Example Embodiments of the inventive concepts will be more clearly understood from the following detailed description taken in conjunction with the accompanying drawings in which:

FIGS. 1A to 1F are diagrams of an integrated circuit (IC) device according to an example embodiment, wherein FIG. 1A is a plan layout diagram of some components of an IC device, FIG. 1B is a cross-sectional view of some components in a cross-section taken along line Y1-Y1' of FIG. 1A, FIG. 1C is a cross-sectional view of some components in a cross-section taken along line X1-X1' of FIG. 1A, FIG. 1D is a cross-sectional view of some components in a cross-section taken along line X2-X2' of FIG. 1A, FIG. 1E is a cross-sectional view of some components in a cross-section taken along line X3-X3' of FIG. 1A, and FIG. 1F is a cross-sectional view of some components in a cross-section taken along line X4-X4' of FIG. 1A;

FIG. 2 is a cross-sectional view of an IC device according to an example embodiment;

FIGS. 6 to 15E are cross-sectional views of a process sequence of a method of manufacturing an IC device, according to an example embodiment, wherein FIGS. 6, 7, 8, 9A, 10B, 11A, 12A, 13A, 14A, and 15B are cross-sectional views of some components in a portion corresponding to a cross-section taken along line Y1-Y1' of FIG. 1A, according to a process sequence, FIGS. 10F, 11E, 13D, 14D, and 15E are cross-sectional views of some components in a portion corresponding to a cross-section taken along line X4-X4' of FIG. 1A, according to a process sequence.

DETAILED DESCRIPTION

Figure 1A:
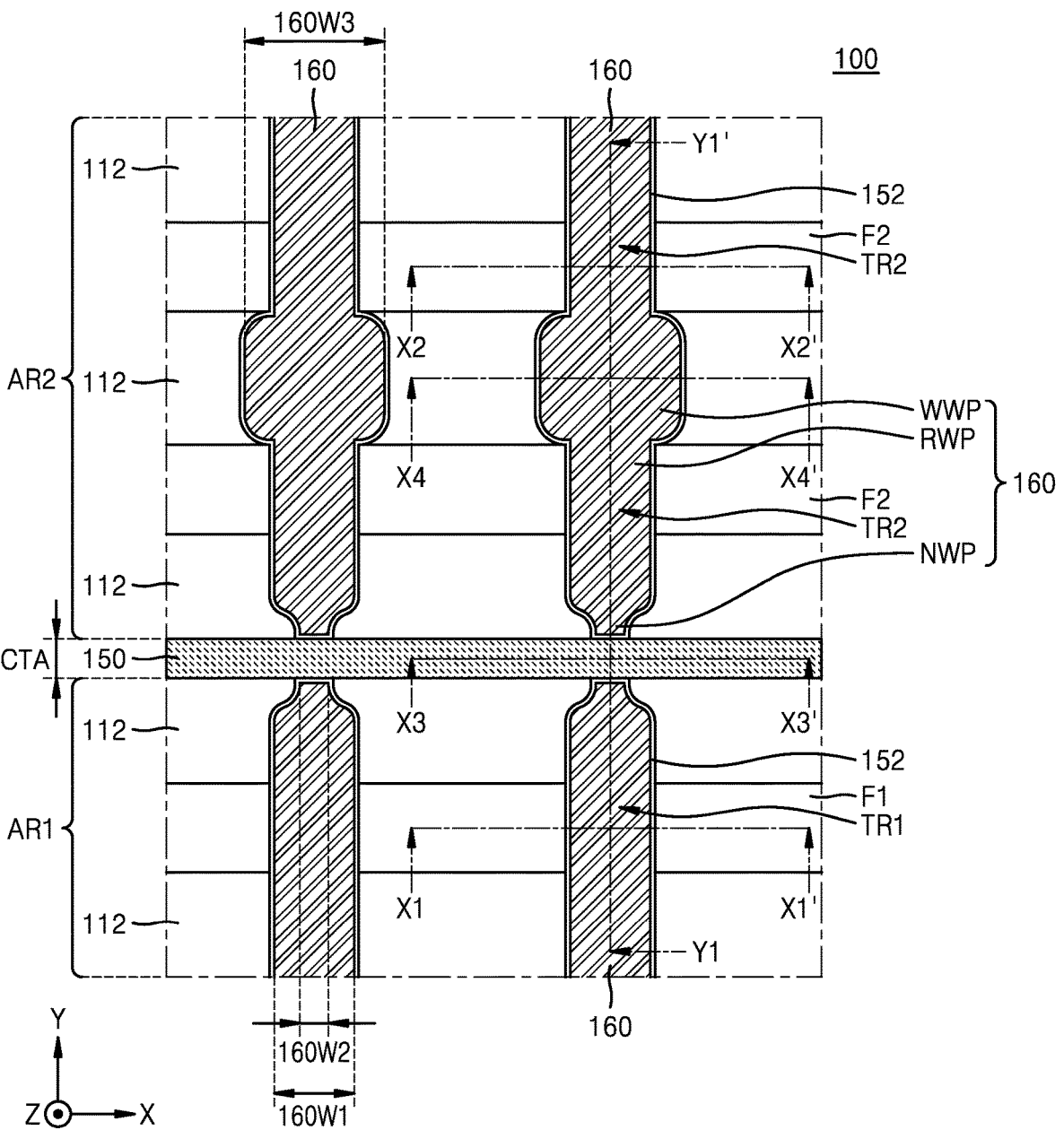

Hereinafter, some example embodiments will be described in detail with reference to the accompanying drawings. The same reference numerals are used to denote the same elements in the drawings, and repeated descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., +10%).

When the terms "about" or "substantially" are used in this specification in connection with a numerical value, it is intended that the associated numerical value includes a manufacturing or operational tolerance (e.g., +10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., +10%) around the stated numerical values or shapes.

Figure 1B:
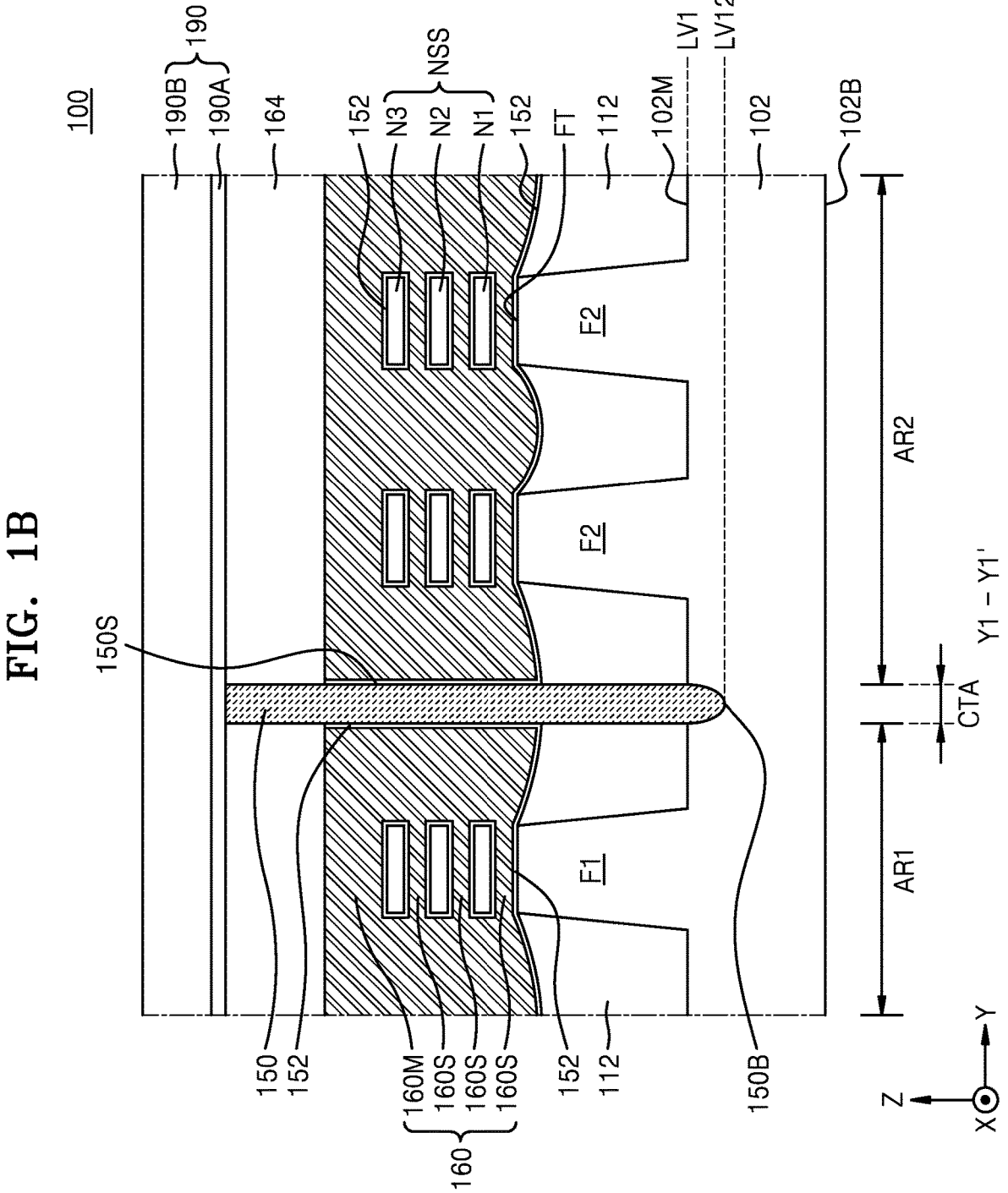
Figure 1C:
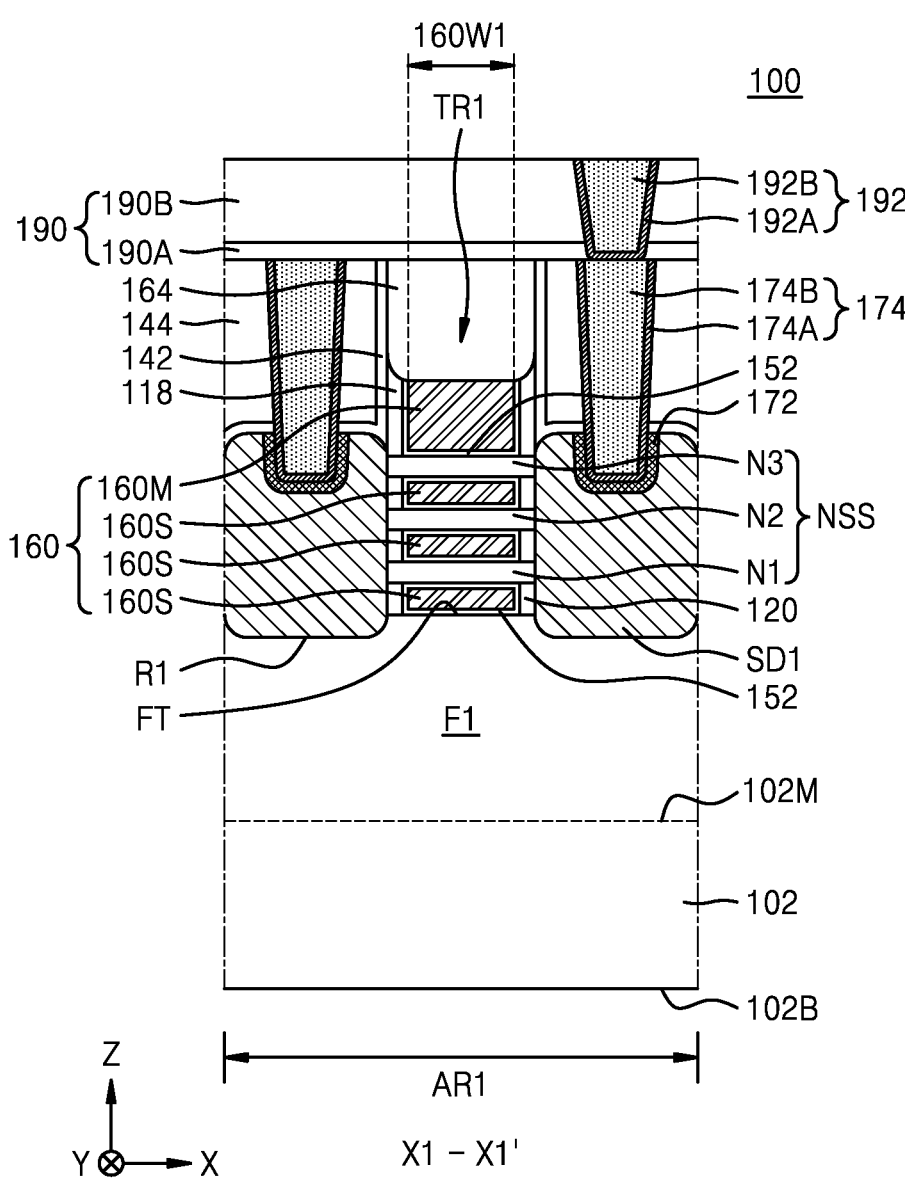
Figure 1D:
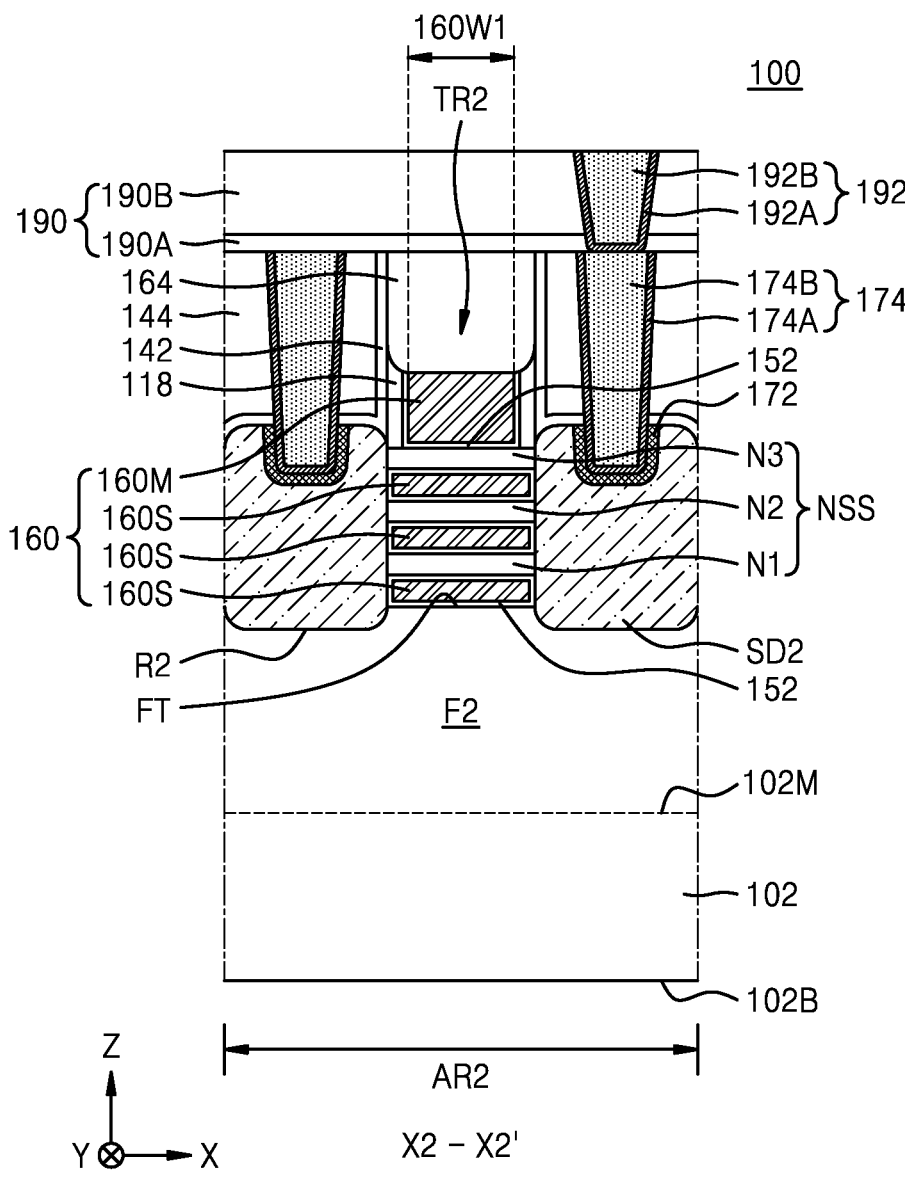
Figure 1E:
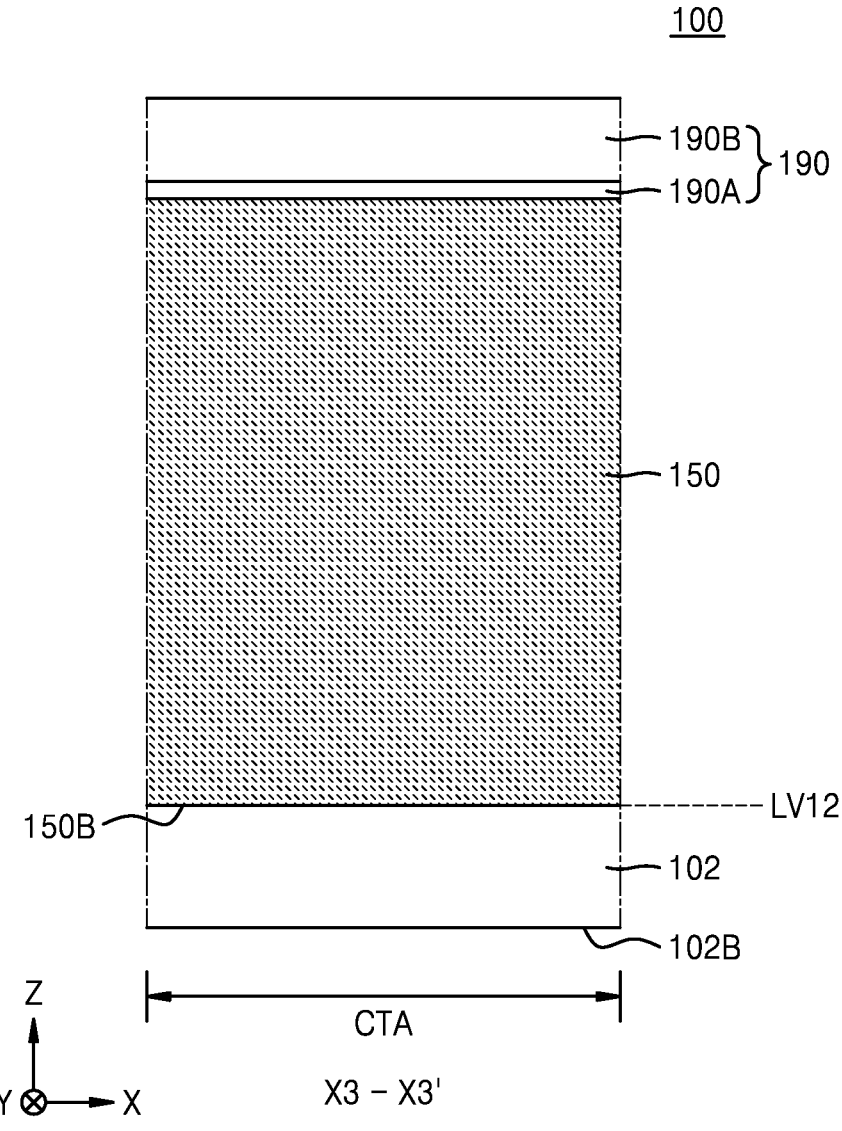
Figure 1F:
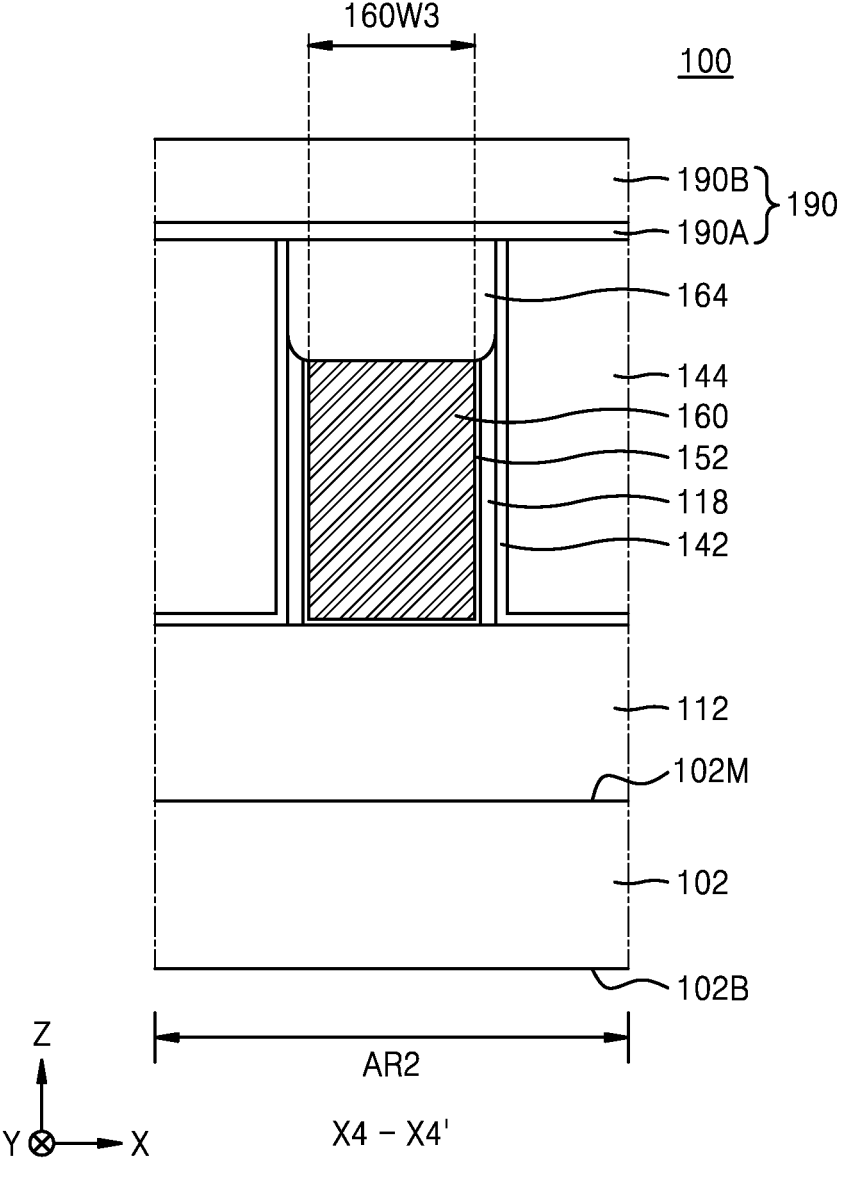

FIG. 1A is a plan layout diagram of some components of an integrated circuit (IC) device 100 according to an example embodiment. FIG. 1B is a cross-sectional view of some components in a cross-section taken along line Y1-Y1' of FIG. 1A. FIG. 1C is a cross-sectional view of some components in a cross-section taken along line X1-X1' of FIG. 1A. FIG. 1D is a cross-sectional view of some components in a cross-section taken along line X2-X2' of FIG. 1A. FIG. 1E is a cross-sectional view of some components in a cross-section taken along line X3-X3' of FIG. 1A. FIG. 1F is a cross-sectional view of some components in a cross-section taken along line X4-X4' of FIG. 1A. The IC device 100 including a field-effect transistor (FET) having a gate-all-around structure, which includes an active region of a nanowire or nanosheet type and a gate surrounding the active region, is described with reference to FIGS. 1A to 1F.

Referring to FIGS. 1A to 1F, the IC device 100 may include a substrate 102 including a first device region AR1 and a second device region AR2 and a plurality of fin-type active regions (e.g., F1 and F2), which protrude from the first device region AR1 and the second device region AR2 of the substrate 102 in a vertical direction (Z direction). The plurality of fin-type active regions (e.g., F1 and F2) may extend in a first lateral direction (X direction) and be parallel and apart from each other in a second lateral direction (Y direction), which intersects with the first lateral direction (X direction). As used herein, from among the plurality of fin-type active regions (e.g., F1 and F2), a fin-type active region F1 in the first device region AR1 of the substrate 102 may be referred to as a first fin-type active region, and a fin-type active region F2 in the second device region AR2 of the substrate 102 may be referred to as a second fin-type active region.

Although one first fin-type active region F1 located in the first device region AR1 and two second fin-type active regions F2 located in the second device region AR2 are illustrated in FIG. 1A for brevity, at least two first fin-type active regions F1 may be in the first device region AR1, and at least three second fin-type active regions F2 may be in the second device region AR2.

The substrate 102 may include an element semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure.

A device isolation film 112 facing both sidewalls of each of the plurality of fin-type active regions (e.g., F1 and F2) may be on the substrate 102. The device isolation film 112 may include an oxide film, a nitride film, or a combination thereof.

On the plurality of fin-type active regions (e.g., F1 and F2), a plurality of gate lines 160 may extend long in the second lateral direction (Y direction), which intersects with the first lateral direction (X direction). A plurality of nanosheet stacks NSS may be on respective fin top surfaces FT of the plurality of fin-type active regions (e.g., F1 and F2) in regions where the plurality of fin-type active regions (e.g., F1 and F2) intersect with the plurality of gate lines 160. The plurality of nanosheet stacks NSS may be apart from the plurality of fin-type active regions (e.g., F1 and F2) in the vertical direction (Z direction) and face the fin top surface PT of each of the plurality of fin-type active regions (e.g., F1 and F2). As used herein, the term "nanosheet" refers to a conductive structure having a cross-section that is substantially perpendicular to a direction in which current flows. The nanosheet may be interpreted as including a nanowire.

Each of the plurality of nanosheet stacks NSS may include a first nanosheet N1, a second nanosheet N2, and a third nanosheet N3, which overlap each other in the vertical direction (Z direction) on the fin top surface FT of each of the first and second fin-type active regions F1 and F2. The first to third nanosheets N1, N2, and N3 may be at different vertical distances (Z-directional distances) from the fin top surface FT of each of the first and second fin-type active regions F1 and F2. The number of nanosheet stacks NSS and the number of gate lines 160 on the fin top surface FT of each of the fin-type active regions (e.g., F1 and F2) are not specifically limited. For example, at least one nanosheet stack NSS and at least one gate line 160 may be on one fin-type active region F1 or F2.

Each of the plurality of nanosheet stacks NSS is illustrated as including the first to third nanosheets N1, N2, and N3 in FIGS. 1B to 1D. However, the number of nanosheets included in one nanosheet stack NSS is not specifically limited. For example, each of the plurality of nanosheet stacks NSS may include one, two, or four or more nanosheets. Each of the first nanosheet N1, the second nanosheet N2, and the third nanosheet N3 may have a channel region. In some example embodiments, the first to third nanosheets N1, N2, and N3 may substantially have the same thicknesses as each other in the vertical direction (Z direction). In other example embodiments, at least some of the first to third nanosheets N1, N2, and N3 may have different thicknesses from the other in the vertical direction (Z direction).

As shown in FIGS. 1B to 1D, the first to third nanosheets N1, N2, and N3 in one nanosheet stack NSS may have the same sizes as each other in the first lateral direction (X direction). In other example embodiments, at least some of the first to third nanosheets N1, N2, and N3 in one nanosheet stack NSS may have different sizes from the other in the first lateral direction (X direction). For example, in the first lateral direction (X direction), each of the first and second nanosheets N1 and N2, which are relatively close to the fin top surface FT, from among the first to third nanosheets N1, N2, and N3, may have a greater length than the third nanosheet N3, which is farthest from the fin top surface FT.

A plurality of first recesses R1 may be formed in a top surface of the first fin-type active region F1 in the first device region AR1, and a plurality of second recesses R2 may be formed in a top surface of the second fin-type active region F2 in the second device region AR2. FIGS. 1C and 1D illustrate an example in which a lowermost surface of each of the plurality of first recesses R1 and the plurality of second recesses R2 is at a lower level than the fin top surface FT of each of the plurality of fin-type active regions (e.g., F1 and F2), but the inventive concepts are not limited thereto. The lowermost surface of each of the plurality of first recesses R1 and the plurality of second recesses R2 may substantially be at the same level as the fin top surface FT of each of the fin-type active regions (e.g., F1 and F2).

A plurality of first source/drain regions SD1 may be formed on the plurality of first recesses R1 in the first device region AR1, and a plurality of second source/drain regions SD2 may be formed on the plurality of second recesses R2 in the second device region AR2.

In the first device region AR1 and the second device region AR2, the plurality of gate lines 160 may extend long in the second lateral direction (Y direction) on the plurality of fin-type active regions (e.g., F1 and F2) and the device isolation film 112. The plurality of gate lines 160 may surround each of the first to third nanosheets N1, N2, and N3 included in each of the plurality of nanosheet stacks NSS while covering the plurality of nanosheet stacks NSS on the plurality of fin-type active regions (e.g., F1 and F2). A plurality of transistors (e.g., TR1 TR2) may be respectively formed at intersections between the plurality of fin-type active regions (e.g., F1 and F2) and the plurality of gate lines 160 on the substrate 102. In some example embodiments, the first device region AR1 may be an NMOS transistor region and the second device region AR2 may be a PMOS transistor region. A plurality of NMOS transistors TR1 may be formed at intersections between the first fin-type active region F1 and the plurality of gate lines 160 in the first device region AR1, and a plurality of PMOS transistors TR2 may be formed at intersections between the second fin-type active region F2 and the plurality of gate lines 160 in the second device region AR2.

As shown in FIGS. 1B, 1C, and 1D, each of the plurality of gate lines 160 may include a main gate portion 160M and a plurality of sub-gate portions 160S. The main gate portion 160M may cover a top surface of the nanosheet stack NSS and extend long in the second lateral direction (Y direction). The plurality of sub-gate portions 160S may be integrally connected to the main gate portion 160M and arranged one-by-one between the first to third nanosheets N1, N2, and N3 and between the fin-type active regions (e.g., F1 and F2) and the first nanosheet N1, respectively.

Each of the plurality of gate lines 160 may include a metal, a metal nitride, a metal carbide, or a combination thereof. The metal may be selected from titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd). The metal nitride may be selected from titanium nitride (TiN) and tantalum nitride (TaN). The metal carbide may include titanium aluminum carbide (TiAlC). In some example embodiments, each of the plurality of gate lines 160 may have a structure in which a metal nitride film, a metal film, a conductive capping film, and a gap-fill metal film are sequentially stacked. The metal nitride film and the metal film may include at least one metal selected from titanium (Ti), tantalum (Ta), tungsten (W), ruthenium (Ru), niobium (Nb), molybdenum (Mo), and hafnium (Hf). The gap-fill metal film may include tungsten (W), aluminum (Al), or a combination thereof. Each of the plurality of gate lines 160 may include at least one work-function metal-containing film. The at least one work-function metal-containing film may include at least one metal selected from Ti, W, Ru, Nb, Mo, Hf, Ni, Co, Pt, Yb, Tb, Dy, Er, and Pd. In some example embodiments, each of the plurality of gate lines 160 may have a stack structure of at least two layers selected from a first work-function metal-containing film, a second work-function metal-containing film, and a gap-fill metal film. For example, the first work-function metal-containing film may include a titanium nitride (TiN) film. The second work-function metal-containing film may include a combination of a first TiN film, a titanium aluminum carbide (TiAlC) film, and a second TiN film. In some example embodiments, each of the plurality of gate lines 160 may include a TiN film, a stack structure of TiAlC/TiN/W, a stack structure of TiN/TaN/TiAlC/TiN/W, or a stack structure of TiN/TaN/TiN/TiAlC/TiN/W. However, a constituent material of each of the plurality of gate lines 160 is not limited to the examples described above and may be variously modified and changed within the scope of the inventive concepts.

In some example embodiments, the plurality of gate lines 160 may have the same stack structures as each other in the first device region AR1 and the second device region AR2. In other example embodiments, the plurality of gate lines 160 may have different stack structures from each other in the first device region AR1 and the second device region AR2. As used herein, from among the plurality of gate lines 160, a gate line 160 located in the first device region AR1 may be referred to as a first gate line and a gate line 160 located in the second device region AR2 may be referred to as a second gate line.

As shown in FIGS. 1A and 1B, the plurality of gate lines 160 may include a pair of gate lines 160, which are collinear with each other in the second lateral direction (Y direction) and apart from each other in the second lateral direction (Y direction). From among the pair of gate lines 160, a gate line 160 in the first device region AR1 may be on the first fin-type active region F1 and extend long in the second lateral direction (Y direction). From among the pair of gate lines 160, a gate line 160 in the second device region AR2 may be on the second fin-type active region F2 and extend long in the second lateral direction (Y direction). The gate line 160 in the second device region AR2 may be apart from the gate line 160, which is in the first device region AR1, in the second lateral direction (Y direction). The second gate line 160 extends long along an extension line of the first gate line 160, which is in the first device region AR1, in the second lateral direction (Y direction).

As shown in FIGS. 1A, 1B, and 1E, the first device region AR1 and the second device region AR2 may be apart from each other with a gate isolation area CTA therebetween in the second lateral direction (Y direction). A gate cut insulating pattern 150 may be between the gate line 160 in the first device region AR1 and the gate line 160 in the second device region AR2. The gate cut insulating pattern 150 may be in the gate isolation area CTA between the first device region AR1 and the second device region AR2.

A vertical level of a top surface of the gate cut insulating pattern 150 may be farther from the substrate 102 than a vertical level of a top surface of each of the plurality of nanosheet stacks NSS. The vertical level of the top surface of the gate cut insulating pattern 150 may be farther from the substrate 102 than a vertical level of a top surface of each of the plurality of gate lines 160. As used herein, the term "vertical level" refers to a distance from a main surface 102M of the substrate 102 in the vertical direction (Z direction or −Z direction).

As shown in FIG. 1B, a height of the gate cut insulating pattern 150 may be greater than a height of each of the plurality of gate lines 160 in the vertical direction (Z direction). A vertical level of a bottom surface 150B of the gate cut insulating pattern 150 may be closer to a backside surface 102B of the substrate 102 than a vertical level of a bottom surface of each of the plurality of gate lines 160. A vertical level LV12 of the bottom surface 150B of the gate cut insulating pattern 150 may be closer to a backside surface 102B of the substrate 102 than a vertical level LVI of the main surface 102M of the substrate 102.

The gate cut insulating pattern 150 may have both sidewalls 150S facing each of the gate line 160 located in the first device region AR1 and the gate line 160 located in the second device region AR2. At least one of the both sidewalls 150S of the gate cut insulating pattern 150 may include a portion, which extends away from the substrate 102 in a direction perpendicular to the main surface 102M of the substrate 102. In some example embodiments, the gate cut insulating pattern 150 may include silicon nitride (SiN), silicon carbonitride (SiCN), silicon oxynitride (SiON), silicon oxycarbonitride (SiOCN), silicon boron nitride (SiBN), silicon boron carbonitride (SiBCN), silicon oxycarbide (SiOC), silicon carbide (SiC), or a combination thereof, without being limited thereto.

The gate cut insulating pattern 150 may extend long in the first lateral direction (X direction) parallel to the first fin-type active region F1 and the second fin-type active region F2 between the first fin-type active region F1 and the second fin-type active region F2. The gate cut insulating pattern 150 may pass through the device isolation film 112 in the vertical direction (Z direction) and pass through a portion of the substrate 102 in the vertical direction (Z direction). The device isolation film 112 may cover the both sidewalls 150S of the gate cut insulating pattern 150 in the second lateral direction (Y direction). In some example embodiments, the gate cut insulating pattern 150 may extend in the vertical direction (Z direction) more toward the backside surface 102B of the substrate 102 than toward a bottom surface of the device isolation film 112. In other words, at bottom of the gate cut insulating pattern 150 may be closer to the backside surface 102B of the substrate 102 than a bottom surface of the device isolation film 112.

A pair of gate lines 160, which are adjacent to each other on both sides of the gate cut insulating pattern 150 with the gate cut insulating pattern 150 therebetween in the second lateral direction (Y direction), may not be connected to each other and be apart from each other. From among the plurality of gate lines 160, a plurality of gate lines 160 arranged in a line in the second lateral direction (Y direction) may be spaced apart from each other by the gate cut insulating pattern 150. A length of at least one of the plurality of gate lines 160 in the second lateral direction (Y direction) may be limited by the gate cut insulating pattern 150.

As shown in FIG. 1A, each of the plurality of gate lines 160 may include a first local gate portion RWP, a second local gate portion WWP, and a terminal gate portion NWP. The first local gate portion RWP may overlap the fin-type active regions (e.g., F1 and F2) in the vertical direction (Z direction). The second local gate portion WWP may overlap the device isolation film 112 in the vertical direction (Z direction) in each of the first device region AR1 and the second device region AR2. The terminal gate portion NWP may be between the fin-type active regions (e.g., F1 and F2) and the gate cut insulating pattern 150 and adjacent to the gate cut insulating pattern 150.

In at least one of the plurality of gate lines 160, a width of the terminal gate portion NWP, which is adjacent to the gate cut insulating pattern 150, in the first lateral direction (X direction) may be less than a width of another portion of the at least one gate line 160 in the first lateral direction (X direction). For example, in the at least one gate line 160, a width 160W2 of the terminal gate portion NWP in the first lateral direction (X direction) may be less than a width 160W1 of the first local gate portion RWP in the first lateral direction (X direction) and less than a width 160W3 of the second local gate portion WWP in the first lateral direction (X direction). As used herein, the first local gate portion RWP of the gate line 160 in the first device region AR1 may be referred to as a first portion, the terminal gate portion NWP of the gate line 160 in the first device region AR1 may be referred to as a second portion, the first local gate portion RWP of the gate line 160 in the second device region AR2 may be referred to as a third portion, and the terminal gate portion NWP of the gate line 160 in the second device region AR2 may be referred to as a fourth portion. As used herein, the second local gate portion WWP of each of the plurality of gate lines 160 may simply be referred to as a local gate portion.

In each of the plurality of gate lines 160, the second local gate portion WWP may have a greater width than another portion in the first lateral direction (X direction). For example, the width 160W3 of the second local gate portion WWP in the first lateral direction (X direction) may be greater than the width 160W1 of the first local gate portion RWP in the first lateral direction (X direction) and greater than the width 160W2 of the terminal gate portion NWP in the first lateral direction (X direction).

In the first device region AR1 and the second device region AR2, a gate dielectric film 152 may be between the first to third nanosheets N1, N2, and N3 included in each of the plurality of nanosheet stacks NSS and the gate line 160. The gate dielectric film 152 may include portions covering respective surfaces of the first to third nanosheets N1, N2, and N3, portions covering sidewalls of the main gate portion 160M, and the sidewalls 150S of the gate cut insulating pattern 150. As used herein, from among gate dielectric films 152, a gate dielectric film 152 in the first device region AR1 may be referred to as a first gate dielectric film and a gate dielectric film 152 in the second device region AR2 may be referred to as a second gate dielectric film.

In some example embodiments, the gate dielectric film 152 may have a stack structure of an interface film and a high-k dielectric film. The interface film may include a low-k dielectric material film, for example, a silicon oxide film, a silicon oxynitride film, or a combination thereof, which has a dielectric constant of about 9 or less. In some example embodiments, the interface film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, without being limited thereto. In some example embodiments, the gate dielectric film 152 in the first device region AR1 may have the same structure as the gate dielectric film 152 in the second device region AR2. In some other embodiments, the gate dielectric film 152 in the first device region AR1 may have a different structure from that of the gate dielectric film 152 in the second device region AR2.

The gate dielectric film 152 in the first device region AR1 may include a portion, which is between the first to third nanosheets N1, N2, and N3 of the nanosheet stack NSS and the gate line 160 in the first device region AR1, and a portion, which is between the sidewall 150S of the gate cut insulating pattern 150 and the gate line 160 and in contact with the sidewall 150S of the gate cut insulating pattern 150. The gate dielectric film 152 in the second device region AR2 may include a portion, which is between the first to third nanosheets N1, N2, and N3 of the nanosheet stack NSS and the gate line 160 in the second device region AR2, and a portion, which is between the sidewall 150S of the gate cut insulating pattern 150 and the gate line 160 and the sidewall 150S of the gate cut insulating pattern 150. In each of the first device region AR1 and the second device region AR2, each of the plurality of gate lines 160 adjacent to the gate cut insulating pattern 150 may be apart from the gate cut insulating pattern 150 with the gate dielectric film 152 therebetween.

In each of the first device region AR1 and the second device region AR2, the first to third nanosheets N1, N2, and N3 may include a semiconductor layer including the same elements as each other. In some example embodiments, each of the first nanosheet N1, the second nanosheet N2, and the third nanosheet N3 may include a silicon (Si) layer. In some example embodiments, in the first device region AR1, the first to third nanosheets N1, N2, and N3 may be doped with a dopant of the same conductivity type as that of the first source/drain region SD1. In the second device region AR2, the first to third nanosheets N1, N2, and N3 may be doped with a dopant of the same conductivity type as that of the second source/drain region SD2. In some example embodiments, in the first device region AR1, the first to third nanosheets N1, N2, and N3 may include a Si layer doped with an n-type dopant. In the second device region AR2, the first to third nanosheets N1, N2, and N3 may include a Si layer doped with a p-type dopant. In other example embodiments, the first source/drain region SD1 may be of the same conductivity type as that of the second source/drain region SD2, and all of the first to third nanosheets N1, N2, and N3 may include a Si layer doped with a dopant of the same conductivity type in the first device region AR1 and the second device region AR2.

As shown in FIG. 1B, the device isolation film 112 may include a portion between the first fin-type active region F1 and the gate cut insulating pattern 150 and a portion between the second fin-type active region F2 and the gate cut insulating pattern 150.

As shown in FIGS. 1C, 1D, and 1F, both sidewalls of the plurality of gate lines 160 may be respectively covered by a plurality of outer insulating spacers 118 on the plurality of fin-type active regions (e.g., F1 and F2) and the device isolation film 112. Each of the plurality of outer insulating spacers 118 may include a portion covering both sidewalls of the main gate portion 160M on the top surface of the nanosheet stack NSS and a portion covering the gate line 160 on the device isolation film 112. Each of the plurality of outer insulating spacers 118 may be apart from the gate line 160 with the gate dielectric film 152 therebetween. The plurality of outer insulating spacers 118 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

As shown in FIGS. 1C and 1D, in the first device region AR1 and the second device region AR2, both sidewalls of each of the plurality of sub-gate portions 160S may be apart from the first and second source/drain regions SD1 and SD2 with the gate dielectric film 152 therebetween, between respective adjacent ones of the first to third nanosheets N1, N2, and N3, and between each of the first fin-type active region F1 and the second fin-type active region F2 and the first nanosheet N1. Each of the plurality of first and second source/drain regions SD1 and SD2 may face the nanosheet stack NSS and the plurality of sub-gate portions 160S in the first lateral direction (X direction).

As shown in FIG. 1C, in the first device region AR1, a plurality of inner insulating spacers 120 may be between the plurality of sub-gate portions 160S and the first source/drain region SD1, between respective adjacent ones of the first to third nanosheets N1, N2, and N3, and between the first fin-type active region F1 and the first nanosheet N1. In the first device region AR1, both sidewalls of each of the plurality of sub-gate portions 160S may be apart from the inner insulating spacer 120 with the gate dielectric film 152 therebetween. In the first device region AR1, each of the plurality of sub-gate portions 160S may be apart from the first source/drain region SD1 with the gate dielectric film 152 and the inner insulating spacer 120 therebetween. Each of the plurality of inner insulating spacers 120 may be in contact with the first source/drain region SD1. At least some of the plurality of inner insulating spacers 120 may overlap the outer insulating spacers 118 in the vertical direction (Z direction). The inner insulating spacer 120 may include silicon nitride, silicon oxide, SiCN, SiBN, SiON, SiOCN, SiBCN, SiOC, or a combination thereof. The inner insulating spacer 120 may further include an air gap. In some example embodiments, the inner insulating spacer 120 may include the same material as the outer insulating spacer 118. In other example embodiments, the outer insulating spacer 118 and the inner insulating spacer 120 may include different materials from each other.

In the first device region AR1, each of the plurality of first source/drain regions SD1 may face the plurality of sub-gate portions 160S with the inner insulating spacer 120 therebetween in the first lateral direction (X direction). The plurality of first source/drain regions SD1 may not be in contact with the gate dielectric film 152. In other example embodiments, in the first device region AR1, the plurality of inner insulating spacers 120 may be omitted. In this case, each of the plurality of first source/drain regions SD1 may include a portion in contact with the gate dielectric film 152.

As shown in FIG. 1D, in the second device region AR2, both sidewalls of each of the plurality of sub-gate portions 160S may be apart from the second source/drain region SD2 with the gate dielectric film 152 therebetween, between respective adjacent ones of the first to third nanosheets N1, N2, and N3, and between the second fin-type active region F2 and the first nanosheet N1. The gate dielectric film 152 may include a portion in contact with the second source/drain region SD2. Each of the plurality of second source/drain regions SD2 may face the nanosheet stack NSS and the plurality of sub-gate portions 160S in the first lateral direction (X direction).

As shown in FIGS. 1B to 1D and 1F, a top surface of each of the gate line 160, the gate dielectric film 152, and the outer insulating spacer 118 may be covered by a capping insulating pattern 164. The capping insulating pattern 164 may include a silicon nitride film. As shown in FIG. 1B, the top surface of the gate cut insulating pattern 150 may be coplanar with a top surface of the capping insulating pattern 164.

As shown in FIG. 1C, in the first device region AR1, the main gate portion 160M of the gate line 160 may be apart from the first source/drain region SD1 with the outer insulating spacer 118 therebetween. As shown in FIG. 1D, in the second device region AR2, the main gate portion 160M of the gate line 160 may be apart from the second source/drain region SD2 with the outer insulating spacer 118 therebetween.

In some example embodiments, the first device region AR1 may be an NMOS transistor region and the second device region AR2 may be a PMOS transistor region. In this case, the plurality of first source/drain regions SD1 in the first device region AR1 may include a Si layer doped with an n-type dopant or a SiC layer doped with an n-type dopant, and the plurality of second source/drain regions SD2 in the second device region AR2 may include a SiGe layer doped with a p-type dopant. The n-type dopant may be selected from phosphorus (P), arsenic (As), and antimony (Sb). The p-type dopant may be selected from boron (B) and gallium (Ga).

The plurality of first source/drain regions SD1 in the first device region AR1 may have different shapes and sizes from the plurality of second source/drain regions SD2 in the second device region AR2. However, the inventive concepts are not limited thereto, and a plurality of first and second source/drain regions SD1 and SD2 having various shapes and sizes may be formed in the first device region AR1 and the second device region AR2.

As shown in FIGS. 1C and 1D, the plurality of first and second source/drain regions SD1 and SD2 may be covered by an insulating liner 142. The insulating liner 142 may conformally cover respective surfaces of the plurality of first and second source/drain regions SD1 and SD2 and the outer insulating spacer 118. The insulating liner 142 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon dioxide (SiO$_2$), or a combination thereof.

In the first device region AR1 and the second device region AR2, the insulating liner 142 may be covered by an inter-gate dielectric film 144. The inter-gate dielectric film 144 may include a silicon oxide film, a silicon nitride film, SiON, SiOCN, or a combination thereof.

The insulating liner 142, the inter-gate dielectric film 144, a plurality of capping insulating patterns 164, and the gate cut insulating pattern 150 may be covered by an insulating structure 190. The top surface of the gate cut insulating pattern 150 may be in contact with a bottom surface of the insulating structure 190. The insulating structure 190 may include an etch stop film 190A and an interlayer insulating film 190B. As shown in FIGS. 1B and 1E, the top surface of the gate cut insulating pattern 150 may be in contact with a bottom surface of the etch stop film 190A included in the insulating structure 190. The etch stop film 190A may include silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 190B may include an oxide film, a nitride film, an ultralow-k (ULK) film having an ultralow dielectric constant K of about 2.2 to about 2.4, or a combination thereof. For example, the interlayer insulating film 190B may include a tetraethyl-orthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof.

As shown in FIGS. 1C and 1D, in the first device region AR1 and the second device region AR2, a plurality of source/drain contacts 174 and a plurality of source/drain via contacts 192 may be formed on the plurality of first and second source/drain regions SD1 and SD2. The plurality of first and second source/drain regions SD1 and SD2 may be connected to an upper conductive line (not shown) through the plurality of source/drain contacts 174 and the plurality of source/drain via contacts 192.

A metal silicide film 172 may be formed between the first and second source/drain regions SD1 and SD2 and the source/drain contact 174. In some example embodiments, the metal silicide film 172 may include Ti, W, Ru, Nb, Mo, Hf, Ni, Co, Pt, Yb, Tb, Dy, Er, or Pd. For example, the metal silicide film 172 may include titanium silicide. The plurality of source/drain contacts 174 may pass through the inter-gate dielectric film 144 and the insulating liner 142 in the vertical direction (Z direction) and contact the metal silicide film 172. The plurality of source/drain via contacts 192 may pass through the insulating structure 190 in the vertical direction (Z direction) and contact a top surface of the source/drain contact 174.

Each of the plurality of source/drain contacts 174 may include a conductive barrier film 174A and a metal plug 174B. Each of the plurality of source/drain via contacts 192 may include a conductive barrier film 192A and a metal plug 192B. The conductive barrier films 174A and 192A may include titanium (Ti), tantalum (Ta), titanium nitride (TiN), tantalum nitride (TaN), or a combination thereof, and the metal plugs 174B and 192B may include tungsten (W), cobalt (Co), copper (Cu), ruthenium (Ru), manganese (Mn), or a combination thereof, without being limited thereto. In some example embodiments, sidewalls of each of the plurality of source/drain contacts 174 and the plurality of source/drain via contacts 192 may be surrounded by contact insulating spacers (not shown). The contact insulating spacer may include SiCN, SiOCN, SiN, or a combination thereof, without being limited thereto.

A gate contact (not shown) may be formed on each of the plurality of gate lines 160. Each of the plurality of gate lines 160 may be connected to an upper conductive line (not shown) through the gate contact. The gate contact may have a structure similar to the above-described structure of each of the source/drain contact 174 and the source/drain via contact 192.

The IC device 100 described with reference to FIGS. 1A to 1F may include the gate cut insulating pattern between the gate line 160 located in the first device region AR1 and the gate line 160 located in the second device region AR2. In each of the plurality of gate lines 160 that are apart from each other in the second lateral direction (Y direction) with the gate cut insulating pattern 150 therebetween, a width of the terminal gate portion NWP, which is adjacent to the gate cut insulating pattern 150, in the first lateral direction (X direction) may be less than a width of another portion in the first lateral direction (X direction). Accordingly, when an etching process for forming the gate cut insulating pattern 150 is performed during the manufacture of the IC device 100, of a material layer filling a region in which the gate line 160 is formed, a portion to be removed to form the gate cut insulating pattern 150 may be sufficiently removed without partially undesirably remaining. In addition, a portion of the gate line 160, which is adjacent to the nanosheet stack NSS and covers the device isolation film 112, may have a greater width than a portion of the gate line 160, which surrounds the nanosheet stack NSS. Accordingly, when undesirable materials are removed from relatively narrow regions adjacent to the nanosheet stack NSS during the formation of the gate line 160, a space in which an etchant or an etch gas may flow into the relatively narrow regions may relatively widen. Thus, the process of removing the undesirable materials from the relatively narrow regions may be performed smoothly. Furthermore, when a deposition process of forming a film desired for the relatively narrow regions adjacent to the nanosheet stack NSS is performed, a space into which materials desired for the relatively narrow regions may be supplied from the outside may relatively widen, and thus, a desired deposition process may be performed smoothly. Therefore, the likelihood of process defects may be eliminated during the process of manufacturing the IC device 100, and the performance and reliability of each of the plurality of transistors (e.g., TR1 and TR2) formed in the first device region AR1 and the second device region AR2 may improve.

Figure 2:
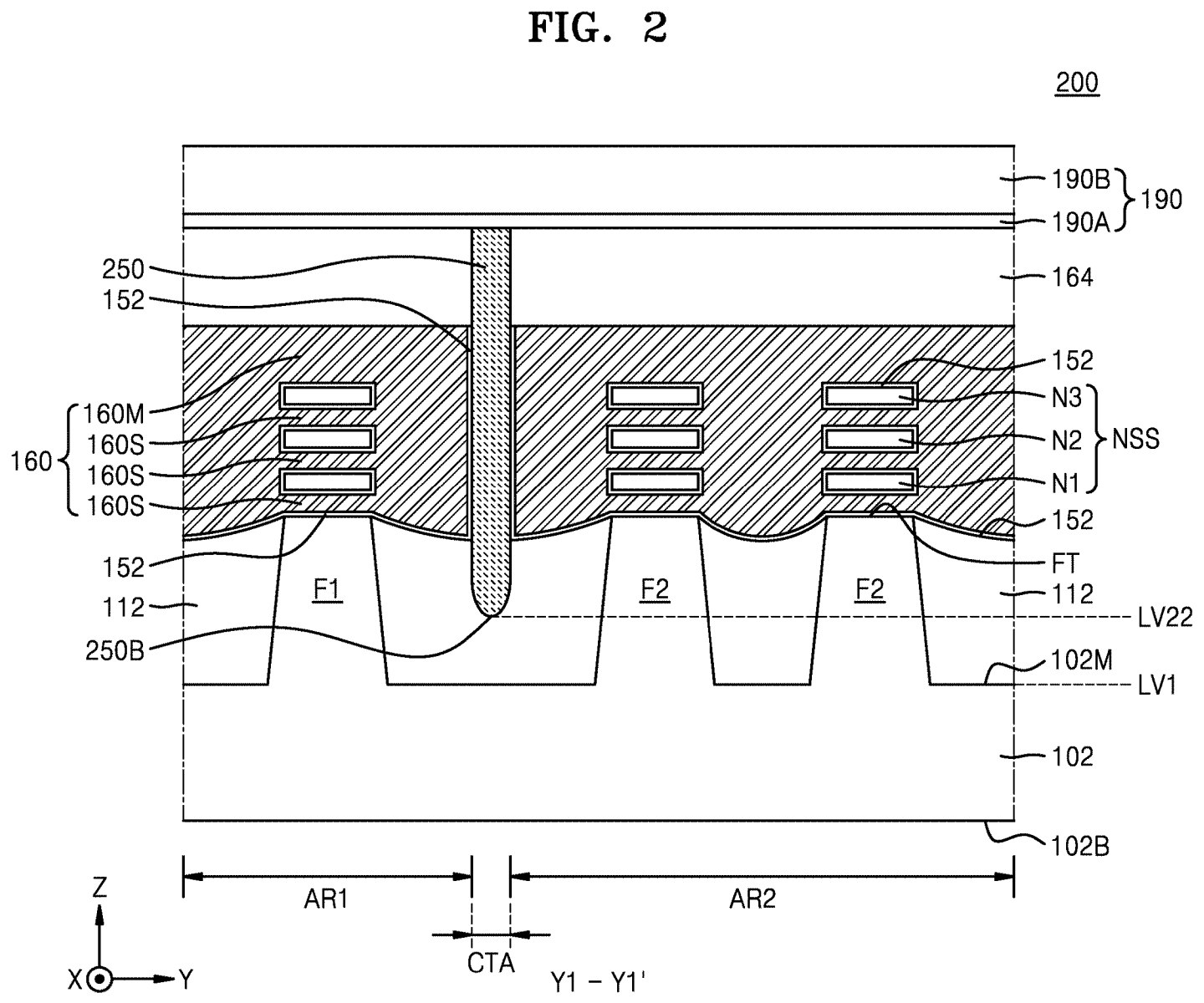

FIG. 2 is a cross-sectional view of an IC device 200 according to an example embodiment. FIG. 2 illustrates some components in a portion corresponding to a cross-section taken along line Y1-Y1' of FIG. 1A. In FIG. 2, the same reference numerals are used to denote the same elements as in FIGS. 1A to 1F, and repeated descriptions thereof are omitted.

Referring to FIG. 2, the IC device 200 may have the same or substantially similar configuration as the IC device 100 described with reference to FIGS. 1A to 1F. However, the IC device 200 may include a gate cut insulating pattern 250 located in a gate isolation area CTA between a gate line 160 located in a first device region AR1 and a gate line 160 located in a second device region AR2.

The gate cut insulating pattern 250 may have the same or substantially similar configuration as the gate cut insulating pattern 150 described with reference to FIGS. 1A to 1F. However, the gate cut insulating pattern 250 may pass through (e.g., may penetrate) a portion of the device isolation film 112 in the vertical direction (Z direction). A vertical level LV22 of a bottom surface 250B of the gate cut insulating pattern 250 may be farther from the backside surface 102B of the substrate 102 than a vertical level LVI of the main surface 102M of the substrate 102. The vertical level LV22 of the bottom surface 250B of the gate cut insulating pattern 250 may be farther from the backside surface 102B of the substrate 102 than a bottom surface of the device isolation film 112, which is in contact with the main surface 102M of the substrate 102. The gate cut insulating pattern 250 may be apart from the substrate 102 with another portion of the device isolation film 112 therebetween in the vertical direction (Z direction). Details of the gate cut insulating pattern 250 may be the same as or substantially similar to those of the gate cut insulating pattern 150 described with reference to FIGS. 1A, 1B, and 1E.

Figure 3:
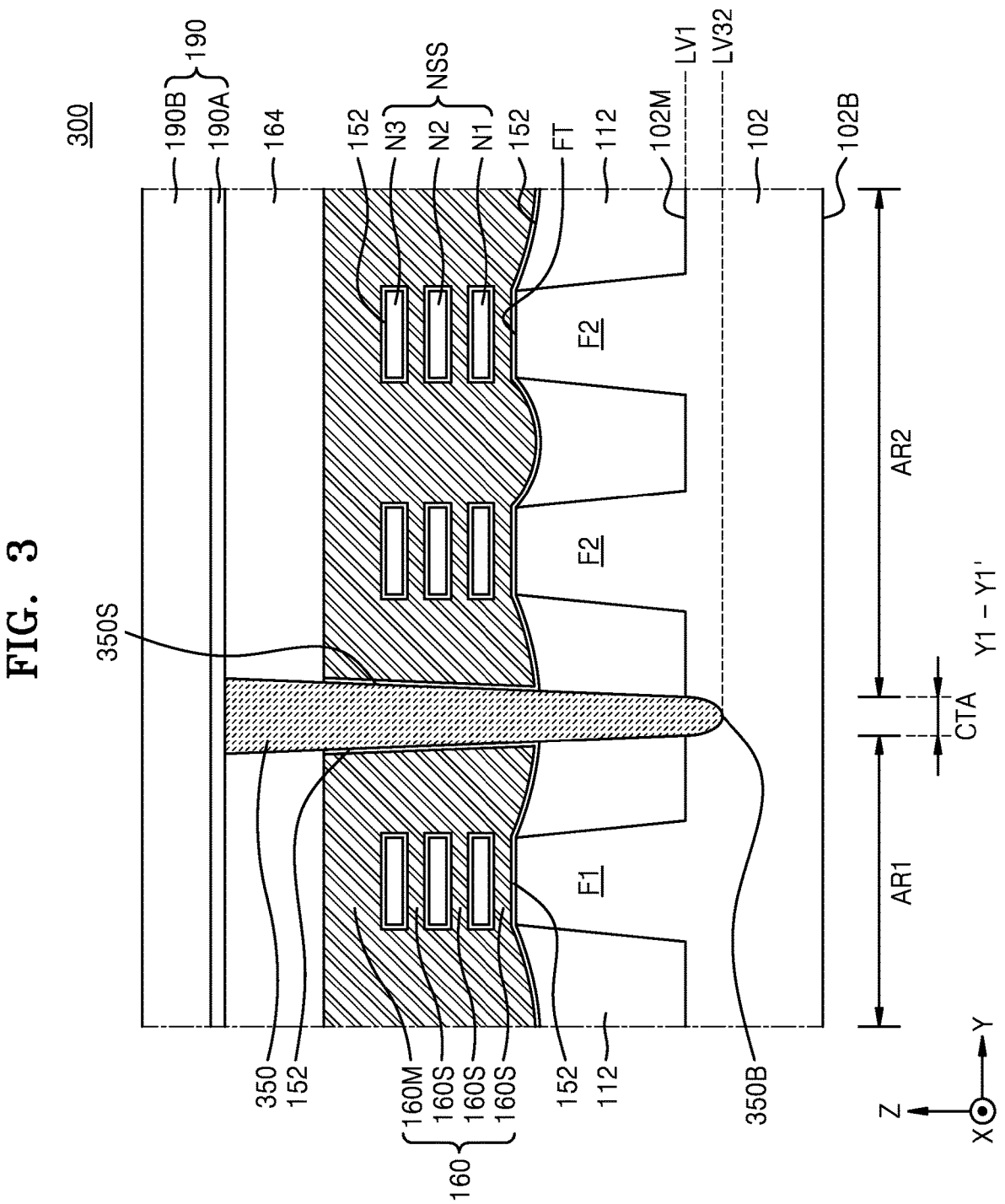
FIG. 3 is a cross-sectional view of an IC device according to an example embodiment.

FIG. 3 is a cross-sectional view of an IC device 300 according to an example embodiment. FIG. 3 illustrates some components in a portion corresponding to a cross-section taken along line Y1-Y1' of FIG. 1A. In FIG. 3, the same reference numerals are used to denote the same elements as in FIGS. 1A to 1F, and repeated descriptions thereof are omitted here.

Referring to FIG. 3, the IC device 300 may have the same or substantially similar configuration as the IC device 100 described with reference to FIGS. 1A to 1F. However, the IC device 300 may include a gate cut insulating pattern 350 between a gate line 160 in a first device region AR1 and a gate line 160 in a second device region AR2.

The gate cut insulating pattern 350 may have the same or substantially similar configuration as the gate cut insulating pattern 150 described with reference to FIGS. 1A to 1F. However, the gate cut insulating pattern 350 may have both sidewalls 350S facing the gate line 160 located in the first device region AR1 and the gate line 160 located in the second device region AR2, respectively. At least one of the both sidewalls 350S of the gate cut insulating pattern 350 may extend away from a substrate 102 in an inclined direction with respect to a direction perpendicular to a main surface 102M of the substrate 102. FIG. 3 illustrates an example in which the both sidewalls 350S of the gate cut insulating pattern 350 extend away from the substrate 102 in opposite inclined directions with respect to the direction perpendicular to the main surface 102M of the substrate 102. A width of the gate cut insulating pattern 350 in a second lateral direction (Y direction) may include a portion that gradually increases away from the substrate 102.

A vertical level LV32 of a bottom surface 350B of the gate cut insulating pattern 350 may be closer to a backside surface 102B of the substrate 102 than a vertical level LVI of the main surface 102M of the substrate 102. Details of the gate cut insulating pattern 350 may be the same as or substantially similar to those of the gate cut insulating pattern 150 described with reference to FIGS. 1A, 1B, and 1E.

Figure 4:
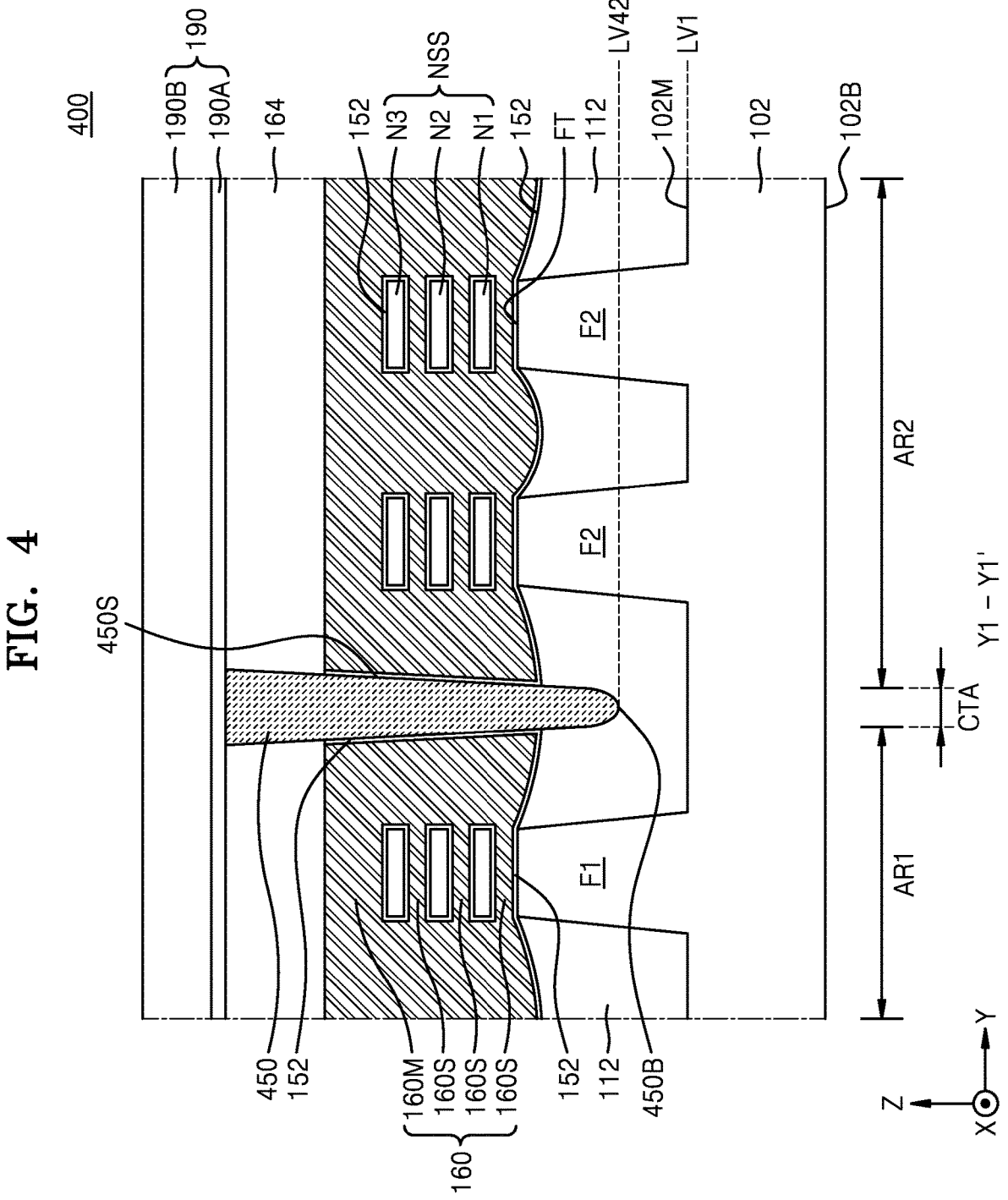
FIG. 4 is a cross-sectional view of an IC device according to an example embodiment.

FIG. 4 is a cross-sectional view of an IC device 400 according to an example embodiment. FIG. 4 illustrates some components in a portion corresponding to a cross-section taken along line Y1-Y1' of FIG. 1A. In FIG. 4, the same reference numerals are used to denote the same elements as in FIGS. 1A to 1F, and repeated descriptions thereof are omitted here.

Referring to FIG. 4, the IC device 400 may have the same or substantially similar configuration as the IC device 300 described with reference to FIG. 3. However, the IC device 400 may include a gate cut insulating pattern 450 located in a gate isolation area CTA between a gate line 160 located in a first device region AR1 and a gate line 160 located in a second device region AR2.

The gate cut insulating pattern 450 may have the same or substantially similar configuration as the gate cut insulating pattern 350 described with reference to FIG. 3. However, the gate cut insulating pattern 450 may pass through a portion of the device isolation film 112 in the vertical direction (Z direction). A vertical level LV42 of a bottom surface 450B of the gate cut insulating pattern 450 may be farther from a backside surface 102B of a substrate 102 than a vertical level LVI of a main surface 102M of the substrate 102. The vertical level LV42 of the bottom surface 450B of the gate cut insulating pattern 450 may be farther from the backside surface 102B of the substrate 102 than a bottom surface of the device isolation film 112, which is in contact with the main surface 102M of the substrate 102. The gate cut insulating pattern 450 may be apart from the substrate 102 with another portion of the device isolation film 112 therebetween in the vertical direction (Z direction). Details of the gate cut insulating pattern 450 may be the same as or substantially similar to those of the gate cut insulating pattern 150, which has been described with reference to FIGS. 1A, 1B, and 1E.

Figure 5A:
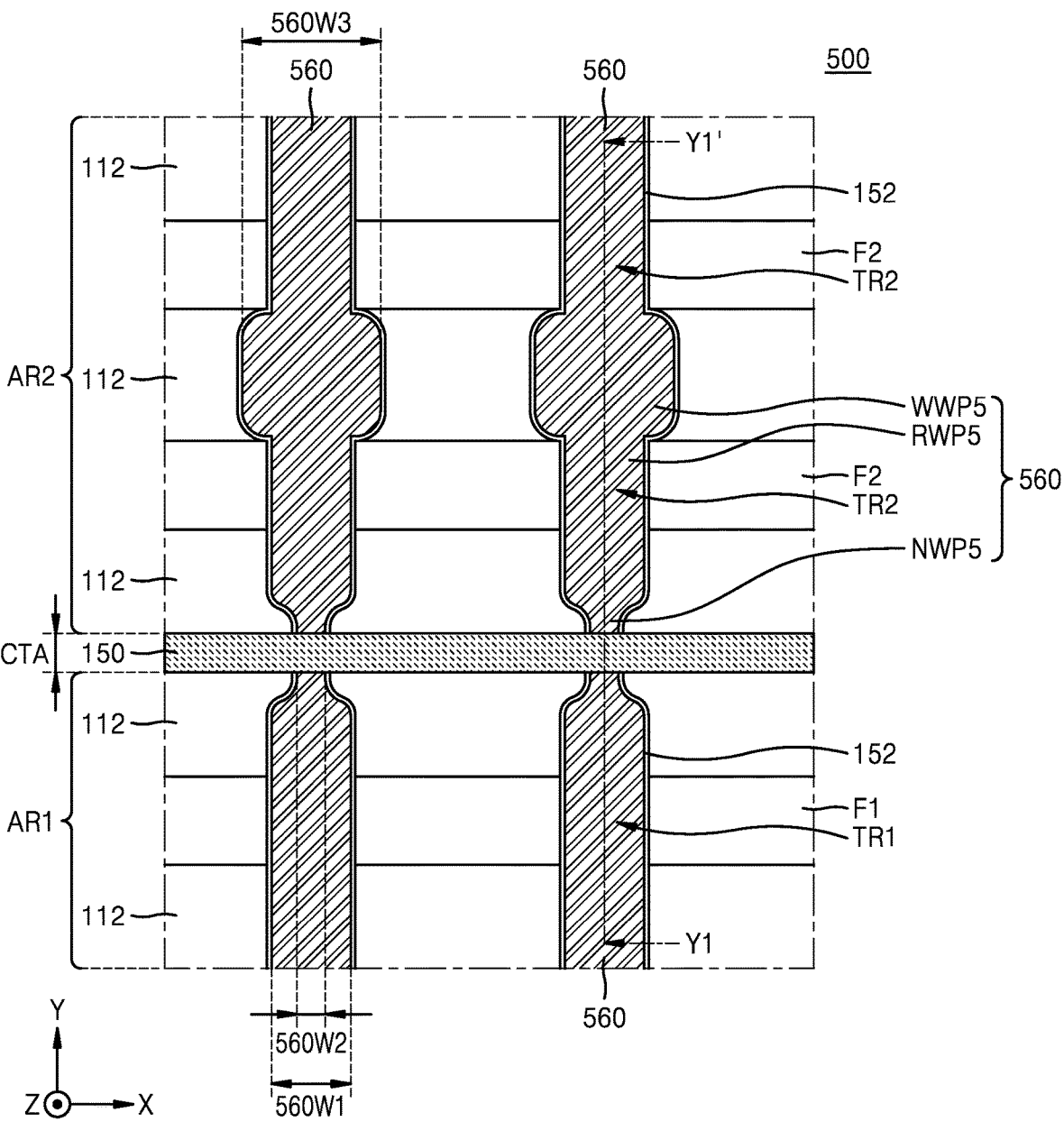
FIG. 5A is a plan layout diagram of some components of an IC device according to an example embodiment.
Figure 5B:
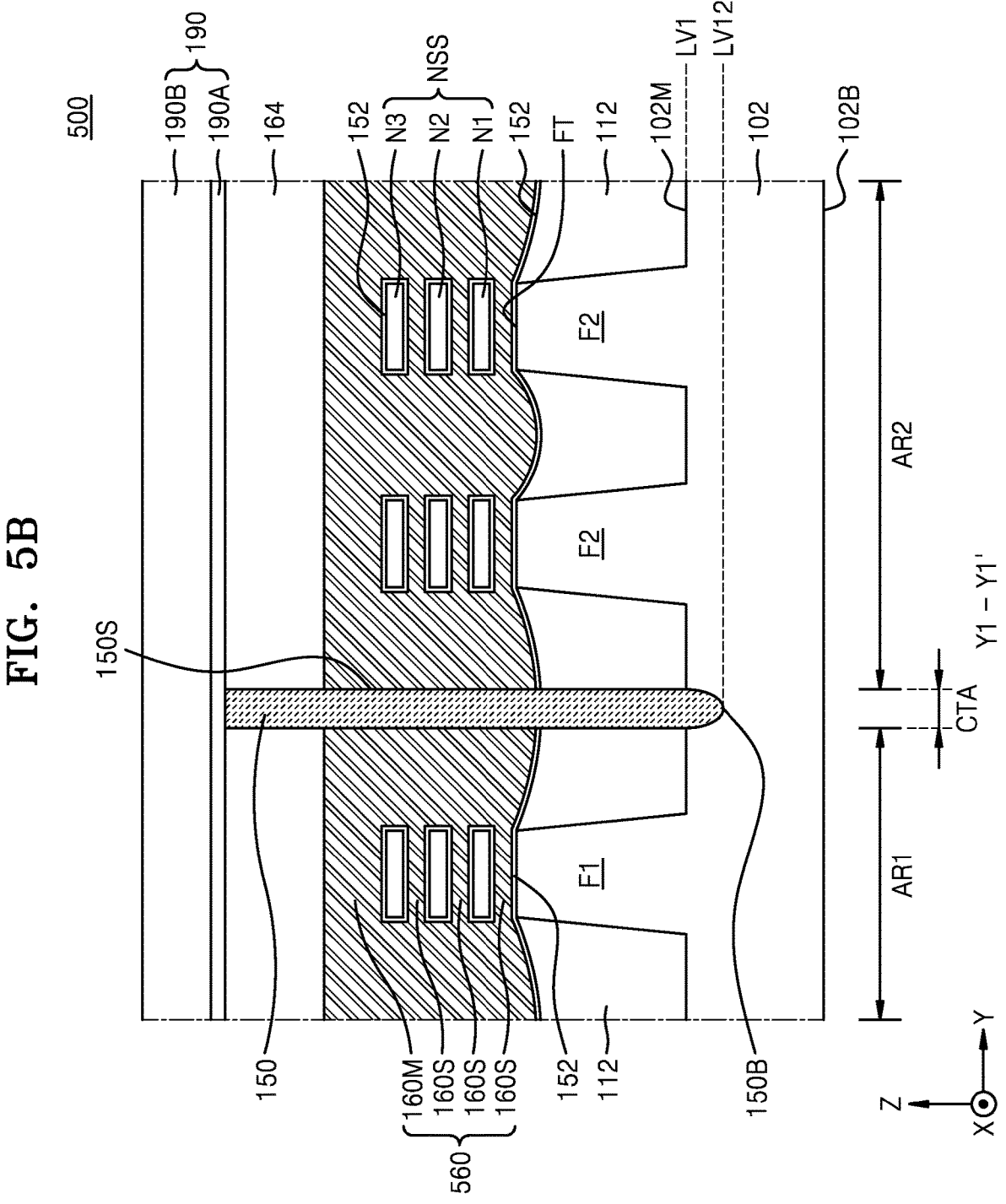
FIG. 5B is a cross-sectional view of some components in a cross-section taken along line Y1-Y1' of FIG. 5A.

FIG. 5A is a plan layout diagram of some components of an IC device 500 according to an example embodiment. FIG. 5B illustrates some components in a cross-section taken along line Y1-Y1' of FIG. 5A. In FIGS. 5A and 5B, the same reference numerals are used to denote the same elements as in FIGS. 1A to 1F, and repeated descriptions thereof are omitted here.

Referring to FIGS. 5A and 5B, the IC device 500 may have the same or substantially similar configuration as the IC device 100 described with reference to FIGS. 1A to 1F. However, the IC device 500 may include a plurality of gate lines 560. The plurality of gate lines 560 may have the same or substantially similar configuration as the plurality of gate lines 160 included in the IC device 100 described with reference to FIGS. 1A to 1F. However, in the IC device 500, from among a plurality of gate lines 560 in a first device region AR1 and a plurality of gate lines 560 in a second device region AR2, each of a plurality of gate lines 560 adjacent to a gate cut insulating pattern 150 may include a first local gate portion RWP5, a second local gate portion WWP5, and a terminal gate portion NWP5. The first local gate portion RWP5 may overlap the fin-type active regions (e.g., F1 and F2) in the vertical direction (Z direction). The second local gate portion WWP5 may overlap the device isolation film 112 in the vertical direction (Z direction) in each of the first device region AR1 and the second device region AR2. The terminal gate portion NWP5 may be between each of the fin-type active regions (e.g., F1 and F2)

and the gate cut insulating pattern 150 and adjacent to the gate cut insulating pattern 150.

In at least one of the plurality of gate lines 560, a width of a first of the terminal gate portion NWP5, which is adjacent to the gate cut insulating pattern 150, in a first lateral direction (X direction) may be less than a width of another portion of the at least one gate line 560 in the first lateral direction (X direction). For example, in the at least one gate line 560, a width 560W2 of the terminal gate portion NWP5 in the first lateral direction (X direction) may be less than a width 560W1 of the first local gate portion RWP5 in the first lateral direction (X direction) and less than a width 560W3 of the second local gate portion WWP5 in the first lateral direction (X direction).

In each of the plurality of gate lines 560, a width of the second local gate portion WWP5 in the first lateral direction (X direction) may be greater than a width of another portion in the first lateral direction (X direction). For example, in the at least one gate line 560, the width 560W3 of the second local gate portion WWP5 in the first lateral direction (X direction) may be greater than the width 560W1 of the first local gate portion RWP5 in the first lateral direction (X direction) and greater than the width 560W2 of the terminal gate portion NWP5 in the first lateral direction (X direction).

The terminal gate portion NWP5 of each of the plurality of gate lines 560 adjacent to the gate cut insulating pattern 150 may be in contact with the gate cut insulating pattern 150. The gate dielectric film 152 may not include a portion between the gate cut insulating pattern 150 and the gate line 160.

Similar to the IC device 100 described with reference to FIGS. 1A to 1F, each of the IC devices 200, 300, 400, and 500 described with reference to FIGS. 2 to 4, 5A, and 5B may include the gate cut insulating pattern 150, 250, 350, or 450 between the gate line 160 or 560 located in the first device region AR1 and the gate line 160 or 560 located in the second device region AR2. Also, in each of the plurality of gate lines 160 or 560, which are apart from each other in the second lateral direction (Y direction) with the gate cut insulating pattern 150, 250, 350, or 450 therebetween, a width of the terminal gate portion NWP or NWP5, which is adjacent to the gate cut insulating pattern 150 or 560, in the first lateral direction (X direction) may be less than a width of another portion of each of the plurality of gate lines 160 or 560 in the first lateral direction (X direction). Accordingly, when an etching process for forming the gate cut insulating pattern 150, 250, 350, or 450 is performed during the manufacture of the IC device 200, 300, 400, or 500, of a material layer filling a region in which the gate line 160 or 560 is formed, a portion to be removed to form the gate cut insulating pattern 150, 250, 350, or 450 may be sufficiently removed without partially undesirably remaining. In addition, a portion of the gate line 160 or 560, which is adjacent to the nanosheet stack NSS and covers the device isolation film 112, may have a greater width than a portion of the gate line 160 or 560, which surrounds the nanosheet stack NSS. Accordingly, when unnecessary materials are removed from relatively narrow regions adjacent to the nanosheet stack NSS during the formation of the gate line 160 or 560, a space in which an etchant or an etch gas may flow into the relatively narrow regions may relatively widen. Thus, the process of removing the unnecessary materials from the relatively narrow regions may be performed smoothly. Furthermore, when a deposition process of forming a film required for the relatively narrow regions is performed, a space into which materials required for the relatively narrow regions may be supplied from the outside may relatively widen, and thus, a desired deposition process may be performed smoothly. Therefore, the likelihood of process defects may be eliminated during the process of manufacturing the IC device 200, 300, 400, or 500, and the performance and reliability of each of a plurality of transistors (e.g., TR1 and TR2) formed in the first device region AR1 and the second device region AR2 may improve.

FIGS. 6 to 15E are cross-sectional views of a process sequence of a method of manufacturing an IC device, according to an example embodiment. More specifically, FIGS. 10A, 12A, and 15A are each a plan layout diagram of a planar structure on which some processes are performed in a method of manufacturing an IC device. FIGS. 6, 7, 8, 9A, 10B, 11A, 12A, 13A, 14A, and 15B are cross-sectional views of some components in a portion corresponding to a cross-section taken along line Y1-Y1' of FIG. 1A, according to a process sequence. FIGS. 9B, 10C, 11B, 13B, 14B, and 15C are cross-sectional views of some components in a portion corresponding to a cross-section taken along line X1-X1' of FIG. 1A, according to a process sequence. FIGS. 9C, 10D, 11C, 13C, 14C, and 15D are cross-sectional views of some components in a portion corresponding to a cross-section taken along line X2-X2' of FIG. 1A, according to a process sequence. FIGS. 10E, 11D, and 12C are cross-sectional views of some components in a portion corresponding to a cross-section taken along line X3-X3' of FIG. 1A, according to a process sequence. FIGS. 10F, 11E, 13D, 14D, and 15E are cross-sectional views of some components in a portion corresponding to a cross-section taken along line X4-X4' of FIG. 1A, according to a process sequence. An example of the method of manufacturing the IC device 100 shown in FIGS. 1A to 1F is described with reference to FIGS. 6 to 15E. In FIGS. 6 to 15E, the same reference numerals are used to denote the same elements as in FIGS. 1A to 1F, and repeated descriptions thereof are omitted here.

Figure 6:
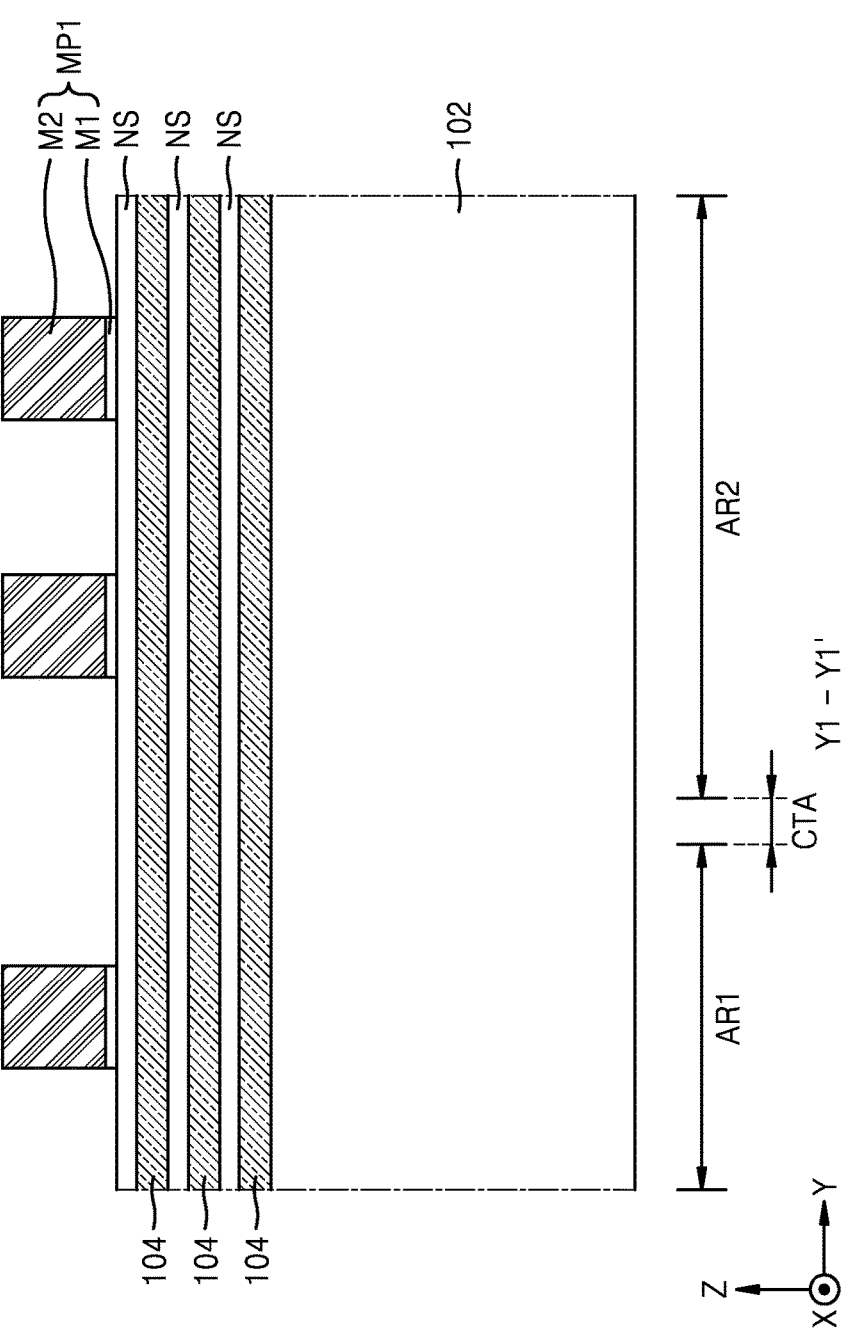

Referring to FIG. 6, a stack structure in which plurality of sacrificial semiconductor layers 104 and a plurality of nanosheet semiconductor layers NS are alternately stacked one-by-one may be formed on a substrate 102. Thereafter, a mask pattern MP1 may be formed on the stack structure in a first device region AR1 and a second device region AR2. In some example embodiments, the mask pattern MP1 may include a double structure of a silicon oxide film M1 and a silicon nitride film M2.

The plurality of sacrificial semiconductor layers 104 and the plurality of nanosheet semiconductor layers NS may include semiconductor materials having different etch selectivities from each other. In some example embodiments, each of the plurality of nanosheet semiconductor layers NS may include a silicon (Si) layer and each of the plurality of sacrificial semiconductor layers 104 may include a silicon germanium (SiGe) layer. In embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge concentration of the SiGe layer included in the plurality of sacrificial semiconductor layers 104 may be variously selected as desired.

Figure 7:
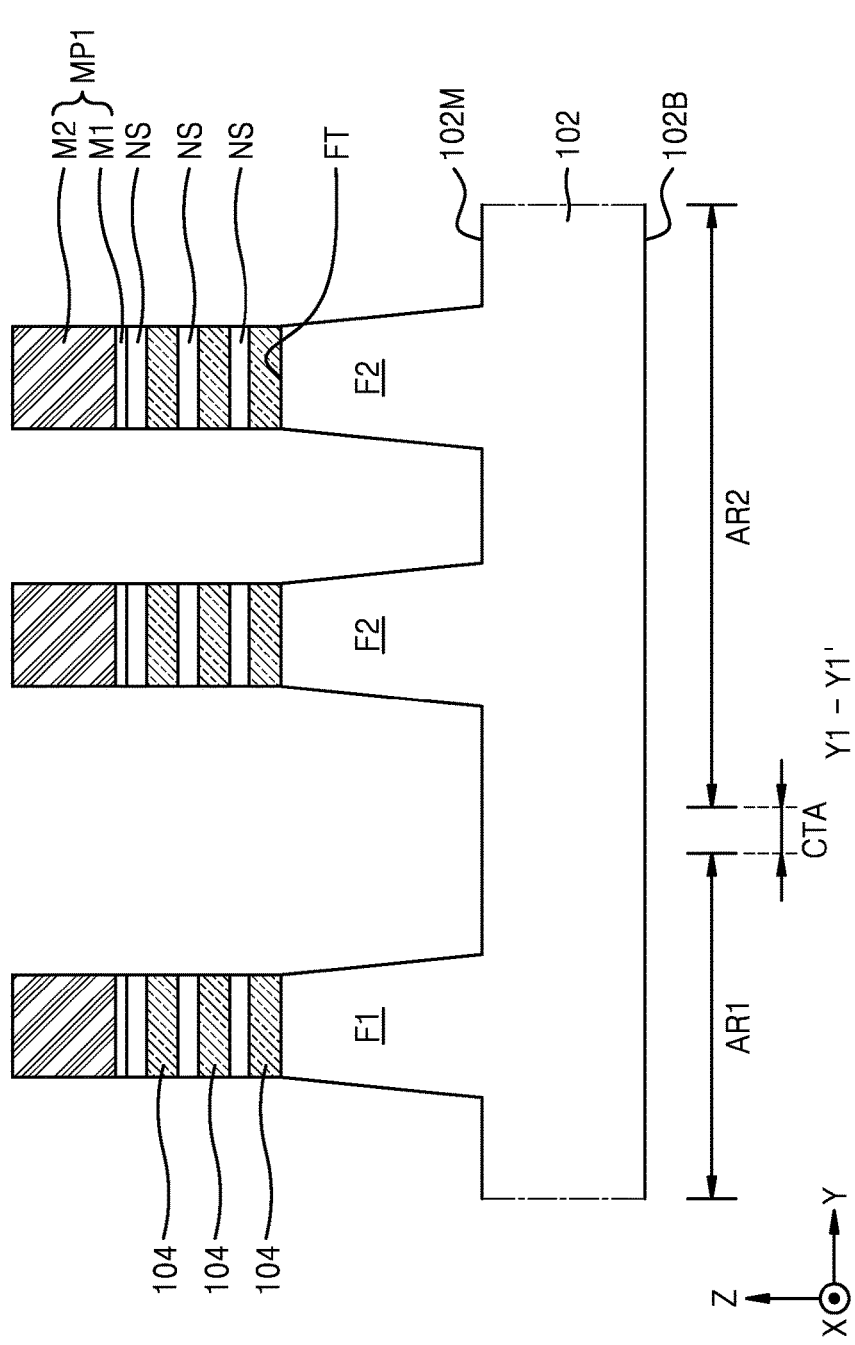

Referring to FIG. 7, respective portions of the plurality of sacrificial semiconductor layers 104, the plurality of nanosheet semiconductor layers NS, and the substrate 102 may be etched by using the mask pattern MP1 as an etch mask, and thus, a plurality of fin-type active regions (e.g., F1 and F2) may be formed. The plurality of fin-type active regions (e.g., F1 and F2) may protrude from the substrate

102 upward in the vertical direction (Z direction) and extend parallel to each other in a first lateral direction (X direction). The stack structure in which the plurality of sacrificial semiconductor layers 104 and the plurality of semiconductor layers NS are alternately stacked one-by-one and the mask pattern MP1 may remain on each of the plurality of fin-type active regions (e.g., F1 and F2).

Figure 8:
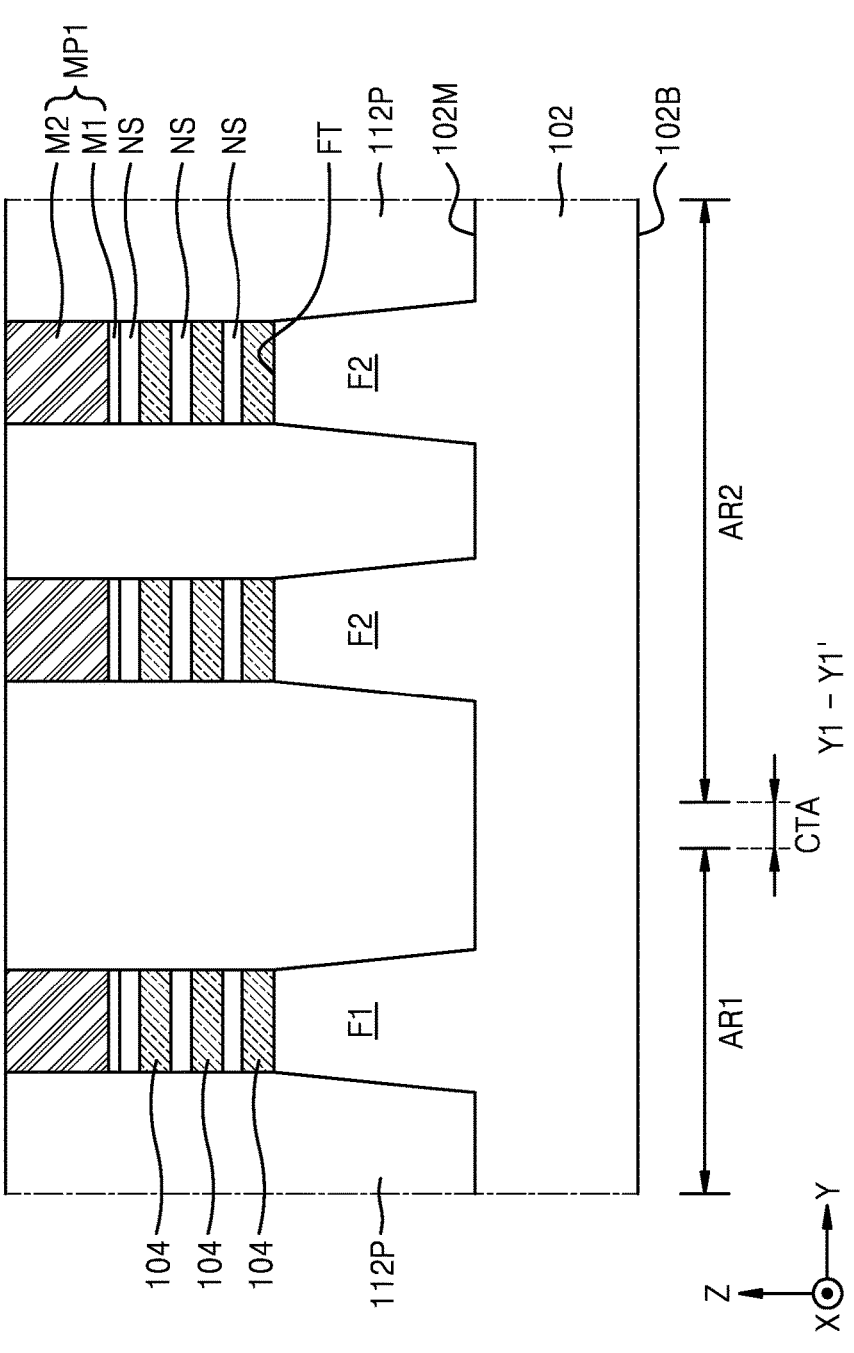

Referring to FIG. 8, in the resultant structure of FIG. 7, a preliminary device isolation film 112P may be formed to fill respective spaces between the plurality of fin-type active regions (e.g., F1 and F2) and openings formed in the mask pattern MP1. The resultant structure including the preliminary device isolation film 112P may be planarized by using a chemical mechanical polishing (CMP) process such that a top surface of the preliminary device isolation film 112P is coplanar with a top surface of the mask pattern MP1. A constituent material of the preliminary device isolation film 1120P may be the same as that of the device isolation film 112, which has been described with reference to FIG. 1B.

Figure 9A:
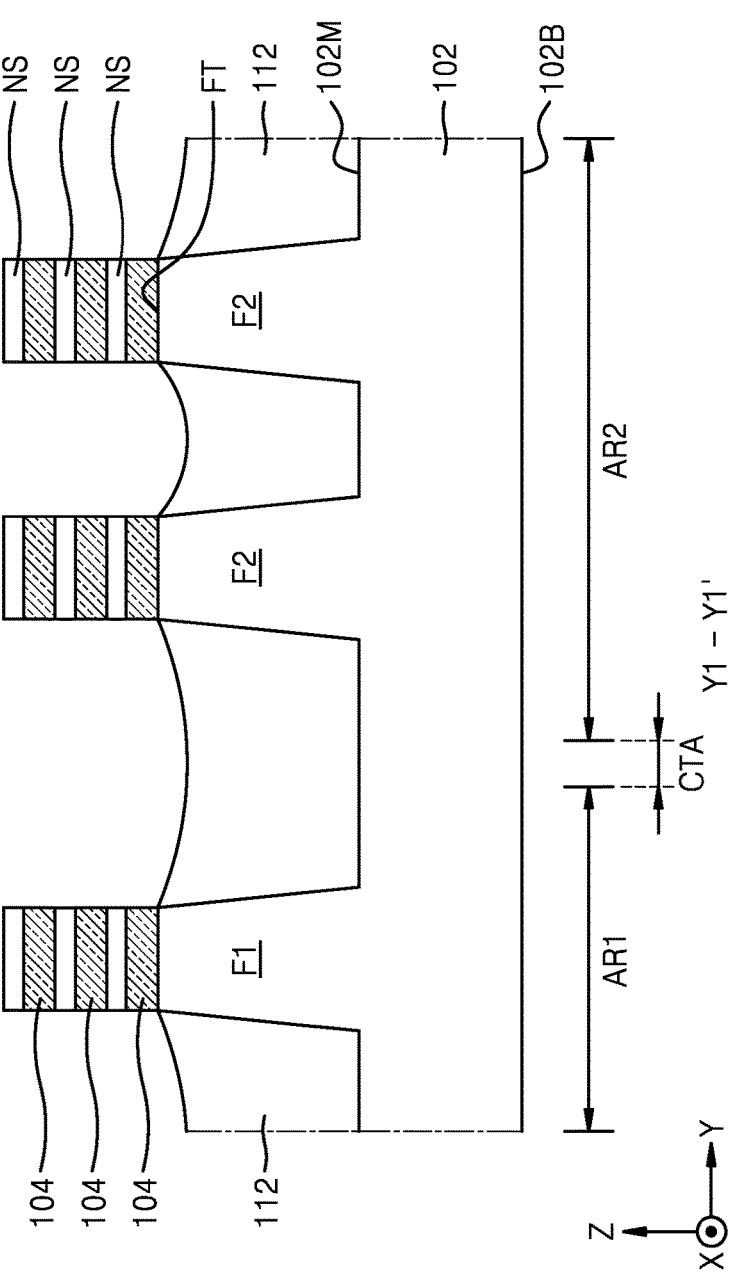
Figure 9B:
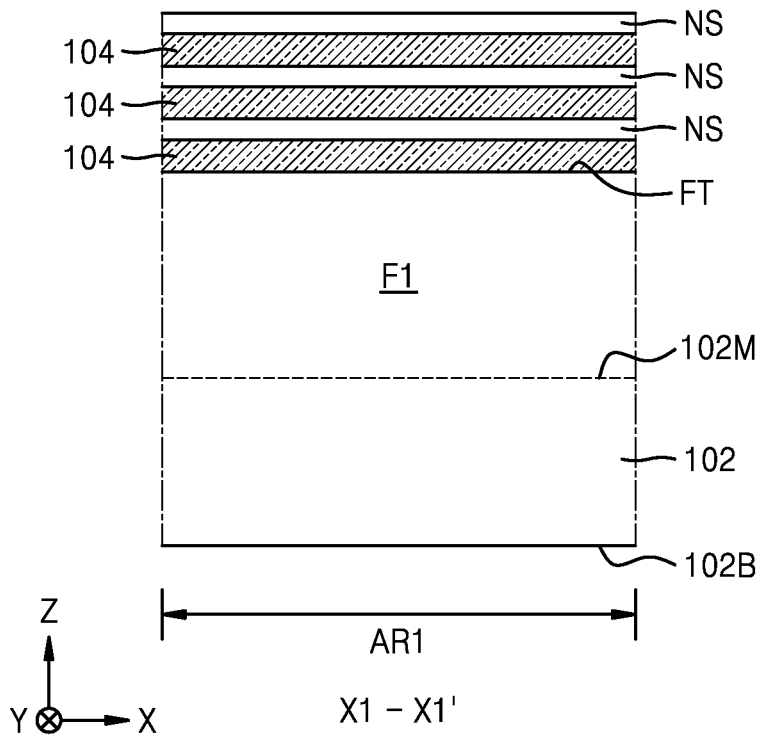
FIGS. 9B, 10C, 11B, 13B, 14B, and 15C are cross-sectional views of some components in a portion corresponding to a cross-section taken along line X1-X1' of FIG. 1A, according to a process sequence.
Figure 9C:
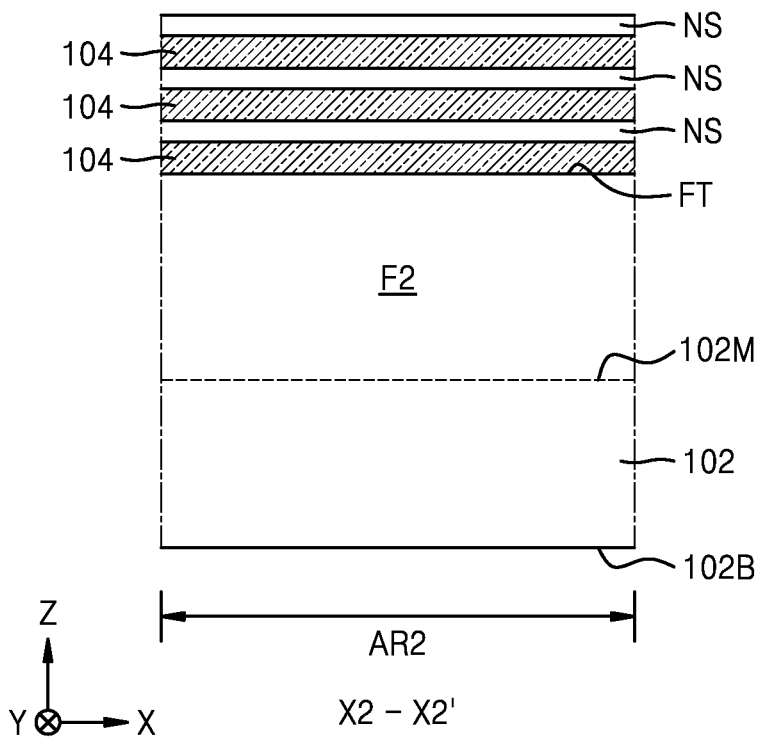
FIGS. 9C, 10D, 11C, 13C, 14C, and 15D are cross-sectional views of some components in a portion corresponding to a cross-section taken along line X2-X2' of FIG. 1A, according to a process sequence.

Referring to FIGS. 9A, 9B, and 9C, in the resultant structure of FIG. 8, a recess process may be performed on the preliminary device isolation film 112P to form a device isolation film 112 having a lowered top surface. The mask pattern MP1 may be removed to expose a top surface of an uppermost one of the plurality of nanosheet semiconductor layers NS. A vertical level of an uppermost surface of the device isolation film 112 may be equal to or lower than a vertical level of a fin top surface FT of each of the plurality of fin-type active regions (e.g., F1 and F2).

Referring to FIGS. 10A to 10F, a plurality of dummy gate structures DGS and outer insulating spacers 118 may be formed on the resultant structure of FIGS. 9A, 9B, and 9C. The outer insulating spacers 118 may cover both sidewalls of each of the plurality of dummy gate structures DGS. The plurality of dummy gate structures DGS may be formed in positions corresponding to the plurality of gate lines 160 shown in FIG. 1A and continuously extend long in the second lateral direction (Y direction).

Each of the plurality of dummy gate structures DGS may have a structure in which an oxide film D112, a dummy gate layer D114, and a capping layer D116 are sequentially stacked. In some example embodiments, the dummy gate layer D114 may include a polysilicon film and the capping layer D116 may include a silicon nitride film.

Figure 10A:
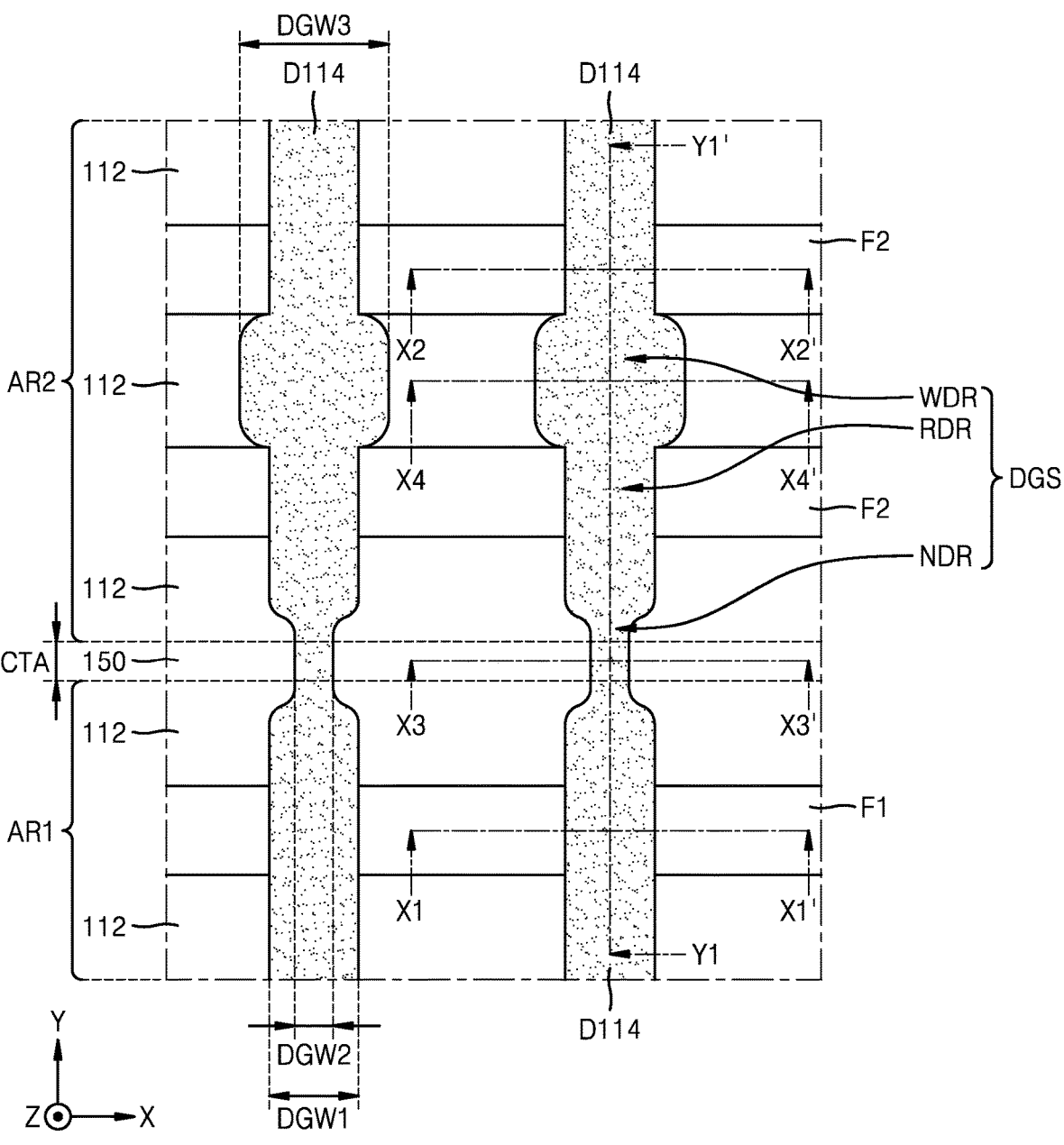
FIGS. 10A, 12A, and 15A are each a plan layout diagram of a planar structure on which some processes are performed in a method of manufacturing an IC device.
Figure 10B:
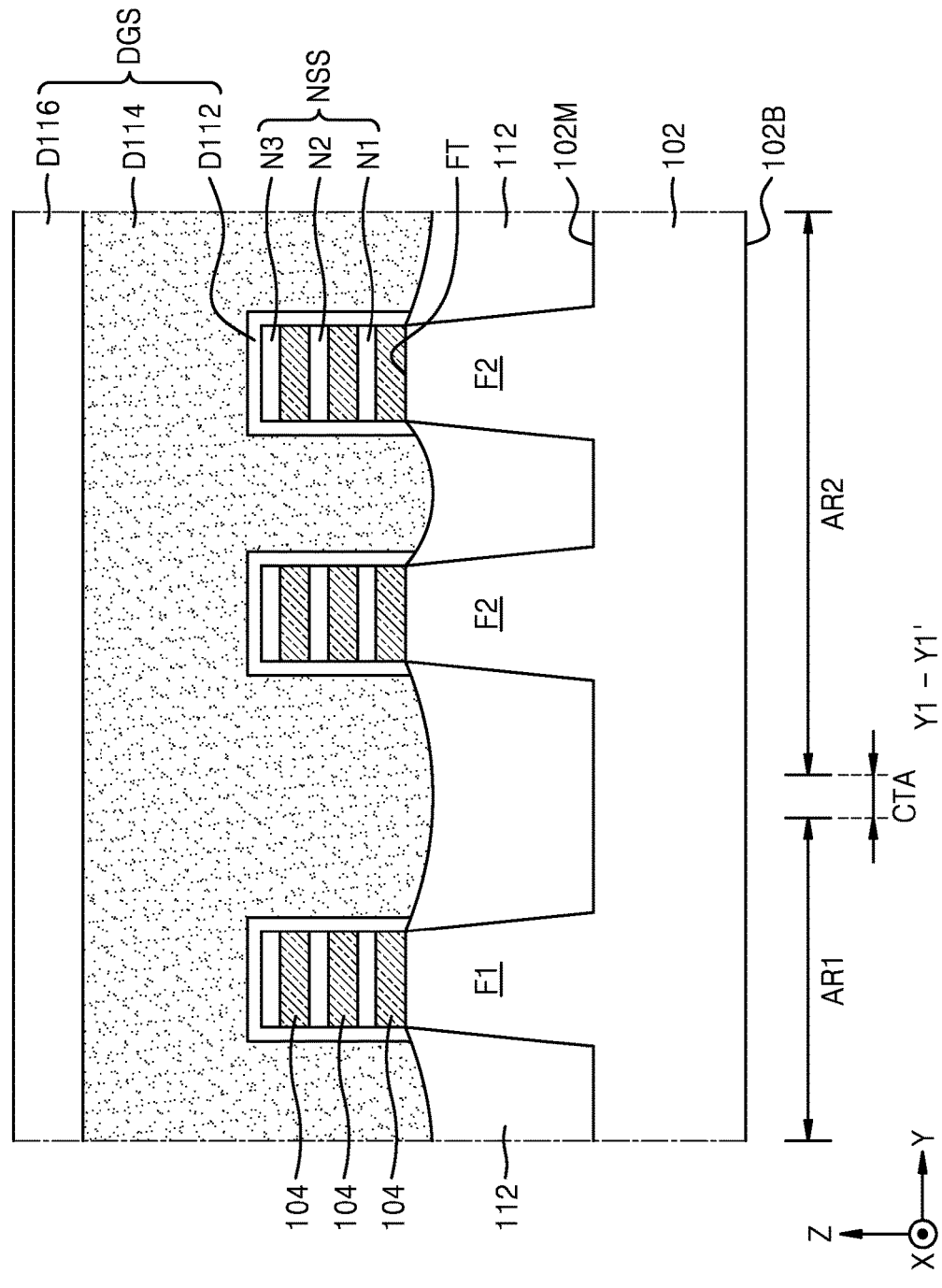
Figure 10C:
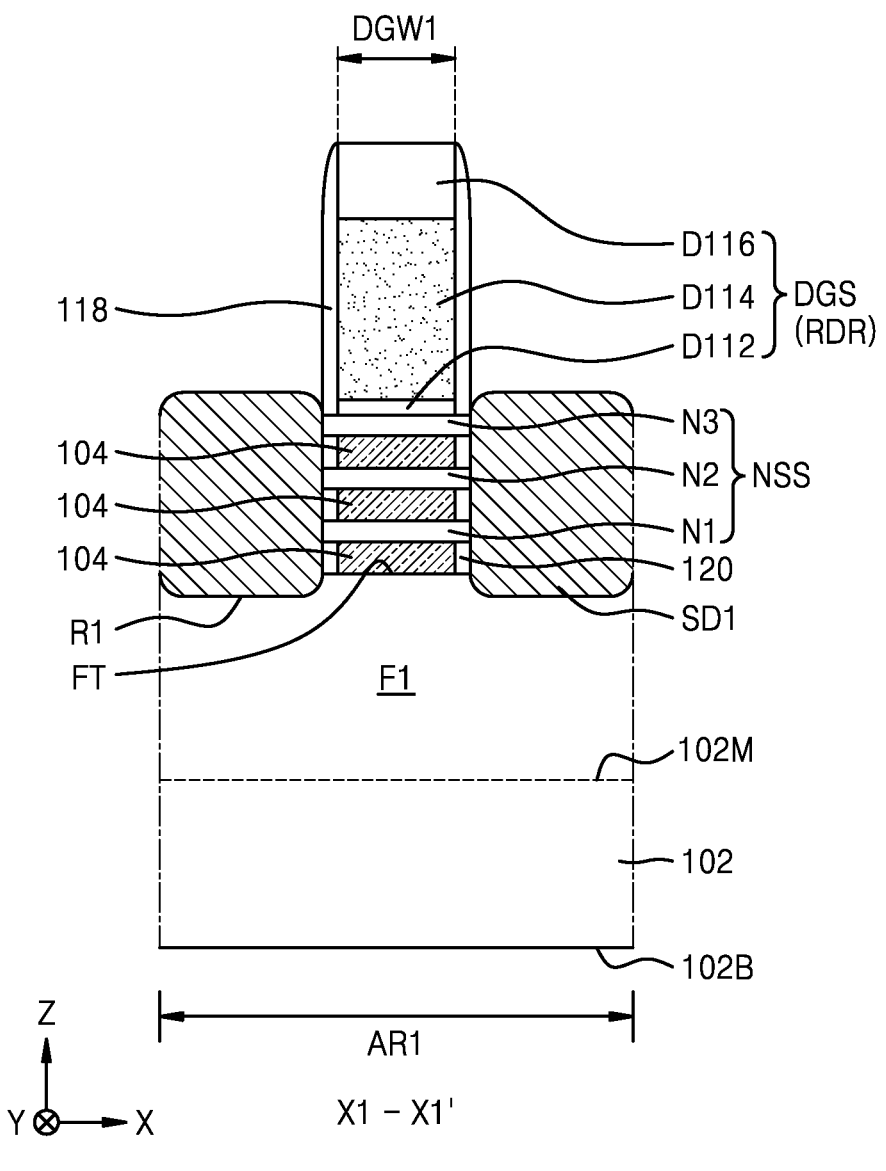

As shown in FIG. 10C, in the first device region AR1, respective portions of the plurality of sacrificial semiconductor layers 104 and the plurality of nanosheet semiconductor layers NS may be removed by using the dummy gate structure DGS and the outer insulating spacers 118 as etch masks. Thus, a plurality of nanosheet stacks NSS may be formed from the plurality of nanosheet semiconductor layers NS. Each of the plurality of nanosheet stacks NSS may include first to third nanosheets N1, N2, and N3. In the first device region AR1, a partial region of the first fin-type active region F1 exposed between every two adjacent ones of the plurality of nanosheet stacks NSS may be etched, and thus, a plurality of first recesses R1 may be formed in an upper portion of the first fin-type active region F1. To form the plurality of first recesses R1, the first fin-type active region F1 may be etched by using a dry process, a wet process, or a combination thereof.

Thereafter, in the first device region AR1, portions of the plurality of sacrificial semiconductor layers 104 exposed on both sides of the nanosheet stack NSS may be selectively removed through the plurality of first recesses R1, and thus, a plurality of indent regions may be formed between respective adjacent ones of the first to third nanosheets N1, N2, and N3 and between the first nanosheet N1 and the first fin-type active region F1. Afterwards, a plurality of inner insulating spacers 120 may be formed to fill the plurality of indent regions. To form the plurality of indent regions, portions of the plurality of sacrificial semiconductor layers 104 may be selectively etched by using differences in etch selectivity between the plurality of sacrificial semiconductor layers 104 and the first to third nanosheets N1, N2, and N3. The plurality of inner insulating spacers 120 may be formed by using an atomic layer deposition (ALD) process, a chemical vapor deposition (CVD) process, an oxidation process, or a combination thereof.

Thereafter, a plurality of first source/drain regions SD1 may be formed on the first fin-type active region F1 on both sides of each of the plurality of nanosheet stacks NSS. To form the plurality of first source/drain regions SD1, a semiconductor material may be epitaxially grown from a surface of the first fin-type active region F1, which is exposed at a bottom surface of each of the plurality of first recesses R1, and a sidewall of each of the first to third nanosheets N1, N2, and N3. In some example embodiments, to form the plurality of first source/drain regions SD1, a low-pressure chemical vapor deposition (LPCVD) process, a selective epitaxial growth (SEG) process, or a cyclic deposition and etching (CDE) process may be performed by using source materials including an elemental semiconductor precursor. In some example embodiments, each of the plurality of first source/drain regions SD1 may include a Si layer doped with an n-type dopant. To form the plurality of first source/drain regions SD1, silane ($SiH_4$), disilane ($Si_2H_6$), trisilane ($Si_3H_8$), and/or dichlorosilane ($SiH_2Cl_2$) may be used as the Si source. The n-type dopant may be selected from phosphorus (P), arsenic (As), and antimony (Sb).

Figure 10D:
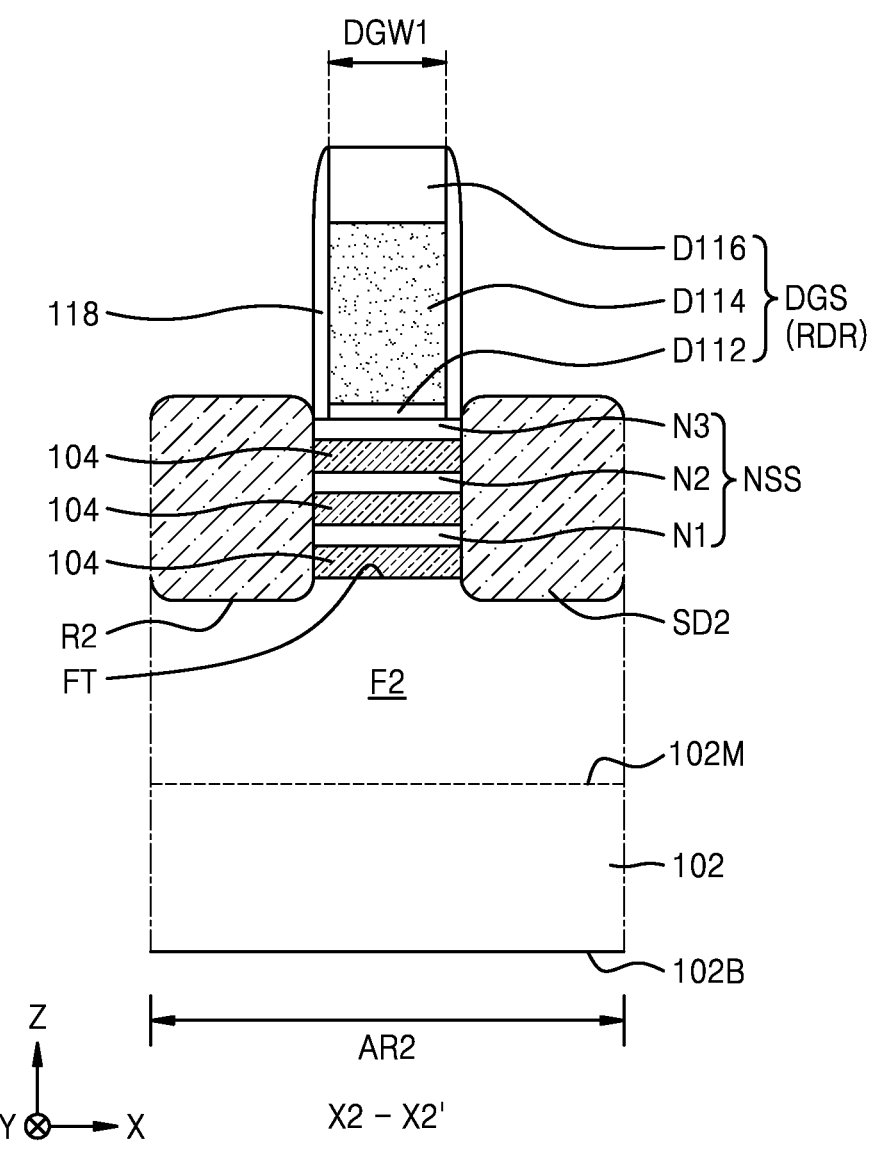
Figure 10E:
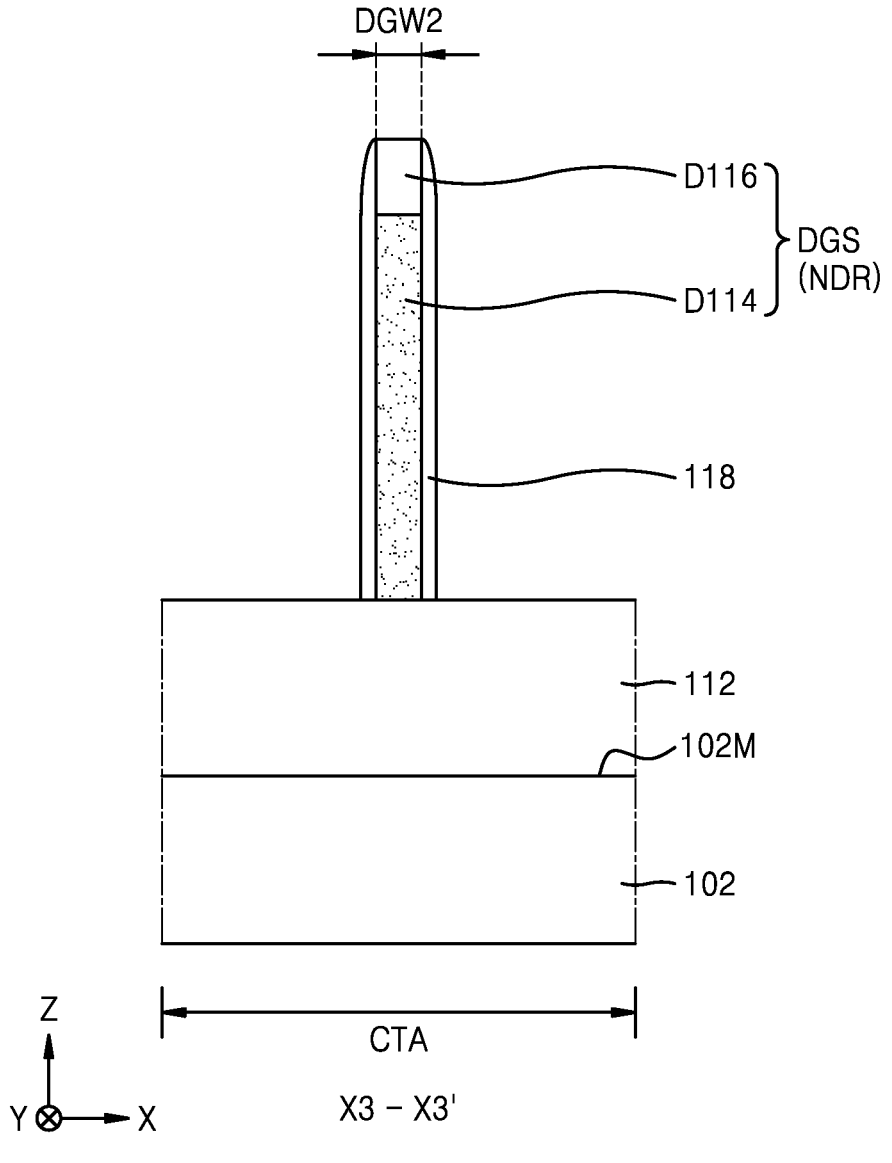
FIGS. 10E, 11D, and 12C are cross-sectional views of some components in a portion corresponding to a cross-section taken along line X3-X3' of FIG. 1A, according to a process sequence.
Figure 10F:
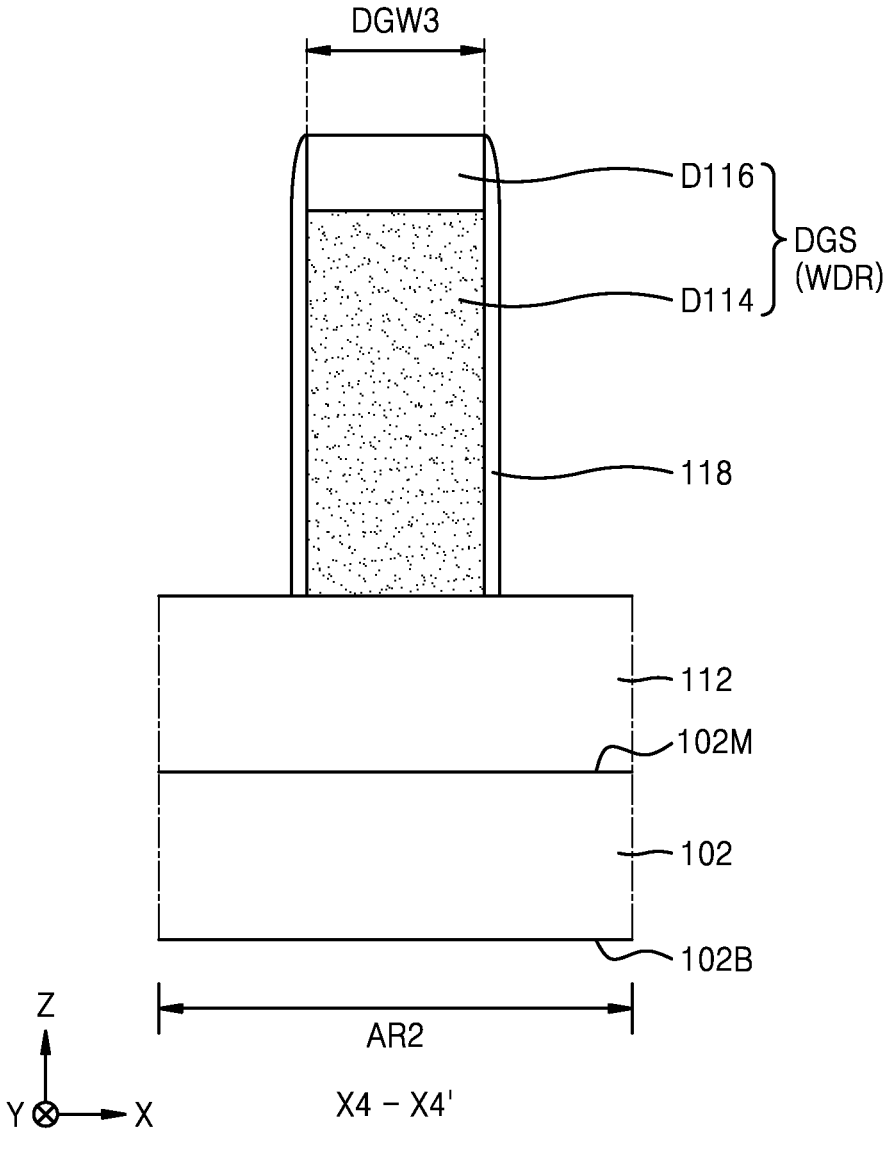
Figure 11A:
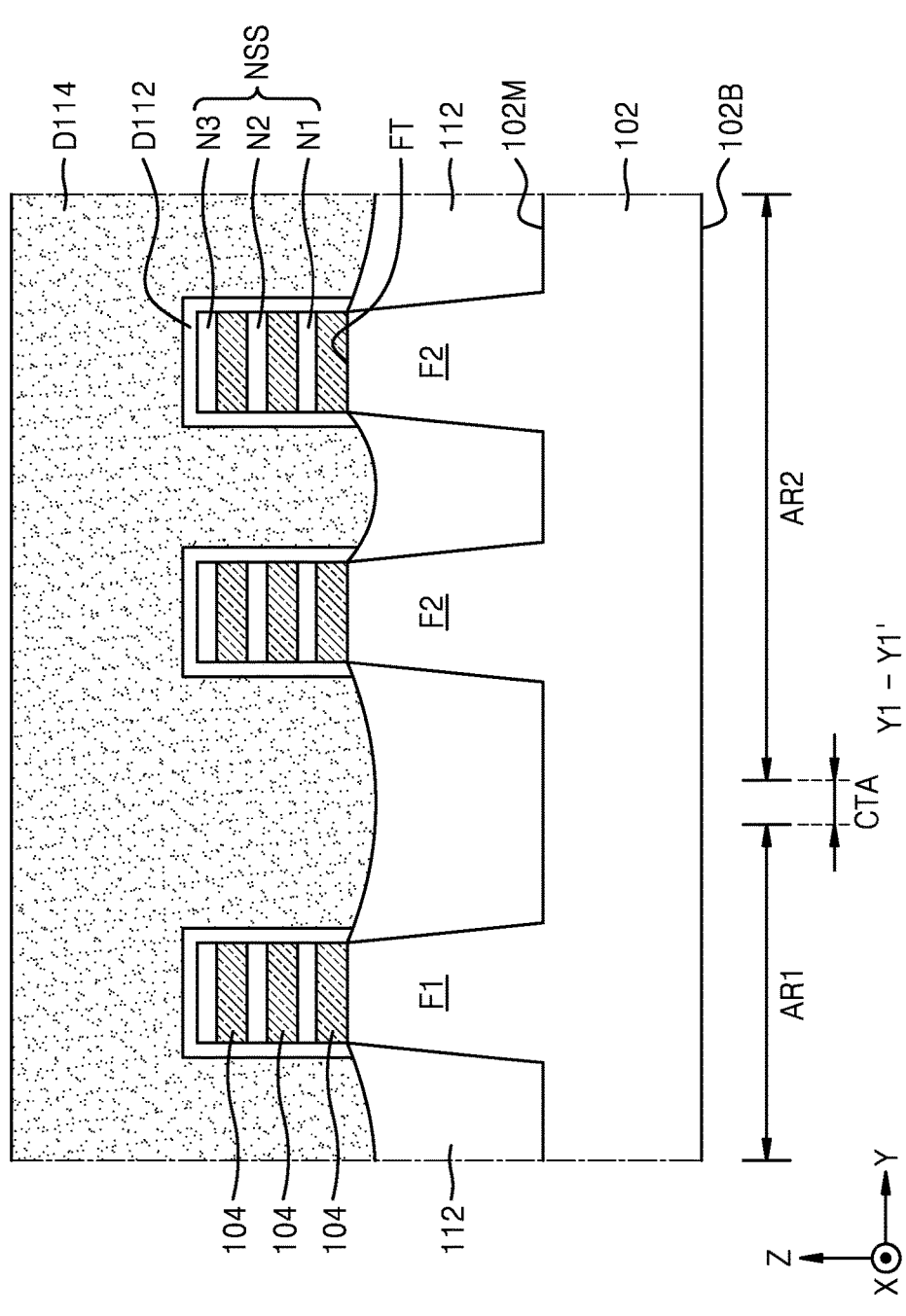
Figure 11B:
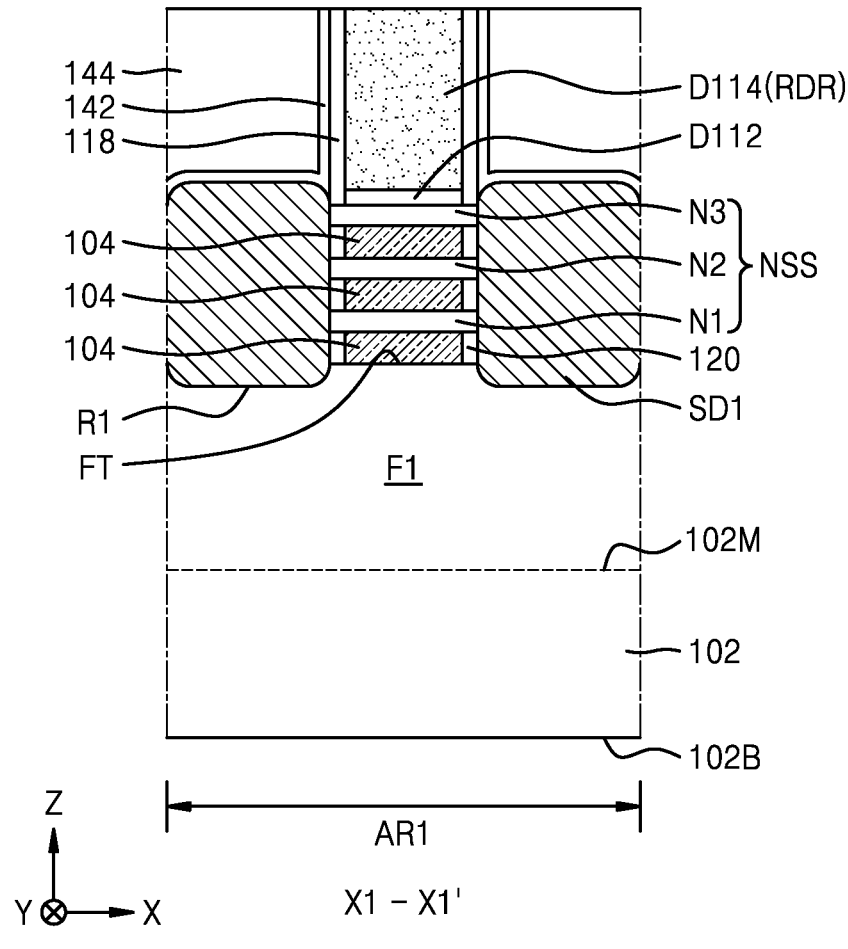
Figure 11C:
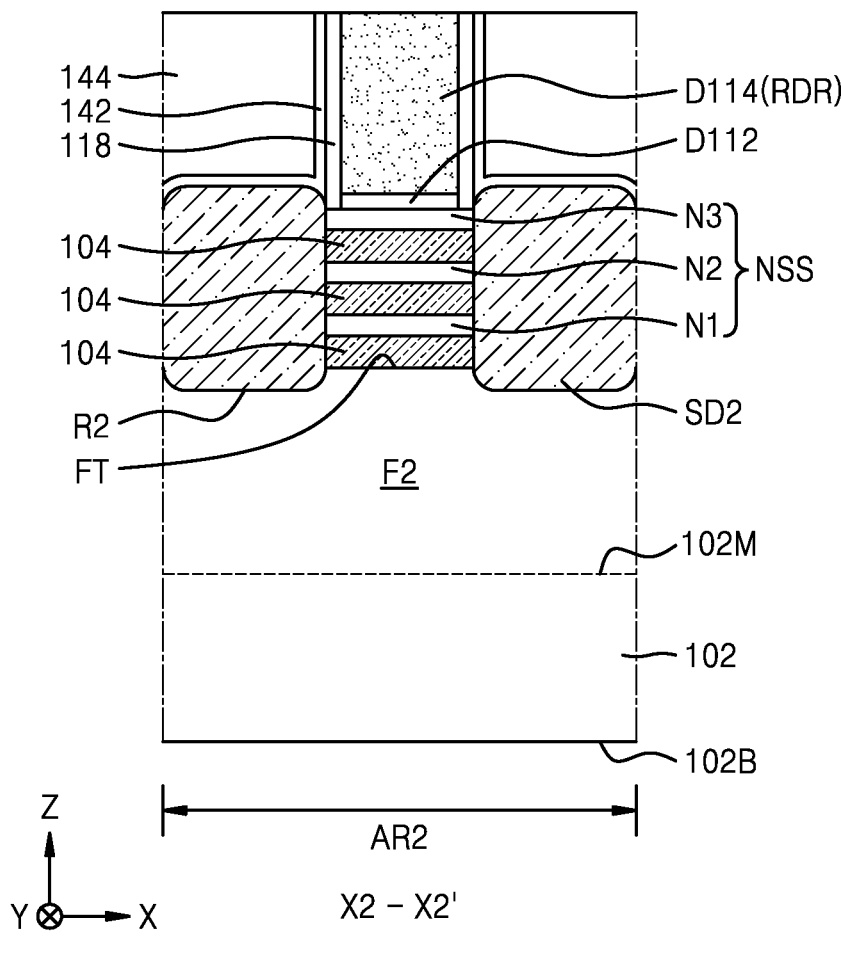
Figure 11D:
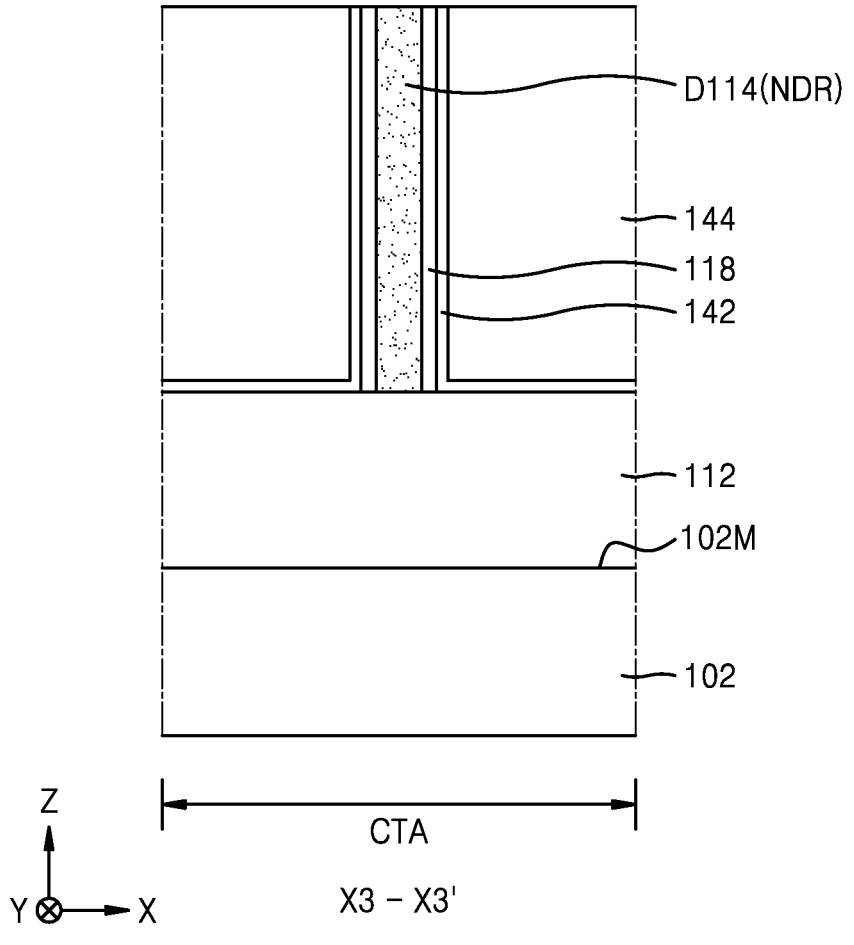
Figure 11E:
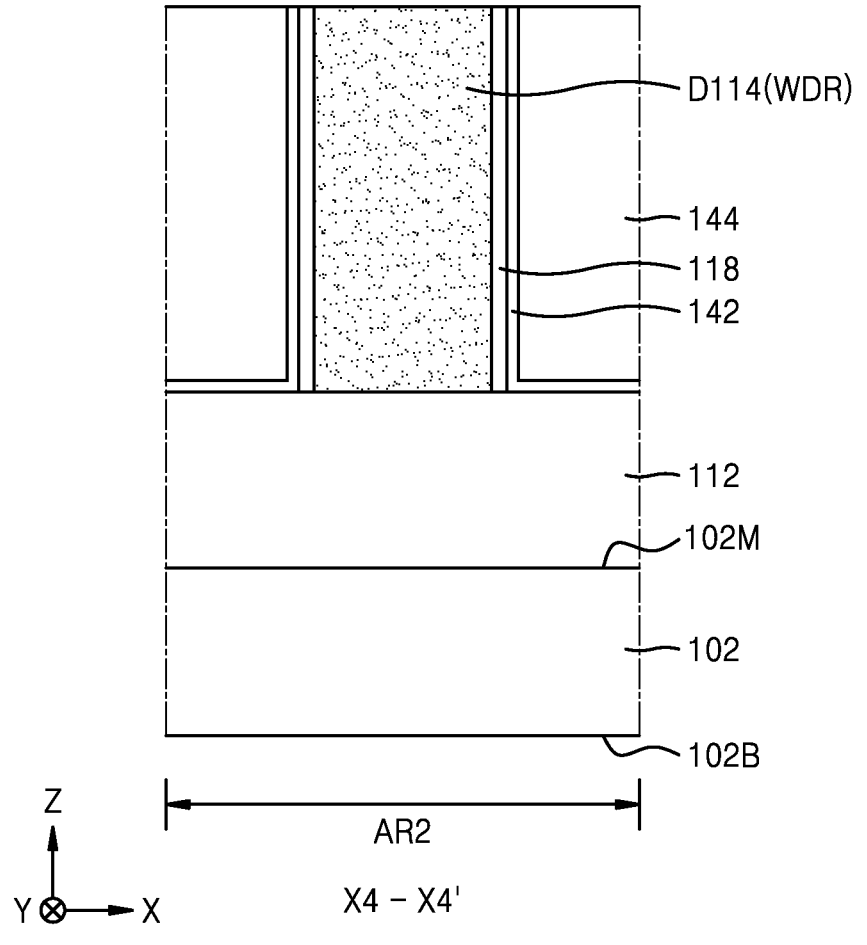

As shown in FIG. 10D, in the second device region AR2, respective portions of the plurality of sacrificial semiconductor layers 104 and the plurality of nanosheet semiconductor layers NS may be removed by using the dummy gate structure DGS and the outer insulating spacers 118 as etch masks. Thus, a plurality of nanosheet stacks NSS may be formed from the plurality of nanosheet semiconductor layers NS in the second device region AR2. Each of the plurality of nanosheet stacks NSS may include first to third nanosheets N1, N2, and N3.

In the second device region AR2, the second fin-type active region F2 exposed between two adjacent ones of the plurality of nanosheet stacks NSS may be etched, and thus, a plurality of second recesses R2 may be formed in an upper portion of the second fin-type active region F2. Thereafter, a plurality of second source/drain regions SD2 may be formed on the second fin-type active region F2 on both sides of the nanosheet stack NSS. Similar to the above-described process of forming the plurality of first source/drain regions SD1, to form the plurality of second source/drain regions SD2, a semiconductor material may be epitaxially grown from a surface of the second fin-type active region F2, which is exposed at a bottom surface of each of the plurality of second recesses R2, and the sidewall of each of the first to third nanosheets N1, N2, and N3. In some example embodiments, each of the plurality of second source/drain regions SD2 may include a SiGe layer doped with a p-type dopant. To form the plurality of second source/drain regions SD2, a silicon (Si) source and a germanium (Ge) source may be used. Silane ($SiH_4$), disilane ($Si_2H_6$), trisilane ($Si_3H_8$), and/or dichlorosilane ($SiH_2Cl_2$) may be used as the Si source. Germane ($GeH_4$), digermane ($Ge_2H_6$), trigermane ($Ge_3H_8$), tetragermane ($Ge_4H_{10}$), and/or dichlorogermane ($Ge_2H_2Cl_2$)

may be used as the Ge source. The p-type dopant may be selected from boron (B) and gallium (Ga).

The process of forming the plurality of first source/drain regions SD1 in the first device region AR1 as shown in FIG. 10C and the process of forming the plurality of second source/drain regions SD2 in the second device region AR2 as shown in FIG. 10D may be performed in an arbitrary order.

In each of the plurality of dummy gate structures DGS, a width of each of the dummy gate layer D114 and the capping layer D116 in the first lateral direction (X direction) may vary in the second lateral direction (Y direction). FIG. 10A illustrates planar structures of a plurality of dummy gate layers D114 of the plurality of dummy gate structures DGS.

Each of the plurality of dummy gate structures DGS may include a first local region RDR, a second local region WDR, and a third local region NDR. The first local region RDR may overlap the fin-type active regions (e.g., F1 and F2) in the vertical direction (Z direction). The second local region WDR may overlap the device isolation film 112 in the vertical direction (Z direction) in each of the first device region AR1 and the second device region AR2. The third local region NDR may be on the device isolation film 112 in a gate isolation area CTA between the first device region AR1 and the second device region AR2 and a region adjacent to the gate isolation area CTA. In each of the plurality of dummy gate structures DGS, a width DGW2 of the third local region NDR in the first lateral direction (X direction) may be less than a width DGW1 of the first local region RDR in the first lateral direction (X direction) in each of the plurality of dummy gate structures DGS. In each of the plurality of dummy gate structures DGS, a width DGW3 of the second local region WDR in the first lateral direction (X direction) may be greater than the width DGW1 of the first local region RDR in the first lateral direction (X direction) in each of the plurality of dummy gate structures DGS.

The width DGW2 of each of the dummy gate layer D114 and the capping layer D116 in the first lateral direction (X direction) in the third local region NDR may be less than the width DGW1 of each of the dummy gate layer D114 and the capping layer D116 in the first lateral direction (X direction) in the first local region RDR. The width WDR of each of the dummy gate layer D114 and the capping layer D116 in the first lateral direction (X direction) in the second local region WDR may be greater than the width DGW1 of each of the dummy gate layer D114 and the capping layer D116 in the first lateral direction (X direction) in the first local region RDR.

Referring to FIGS. 11A to 11E, in the resultant structure of FIGS. 10A to 10F, an insulating liner 142 may be formed to cover a surface of each of the first and second source/drain regions SD1 and SD2, a surface of each of the plurality of outer insulating spacers 118, and an exposed surface of the device isolation film 112, and an inter-gate dielectric film 144 may be formed on the insulating liner 142. Thereafter, the capping layer D116 may be removed, and the plurality of outer insulating spacers 118, the insulating liner 142, and the inter-gate dielectric film 144 may be planarized to expose a top surface of the dummy gate layer D114.

Figure 12A:
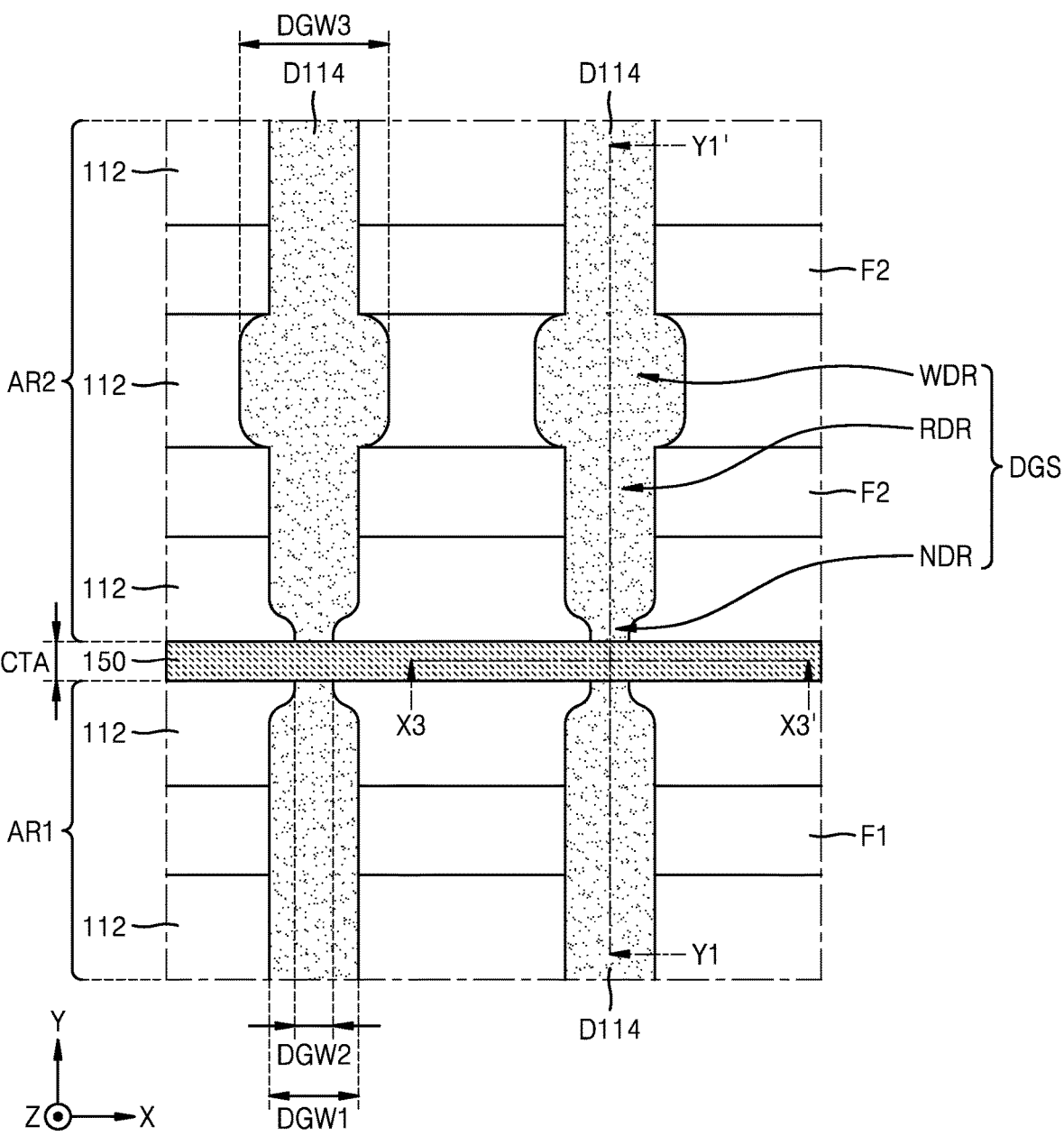
Figure 12B:
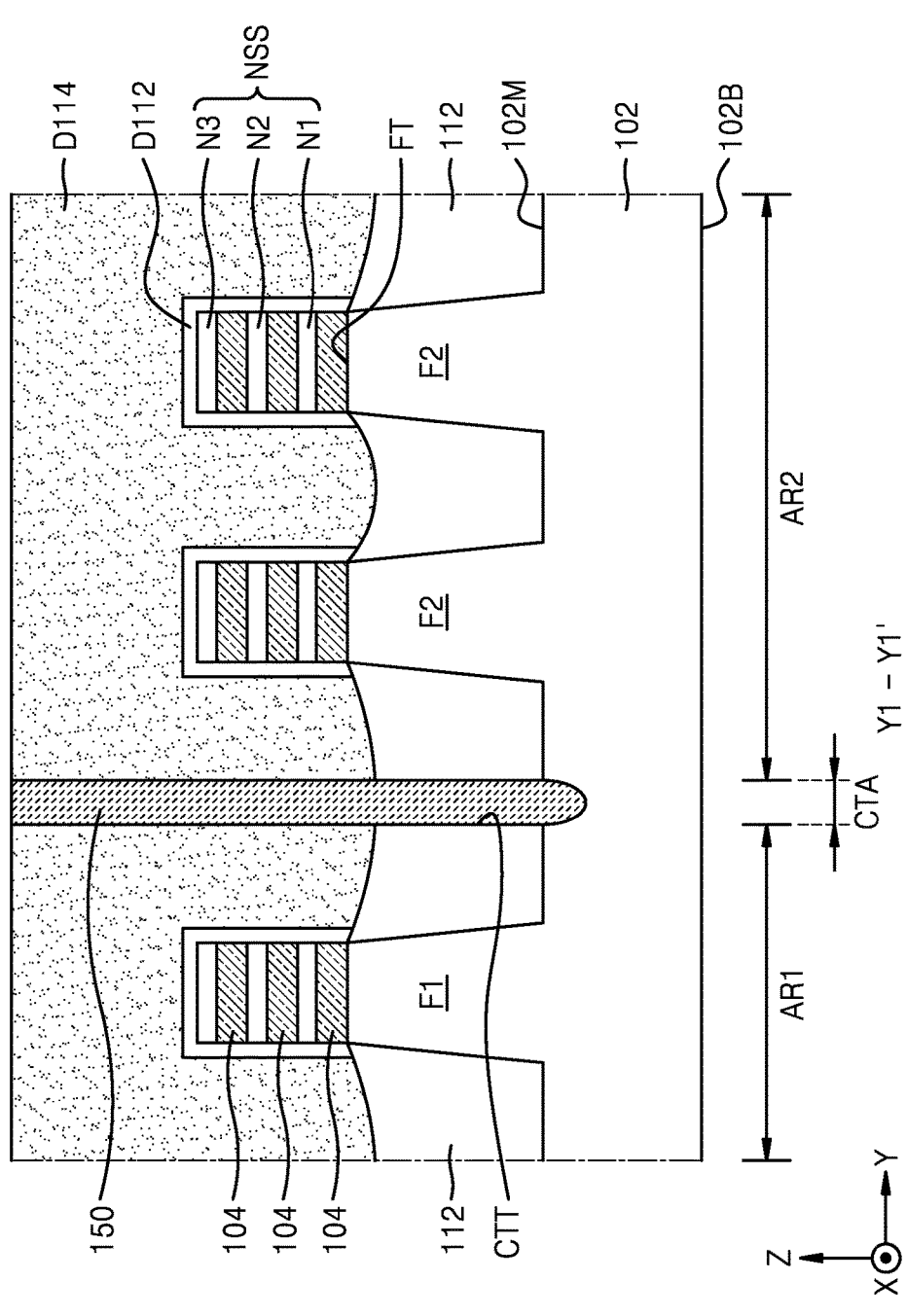
Figure 12C:
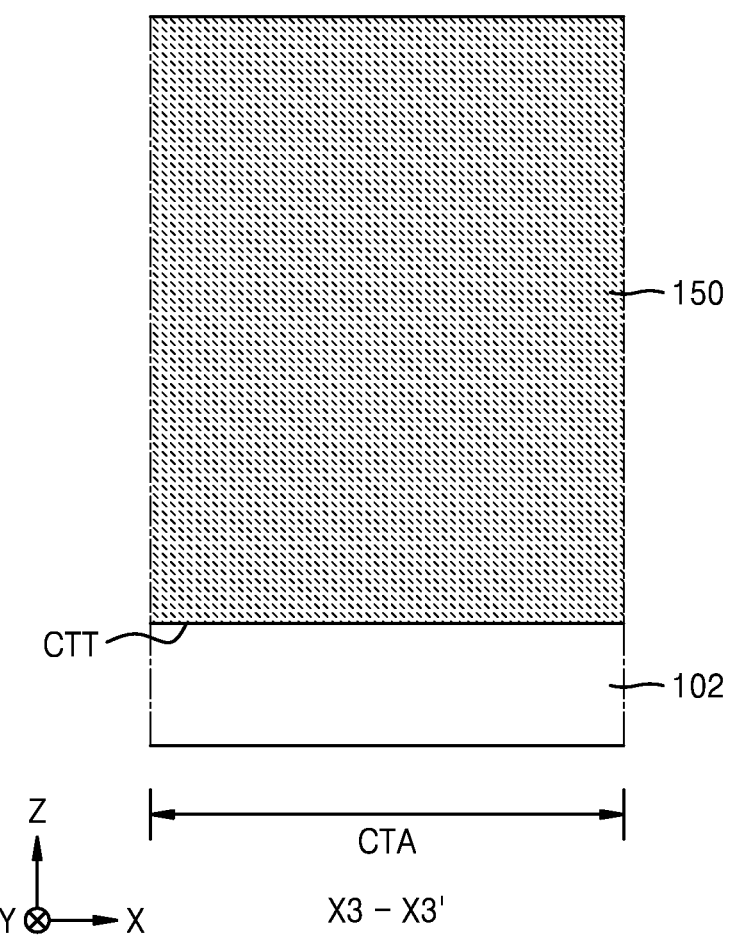

Referring to FIGS. 12A, 12B, and 12C, in the resultant structure of FIGS. 11A to 11E, a mask pattern (not shown) covering portions other than the gate isolation area CTA may be formed. Thereafter, a portion of the dummy gate layer D114 exposed in the gate isolation area CTA, a portion of each of the plurality of outer insulating spacers 118, a portion of the insulating liner 142, and a portion of the inter-gate dielectric film 144 may be etched by using the mask pattern as an etch mask to expose the device isolation film 112. The device isolation film 112, which is exposed, may be etched to expose the substrate 102, and a portion of the substrate 102, which is exposed, may be etched to form an isolation trench CTT. Thereafter, the isolation trench CTT may be filled with an insulating material, and the resultant structure may be planarized to expose the top surface of the dummy gate layer D114. Thus, a gate cut insulating pattern 150 may be formed inside the isolation trench CTT. After the gate cut insulating pattern 150 is formed, a top surface of the gate cut insulating pattern 150 may be coplanar with the top surface of the dummy gate layer D114.

Of the dummy gate layer D114, the third local region NDR including a portion to be removed in the gate isolation area CTA may has the width DGW2, which is less than a width of another portion of the dummy gate layer D114 in the first lateral direction (X direction). Accordingly, while the dummy gate layer D114 exposed in the gate isolation area CTA and insulating films located adjacent thereto are being etched to form the isolation trench CTT, the dummy gate layer D114 may be sufficiently removed without undesirably remaining in the gate isolation area CTA. Therefore, various problems that may be caused by the undesired remaining portion of the dummy gate layer D114 may be mitigated or prevented in the gate isolation area CTA.

Referring to FIGS. 13A to 13D, in the resultant structures of FIGS. 12A, 12B, and 12C, a plurality of gate spaces GS may be prepared by removing the dummy gate layer D114, which is exposed, and the oxide film D112 disposed thereunder, and the plurality of nanosheet stacks NSS may be exposed through the plurality of gate spaces GS. Afterwards, the plurality of sacrificial semiconductor layers 104 remaining on the resultant structure may be removed through the gate space GS, and thus, the gate space GS may extend to respective spaces between the first to third nanosheets N1, N2, and N3 and a space between the first nanosheet N1 and the fin top surface FT.

Figure 13A:
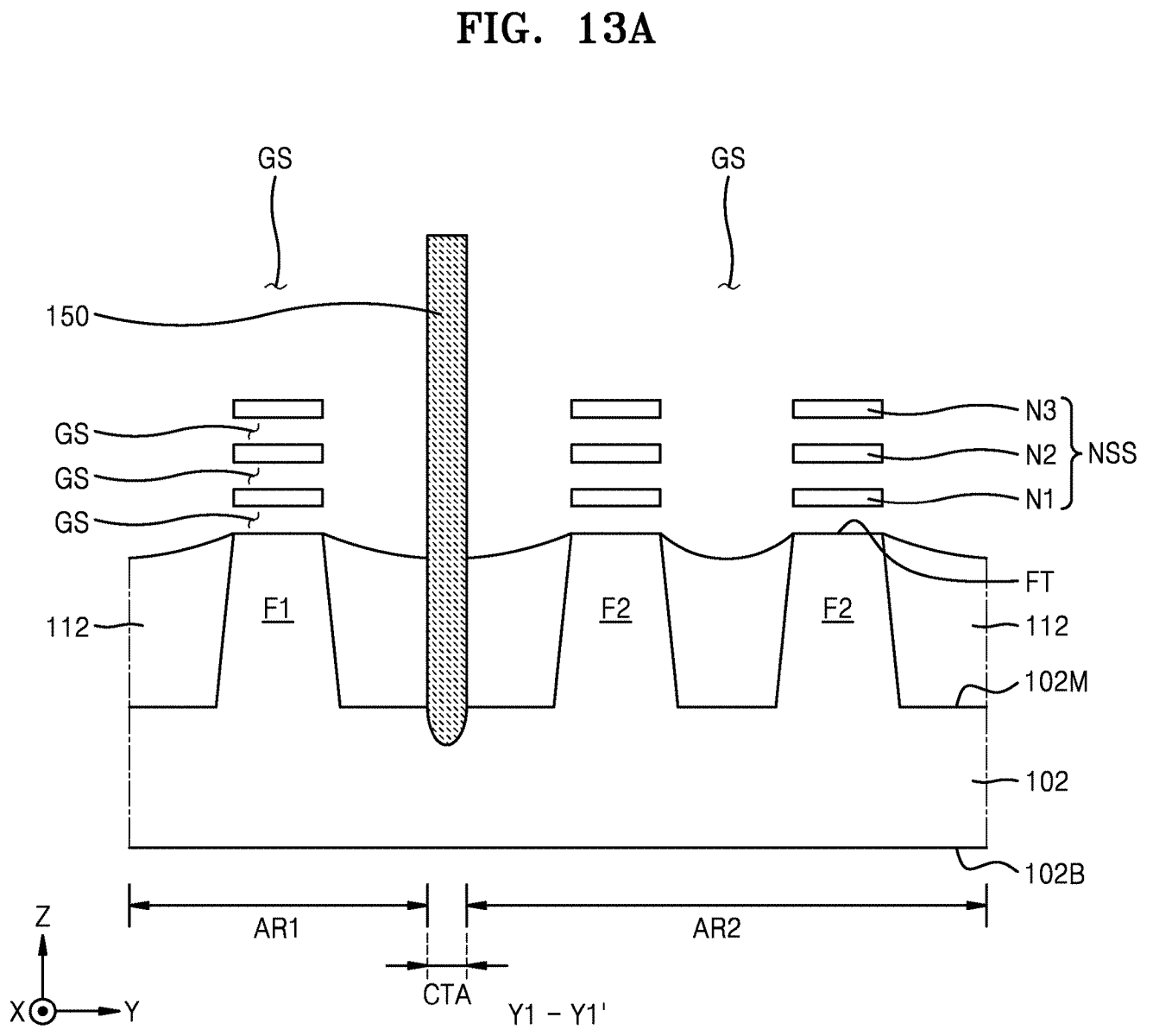
Figure 13B:
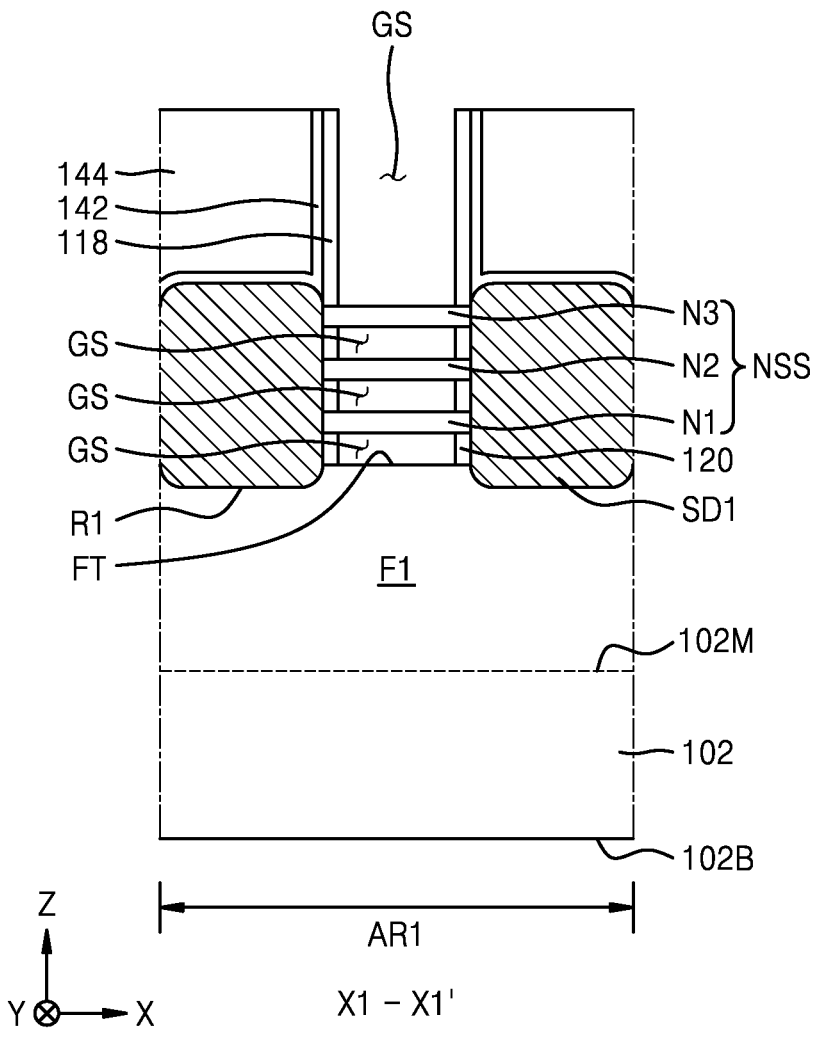
Figure 13C:
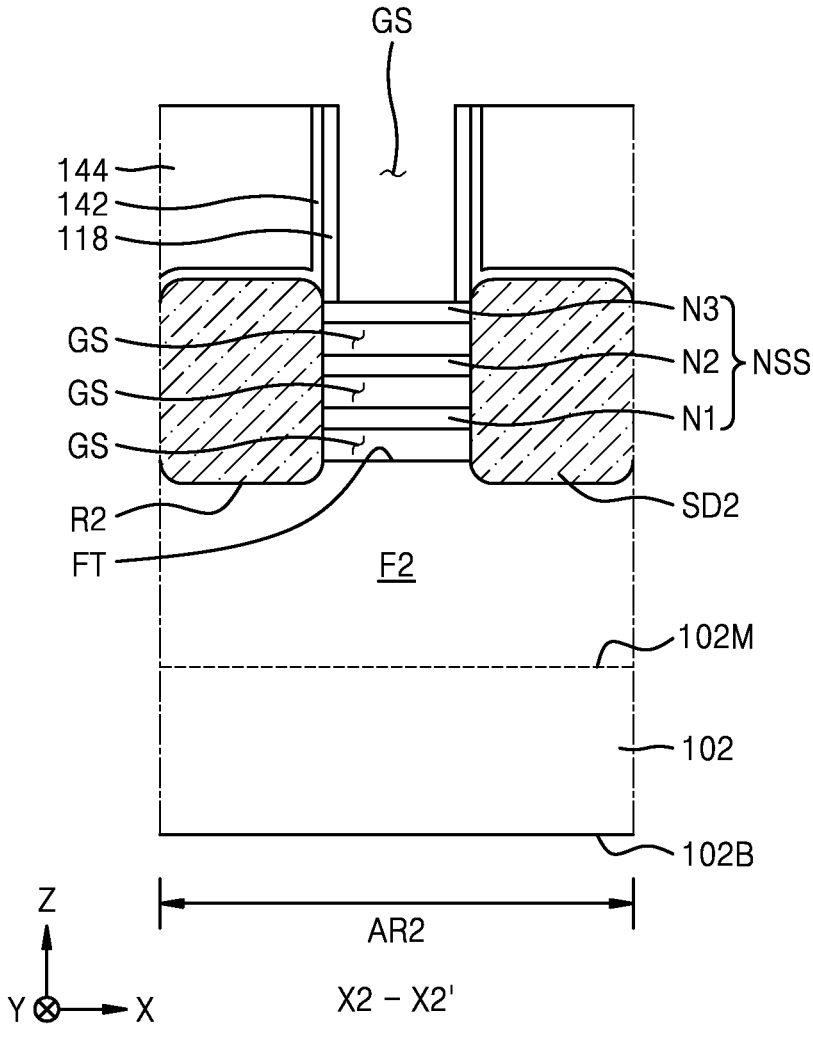
Figure 13D:
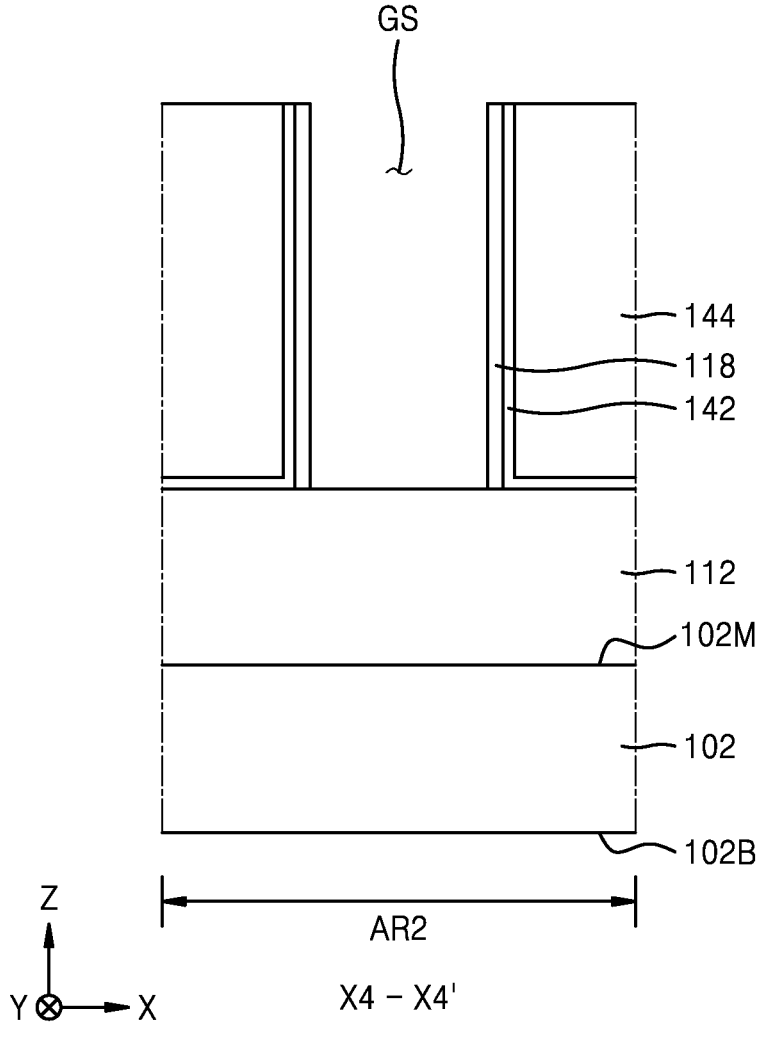

As shown in FIG. 13D, of the gate space GS, a region in which the dummy gate layer (refer to D114 in FIGS. 12A, 12B, and 12C) constituting the second local region WDR of the dummy gate structure DGS was located may have a greater width than other regions of the gate space GS in the first lateral direction (X direction). Thus, while the plurality of sacrificial semiconductor layers 104 are being removed through the gate space GS, an etchant or an etch gas may be supplied to the plurality of sacrificial semiconductor layers 104 through the gate space GS having a relatively great width, which is adjacent to the plurality of sacrificial semiconductor layers 104. Accordingly, a sufficient amount of etchant or etch gas to remove the plurality of sacrificial semiconductor layers 104 may be supplied through the gate space GS, and the sacrificial semiconductor layers 104, which are between respective adjacent ones of the first to third nanosheets N1, N2, and N3 of the nanosheet stack NSS and fill relatively narrow regions adjacent thereto, may be smoothly removed.

In some example embodiments, to selectively remove the plurality of sacrificial semiconductor layers 104, the first to third nanosheets N1, N2, and N3 may have an etch selectivity with respect to the plurality of sacrificial semiconductor layers 104. A liquid or gaseous etchant may be used to selectively remove the plurality of sacrificial semiconductor layers 104. In some example embodiments, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Referring to FIGS. 14A to 14D, a gate dielectric film 152 may be formed to conformally cover exposed surfaces in the resultant structure of FIGS. 13A to 13D. The gate dielectric film 152 may include a portion covering exposed surfaces of each of the first to third nanosheets N1, N2, and N3, a portion covering exposed surfaces of each of the plurality of fin-type active regions (e.g., F1 and F2), a portion covering exposed surfaces of the gate cut insulating pattern 150, a portion covering exposed surfaces of each of the plurality of outer insulating spacers 118, and portions covering exposed surfaces of the device isolation film 112. The gate dielectric film 152 may be formed by using an ALD process.

Figure 14A:
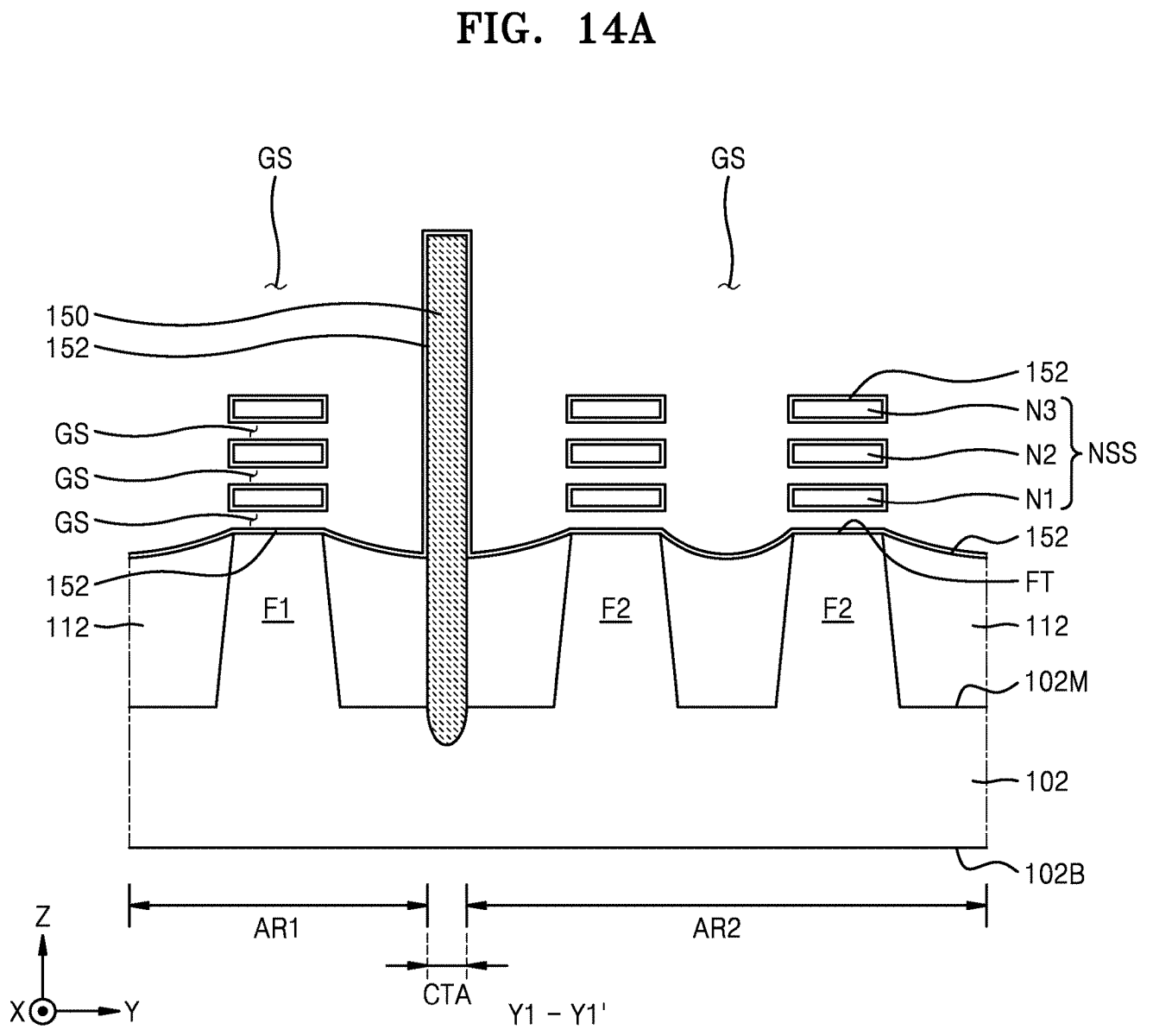
Figure 14B:
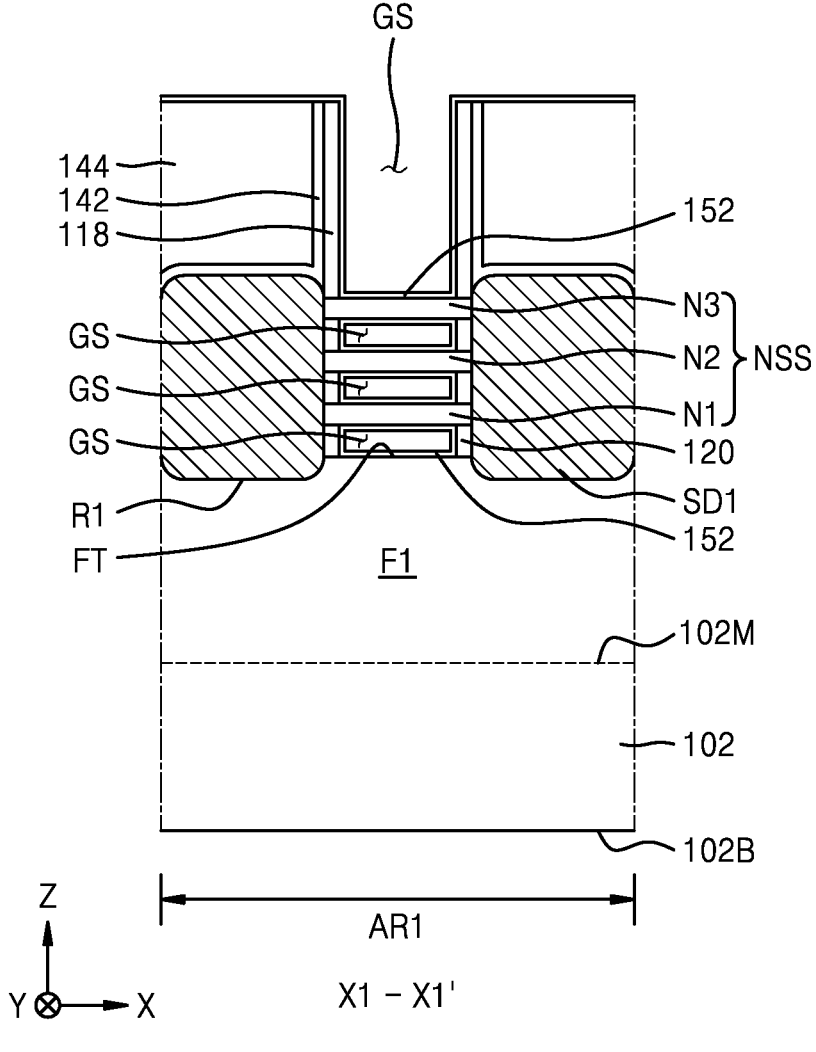
Figure 14C:
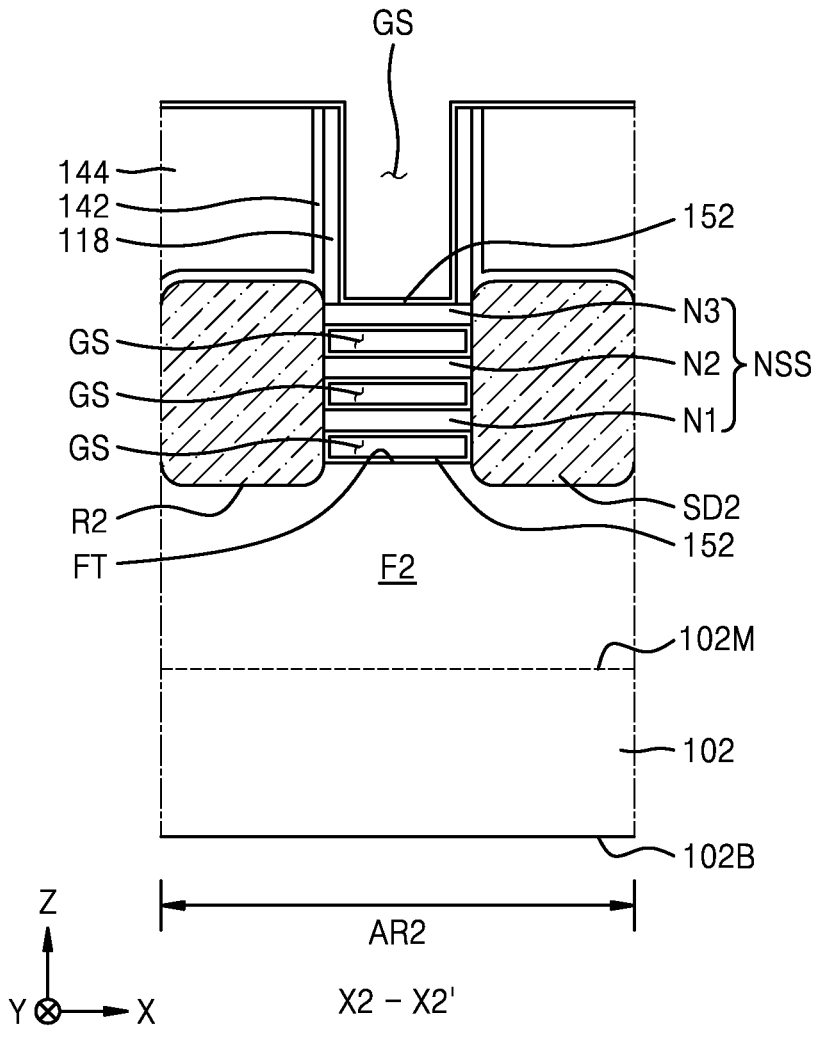
Figure 14D:
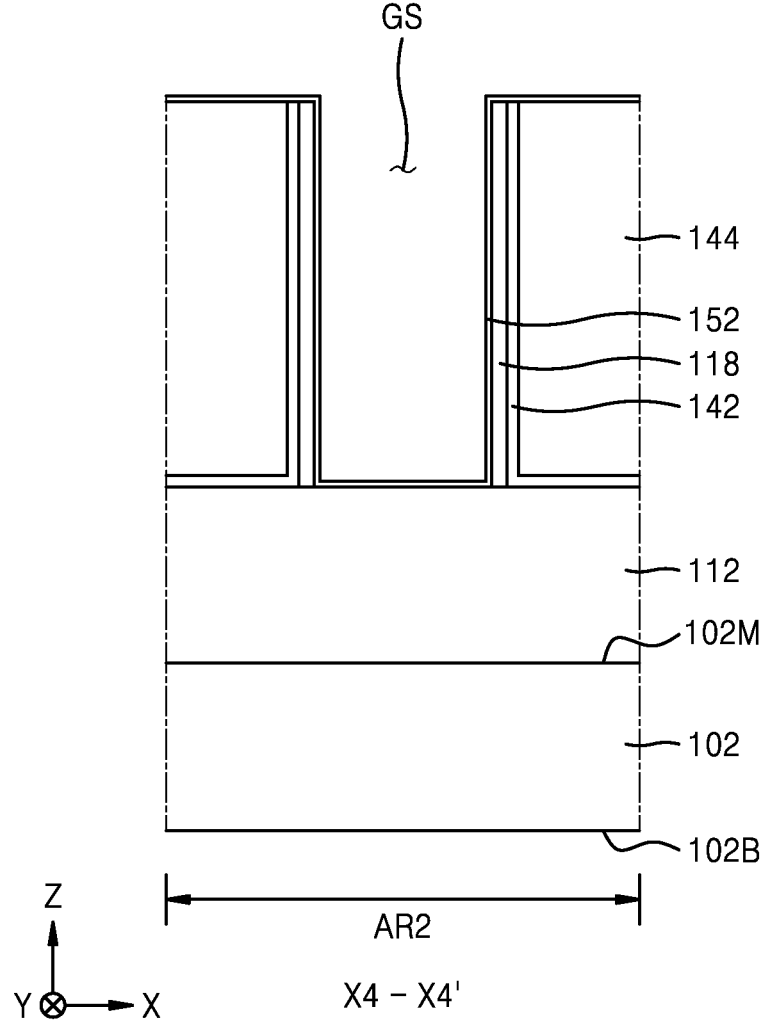
Figure 15A:
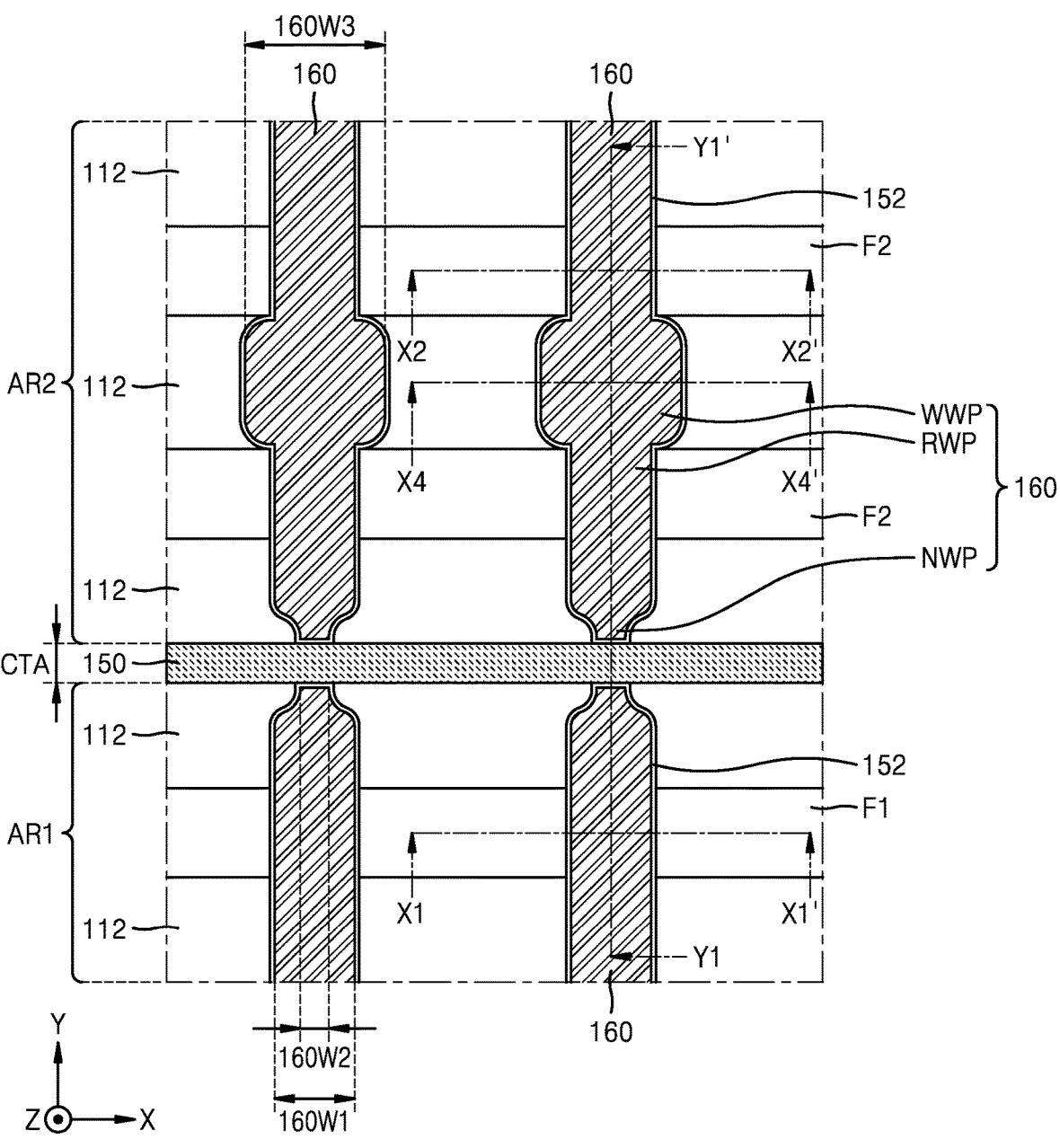
Figure 15B:
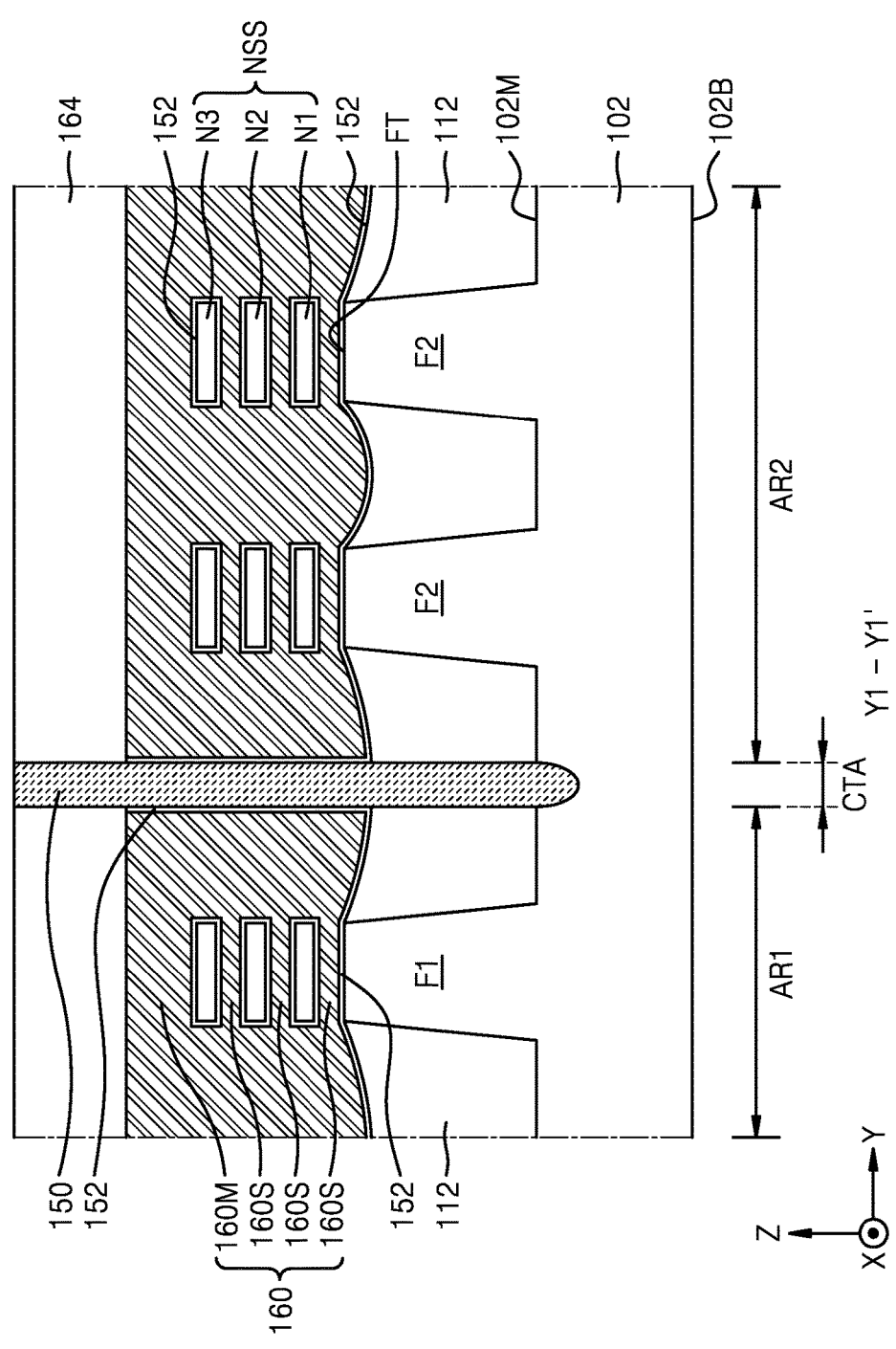
Figure 15C:
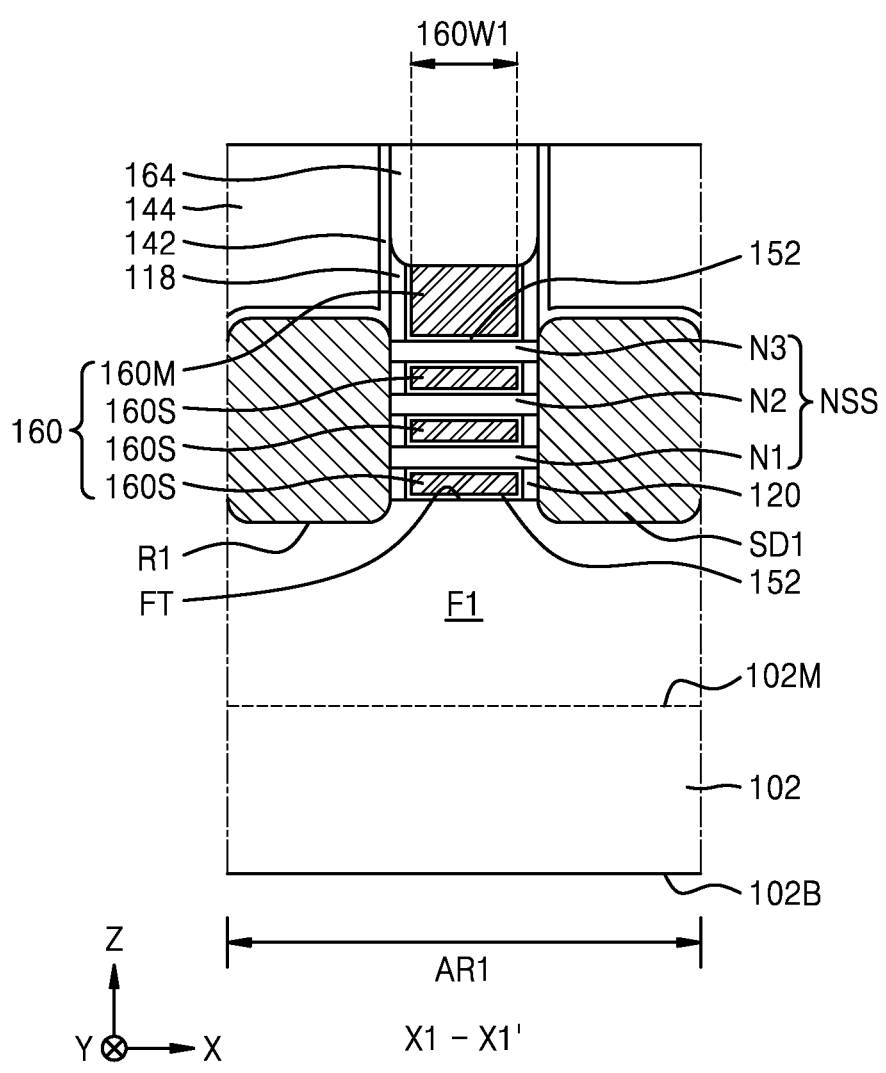
Figure 15D:
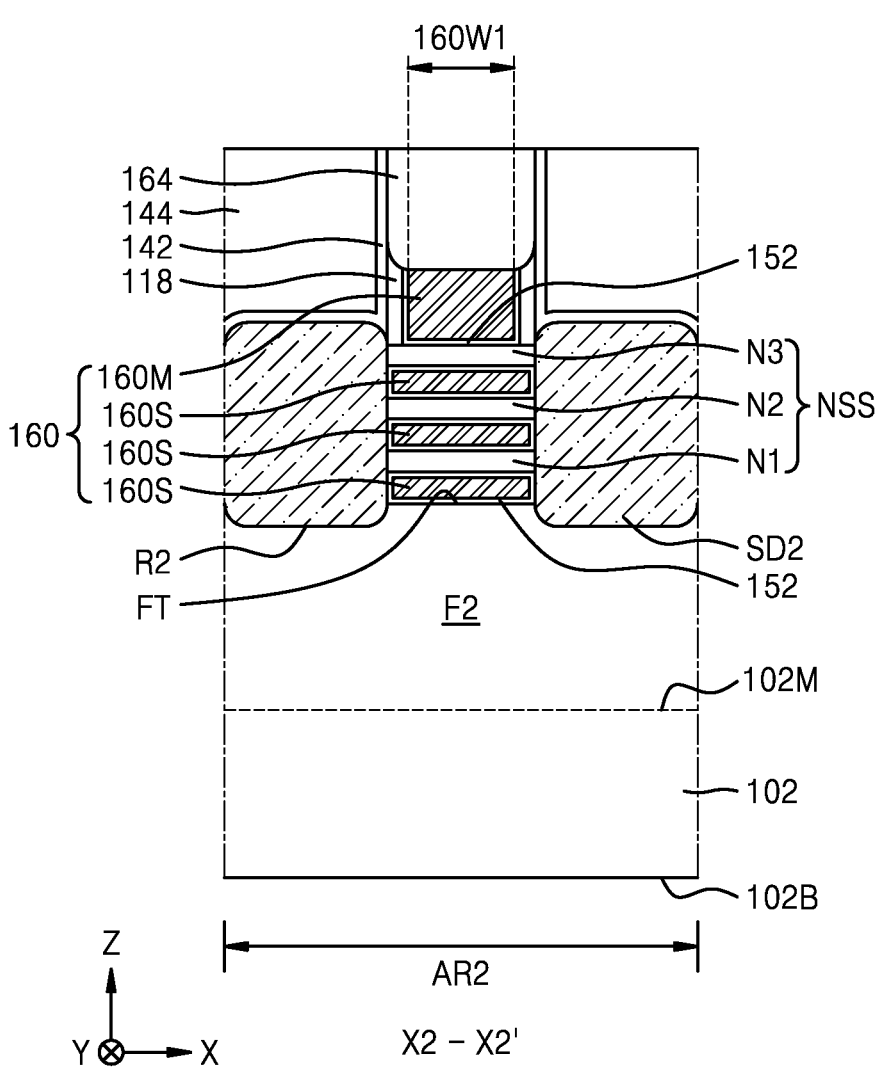
Figure 15E:
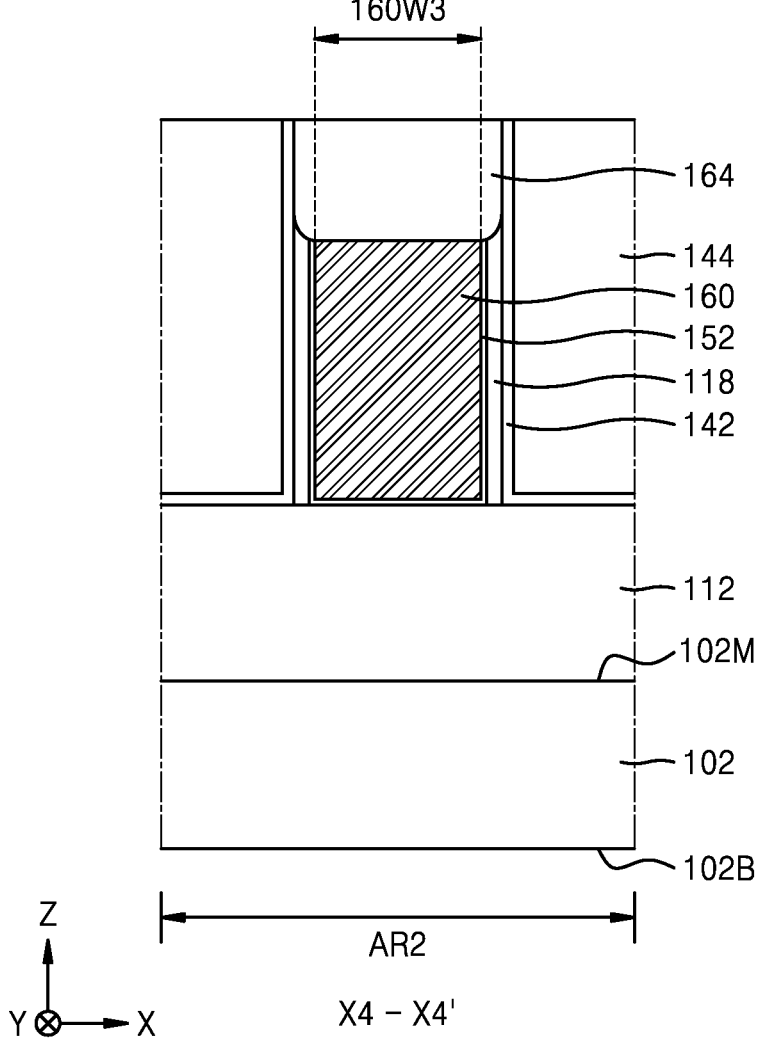

As shown in FIG. 14D, of the gate space GS, a region in which the dummy gate layer (refer to D114 in FIGS. 12A, 12B, and 12C) constituting the second local region WDR of the dummy gate structure DGS was located may have a greater width than other regions of the gate space GS in the first lateral direction (X direction). Thus, while reactants for forming the gate dielectric film 152 are being supplied through the gate space GS, the reactants may be supplied through the gate space GS having a relatively great width. Accordingly, sufficient amounts of reactants required to form the gate dielectric film 152 may be supplied through the gate space GS, and the gate dielectric film 152 of a desired shape may be formed between respective adjacent ones of the first to third nanosheets N1, N2, and N3 included in the nanosheet stack NSS and also in the relatively narrow regions adjacent thereto.

Referring to FIGS. 15A to 15E, a gate line 160 filling the plurality of gate spaces (refer to GS in FIGS. 14A to 14D) may be formed on the gate dielectric film 152. A portion of each of the gate dielectric film 152 and the gate line 160 may be removed to empty a portion of each of the plurality of gate spaces (refer to GS in FIGS. 14A to 14D) again. In this case, a portion of each of the plurality of outer insulating spacers 118 exposed in the gate space GS that is emptied again may be removed together. Thereafter, a capping insulating pattern 164 may be formed to cover a top surface of each of the gate dielectric film 152, the gate line 160, and the outer insulating spacers 118.

The resultant structure including the capping insulating pattern 164 may be planarized such that the top surface of the gate cut insulating pattern 150 is coplanar with a top surface of the capping insulating pattern 164. After the capping insulating pattern 164 is formed, a top surface of the gate cut insulating pattern 150 may be exposed. The capping insulating pattern 164 may include a portion in contact with upper sidewalls of the gate cut insulating pattern 150.

During the formation of the gate line 160, as shown in FIG. 14D, reactants desired to form the gate line 160 may be supplied through the gate space GS having a relatively great width in which the dummy gate layer (refer to D114 in FIGS. 12A, 12B, and 12C) constituting the second local region WDR of the dummy gate structure DGS was located, from among the gate spaces GS. Accordingly, sufficient amounts of reactants required to form the gate lines 160 may be supplied through the gate space GS, and the gate lines 160 of a desired shape may be formed between respective adjacent ones of the first to third nanosheets N1, N2, and N3 included in the nanosheet stack NSS and also in the relatively narrow regions adjacent thereto.

Thereafter, as illustrated in FIGS. 1B to 1F, respective portions of the inter-gate dielectric film 144 and the insulating liner 142 may be removed from the first device region AR1 and the second device region AR2 of the resultant structure shown in FIGS. 15A to 15E to form a plurality of holes exposing partial regions of the first and second source/drain regions SD1 and SD2. Also, a metal silicide film 172 may be formed on the first and second source/drain regions SD1 and SD2 through the plurality of holes, and a plurality of source/drain contacts 174 may be formed to fill the plurality of holes. Subsequently, an etch stop film 190A and an interlayer insulating film 190B may be sequentially formed on the resultant structure including the plurality of source/drain contacts 174 to form an insulating structure 190. A plurality of source/drain via contacts 192 passing through the insulating structure 190 in the vertical direction (Z direction) may be formed, thereby manufacturing an IC device 100.

Although the method of manufacturing the IC device 100 shown in FIGS. 1A to 1F has been described with reference to FIGS. 6 to 15E, it will be understood that the IC devices 200, 300, 400, and 500 shown in FIGS. 2 to 4, 5A, and 5B or IC devices having variously changed structures may be manufactured by applying various modifications and changes to the processes described with reference to FIGS. 6 to 15E within the scope of the inventive concept.

For example, to manufacture the IC device 200 shown in FIG. 2, the processes described with reference to FIGS. 6 to 15E may be performed. However, when the isolation trench CTT is formed in the processes described with reference to FIGS. 12A, 12B, and 12C, only a portion of the device isolation film 112 may be etched, and an etching process may be terminated at a point where the device isolation film 112 is exposed on a bottom surface of the isolation trench CTT. Thus, a modified isolation trench may be formed. Subsequently, a gate cut insulating pattern 250 may be formed inside the modified isolation trench.

To manufacture the IC device 300 shown in FIG. 3, the processes described with reference to FIGS. 6 to 15E may be performed. However, a modified isolation trench may be formed by controlling an etching atmosphere for forming the isolation trench CTT in the processes described with reference to FIGS. 12A, 12B, and 12C. From among inner sidewalls of the modified isolation trench, both sidewalls in the second lateral direction (Y direction) may extend away from the substrate 102 in opposite inclined directions with respect to a direction perpendicular to a main surface 102M of the substrate 102. In addition, the modified isolation trench may have a shape of which a width in the second lateral direction (Y direction) gradually increases away from the substrate 102. Subsequently, a gate cut insulating pattern 350 may be formed inside the modified isolation trench.

To manufacture the IC device 400 shown in FIG. 4, the processes described with reference to FIGS. 6 to 15E may be performed. However, in the processes described with reference to FIGS. 12A, 12B, and 12C, an etching atmosphere for forming the isolation trench CTT may be controlled in a similar manner to the method of manufacturing the IC device 300 shown in FIG. 3, and an end point of an etching process may be controlled in a similar manner to the method of manufacturing the IC device 200 shown in FIG. 2. Thus, a modified isolation trench may be formed. Subsequently, a gate cut insulating pattern 450 may be formed inside the modified isolation trench.

To manufacture the IC device 400 shown in FIGS. 5A and 5B, the processes described with reference to FIGS. 6 to 15E may be performed. However, the processes described with reference to FIGS. 12A, 12B, and 12C may be omitted. Afterwards, similar to the descriptions provided with reference to FIGS. 12A, 12B, and 12C, a mask pattern (not shown) covering portions other than the gate isolation area CTA may be formed on the resultant structure of FIGS. 15A to 15E. Thereafter, a portion of each of a plurality of capping insulating patterns 164 and the plurality of gate lines 160, which are exposed in the gate isolation area CTA, and insulating films exposed together in the vicinities thereof may be etched by using the mask pattern as an etch mask, and thus, a plurality of gate lines 560 may be formed from the plurality of gate lines 160. Also, an isolation trench may be formed to expose a sidewall of a terminal gate portion NWP5 of each of the plurality of gate lines 560. Thereafter, the isolation trench may be filled with an insulating material, and thus, a gate cut insulating pattern 150 may be formed to contact the terminal gate portion NWP5 of each of the plurality of gate lines 560.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:
a first fin-type active region and a second fin-type active region extending parallel to each other in a first lateral direction on a substrate, the first fin-type active region and the second fin-type active region being apart from each other in a second lateral direction, the second lateral direction intersecting the first lateral direction;
a first gate line on the first fin-type active region, the first gate line extending in the second lateral direction;
a second gate line on the second fin-type active region, the second gate line being apart from the first gate line in the second lateral direction and extending along an extension line of the first gate line in the second lateral direction; and
a gate cut insulating pattern between the first gate line and the second gate line,
wherein, for at least one of the first gate line and the second gate line, a width of a terminal gate portion, which is adjacent to the gate cut insulating pattern, in the first lateral direction is less than a width of another portion in the first lateral direction.

2. The integrated circuit device of claim 1, wherein the gate cut insulating pattern extends in the first lateral direction.

3. The integrated circuit device of claim 1, wherein
the first gate line comprises a first portion and a second portion, the first portion overlapping the first fin-type active region in a vertical direction, the second portion being between the first fin-type active region and the gate cut insulating pattern and more adjacent to the gate cut insulating pattern than the first fin-type active region, and
a width of the second portion is less than a width of the first portion in the first lateral direction.

4. The integrated circuit device of claim 1, wherein
the second gate line comprises a third portion and a fourth portion, the third portion overlapping the second fin-type active region in a vertical direction, the fourth portion being between the second fin-type active region and the gate cut insulating pattern and more adjacent to the gate cut insulating pattern than the second fin-type active region, and
a width of the fourth portion is less than a width of the third portion in the first lateral direction.

5. The integrated circuit device of claim 1, further comprising:

a device isolation film covering both sidewalls of each of the first fin-type active region, the second fin-type active region, and the gate cut insulating pattern, wherein each of the first gate line and the second gate line comprises a local gate portion overlapping the device isolation film in a vertical direction, and a width of the local gate portion in the first lateral direction is greater than a width of another portion of each of the first gate line and the second gate line in the first lateral direction.

6. The integrated circuit device of claim 1, further comprising:

a device isolation film covering both sidewalls of each of the first fin-type active region, the second fin-type active region, and the gate cut insulating pattern, wherein the at least one of the first gate line and the second gate line comprises a first local gate portion and a second local gate portion, the first local gate portion overlapping a corresponding one of the first fin-type active region and the second fin-type active region in a vertical direction, and the second local gate portion overlapping the device isolation film in the vertical direction, and a width of the second local gate portion is greater than a width of the first local gate portion in the first lateral direction.

7. The integrated circuit device of claim 1, further comprising:

a first gate dielectric film between the first fin-type active region and the first gate line; and a second gate dielectric film between the second fin-type active region and the second gate line, wherein each of the first gate dielectric film and the second gate dielectric film is in contact with a sidewall of the gate cut insulating pattern such that each of the first gate line and the second gate line is apart from the gate cut insulating pattern.

8. The integrated circuit device of claim 1, wherein each of the first gate line and the second gate line is in contact with the gate cut insulating pattern.

9. The integrated circuit device of claim 1, further comprising:

a device isolation film covering both sidewalls of each of the first fin-type active region, the second fin-type active region, and the gate cut insulating pattern, wherein the gate cut insulating pattern passes through the device isolation film in a vertical direction such that a bottom of the gate cut insulating pattern is closer to a backside surface of the substrate than a bottom surface of the device isolation film.

10. The integrated circuit device of claim 1, further comprising:

a device isolation film covering both sidewalls of each of the first fin-type active region, the second fin-type active region, and the gate cut insulating pattern, wherein the gate cut insulating pattern passes through a portion of the device isolation film in a vertical direction, and the gate cut insulating pattern is apart from the substrate with another portion of the device isolation film therebetween in the vertical direction.

11. The integrated circuit device of claim 1, wherein the gate cut insulating pattern has both sidewalls respectively facing the first gate line and the second gate line in the second lateral direction, and at least one of the both sidewalls of the gate cut insulating pattern comprises a portion that extends in a direction perpendicular to a main surface of the substrate.

12. The integrated circuit device of claim 1, wherein the gate cut insulating pattern has both sidewalls respectively facing the first gate line and the second gate line in the second lateral direction, at least one of the both sidewalls comprises a portion extending in a direction inclined with respect to a direction perpendicular to a main surface of the substrate, and a width of the gate cut insulating pattern in the second lateral direction gradually increases away from the substrate.

13. The integrated circuit device of claim 1, wherein the gate cut insulating pattern comprises silicon nitride (SiN), silicon carbonitride (SiCN), silicon oxynitride (SiON), silicon oxycarbonitride (SiOCN), silicon boron nitride (SiBN), silicon boron carbonitride (SiBCN), silicon oxycarbide (SiOC), silicon carbide (SiC), or a combination thereof.

14. An integrated circuit device comprising:

a plurality of fin-type active regions protruding from a substrate in a vertical direction and extending parallel to each other in a first lateral direction, the plurality of fin-type active regions being apart from each other in a second lateral direction, the second lateral direction intersecting the first lateral direction;

a device isolation film covering both sidewalls of each of the plurality of fin-type active regions;

a plurality of first gate lines extending in the second lateral direction on the plurality of fin-type active regions;

a plurality of second gate lines apart from the plurality of first gate lines in the second lateral direction, the plurality of second gate lines extending along extension lines of the plurality of first gate lines in the second lateral direction; and a gate cut insulating pattern extending in the first lateral direction and between the plurality of first gate lines and the plurality of second gate lines, wherein, for at least one gate line selected from the plurality of first gate lines and the plurality of second gate lines, a width of a terminal gate portion, which is adjacent to the gate cut insulating pattern, in the first lateral direction is less than a width of another portion of the at least one gate line in the first lateral direction.

15. The integrated circuit device of claim 14, wherein the at least one gate line comprises a local gate portion overlapping the device isolation film in the vertical direction, and a width of the local gate portion in the first lateral direction is greater than a width of another portion of the at least one gate line in the first lateral direction.

16. The integrated circuit device of claim 14, further comprising:

a plurality of nanosheet stacks on each of the plurality of fin-type active regions, each nanosheet stack comprising at least one nanosheet surrounded by a corresponding one of the plurality of first gate lines and the plurality of second gate lines, wherein, of the plurality of first gate lines and the plurality of second gate lines, each of first gate portions overlapping the plurality of nanosheet stacks in the vertical direction has a width in the first lateral direction, each of second gate portions overlapping the device isolation film in the vertical direction has a width in the first lateral direction, and the width of each of the first gate portions is greater than the width of the terminal gate portion in the first lateral direction and less than the width of each of the second gate portions.

17. The integrated circuit device of claim 14, wherein a vertical level of a top surface of the gate cut insulating pattern is farther from the substrate than a vertical level of a top surface of each of the plurality of first gate lines and the plurality of second gate lines.

18. The integrated circuit device of claim 14, wherein the gate cut insulating pattern passes through at least a portion of the device isolation film in the vertical direction.

19. An integrated circuit device comprising:

a first fin-type active region and a second fin-type active region protruding from a substrate in a vertical direction, the first fin-type active region and the second fin-type active region being adjacent to each other and extending in a first lateral direction;

a device isolation film covering both sidewalls of each of the first fin-type active region and the second fin-type active region;

a plurality of nanosheet stacks on each of the first fin-type active region and the second fin-type active region, each nanosheet stack comprising at least one nanosheet;

a first gate line surrounding a first nanosheet stack on the first fin-type active region, from among the plurality of nanosheet stacks, the first gate line extending in a second lateral direction intersecting the first lateral direction;

a second gate line surrounding a second nanosheet stack on the second fin-type active region, from among the plurality of nanosheet stacks, the second gate line extending in the second lateral direction;

a gate cut insulating pattern between the first gate line and the second gate line, the gate cut insulating pattern passing through at least a portion of the device isolation film in the vertical direction;

a first gate dielectric film between the first nanosheet stack and the first gate line; and a second gate dielectric film between the second nanosheet stack and the second gate line, wherein, for at least one of the first gate line and the second gate line, a width of a terminal gate portion, which is adjacent to the gate cut insulating pattern, in the first lateral direction is less than a width of another portion of the at least one gate line in the first lateral direction.

20. The integrated circuit device of claim 19, wherein each of the first gate line and the second gate line includes a local gate portion overlapping the device isolation film in the vertical direction, and a width of the local gate portion in the first lateral direction is greater than a width of another portion of the at least one gate line in the first lateral direction.

* * * * *